(12) United States Patent
Baek et al.

(10) Patent No.: US 12,120,876 B2
(45) Date of Patent: Oct. 15, 2024

(54) SEMICONDUCTOR DEVICES AND DATA STORAGE SYSTEMS INCLUDING THE SAME

(71) Applicant: Samsung Electronics Co., Ltd., Suwon-si (KR)

(72) Inventors: Seokcheon Baek, Hwaseong-si (KR); Miram Kwon, Suwon-si (KR); Seongjun Seo, Hwaseong-si (KR); Younghwan Son, Hwaseong-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 416 days.

(21) Appl. No.: 17/679,268

(22) Filed: Feb. 24, 2022

(65) Prior Publication Data

US 2022/0392916 A1    Dec. 8, 2022

(30) Foreign Application Priority Data

Jun. 3, 2021    (KR) .......................... 10-2021-0071950

(51) Int. Cl.
   *H10B 43/27*    (2023.01)
   *H01L 27/06*    (2006.01)
   *H10B 43/40*    (2023.01)

(52) U.S. Cl.
   CPC ......... *H10B 43/27* (2023.02); *H01L 27/0688* (2013.01); *H10B 43/40* (2023.02)

(58) Field of Classification Search
   None
   See application file for complete search history.

(56) References Cited

U.S. PATENT DOCUMENTS

| | | |
|---|---|---|
| 8,809,938 B2 | 8/2014 | Hwang et al. |
| 8,822,285 B2 | 9/2014 | Hwang et al. |
| 10,269,620 B2 | 4/2019 | Yu et al. |
| 10,332,788 B2 | 6/2019 | Noh |
| 10,930,673 B2 | 2/2021 | Nanami et al. |

(Continued)

FOREIGN PATENT DOCUMENTS

| | | | | |
|---|---|---|---|---|
| CN | 110085594 A | * | 8/2019 | ............. G11C 5/025 |
| CN | 114628397 A | * | 6/2022 | ......... H01L 23/5283 |

(Continued)

*Primary Examiner* — Michael Lebentritt
(74) *Attorney, Agent, or Firm* — Harness, Dickey & Pierce, P.L.C.

(57) ABSTRACT

A semiconductor device includes a first substrate, circuit elements, lower interconnection lines, a second substrate, gate electrodes stacked on the second substrate to be spaced apart from each other in a first direction and forming first and second stack structures, channel structures penetrating through the gate electrodes, and first and second contact plugs penetrating through the first and second stack structures, respectively, and connected to the gate electrodes. The first stack structure has first pad areas in which the gate electrodes extend further than upper gate electrodes, respectively, and are connected to the first contact plugs, respectively. The second stack structure has second pad areas in which the gate electrodes extend further than upper gate electrodes, respectively, and are connected to the second contact plugs, respectively. The first and second pad areas are offset in relation to each other so as not to overlap each other in the first direction.

18 Claims, 34 Drawing Sheets

(56) References Cited

U.S. PATENT DOCUMENTS

| | | |
|---|---|---|
| 11,251,192 B2* | 2/2022 | Lee .................. H10B 41/27 |
| 2009/0154240 A1 | 6/2009 | Park et al. |
| 2015/0263029 A1 | 9/2015 | Kim et al. |
| 2019/0348430 A1 | 11/2019 | Yanai |
| 2020/0295028 A1 | 9/2020 | Kim et al. |
| 2020/0303411 A1* | 9/2020 | Baek ................. H01L 23/5283 |
| 2020/0365616 A1* | 11/2020 | Baek ................. H10B 43/50 |
| 2021/0151462 A1* | 5/2021 | Baek ................. H10B 41/50 |
| 2023/0125995 A1* | 4/2023 | Kim .................. H10B 43/10 257/314 |

FOREIGN PATENT DOCUMENTS

| | | | |
|---|---|---|---|
| CN | 115440738 A * | 12/2022 | ......... H01L 27/0688 |
| KR | 10-2009-0065148 | 6/2009 | |

* cited by examiner

SEMICONDUCTOR DEVICES AND DATA STORAGE SYSTEMS INCLUDING THE SAME

CROSS-REFERENCE TO RELATED APPLICATION(S)

This application claims the benefit below 35 USC 119(a) of Korean Patent Application No. 10-2021-0071950 filed on Jun. 3, 2021 in the Korean Intellectual Property Office, the entire disclosure of which is incorporated herein by reference for all purposes.

BACKGROUND

The present inventive concepts relate to semiconductor devices and data storage systems including the same.

In data storage systems requiring data storage, semiconductor devices capable of storing high capacity data are required. Accordingly, a method for increasing the data storage capacity of a semiconductor device is being studied.

SUMMARY

Some example embodiments provide a semiconductor device having an improved degree of integration.

Some example embodiments provide a data storage system including a semiconductor device having an improved degree of integration. The semiconductor device may include memory cells arranged three-dimensionally instead of memory cells arranged two-dimensionally, which may enable increased data storage capacity of the semiconductor device.

According to some example embodiments, a semiconductor device may include a first semiconductor structure including a first substrate, circuit elements on the first substrate, and lower interconnection lines; and a second semiconductor structure on the first semiconductor structure. The second semiconductor structure includes a second substrate having a first region and a second region; gate electrodes stacked on the second substrate to be spaced apart from each other in a first direction, the gate electrodes at least partially defining first and second stack structures; interlayer insulating layers alternately stacked with the gate electrodes; channel structures penetrating through the first and second stack structures, the channel structures extending in the first direction, the channel structures respectively including a channel layer in the first region; separation regions penetrating through the first and second stack structures and extending in a second direction; first and second contact plugs each penetrating through the first and second stack structures, and extending into the first semiconductor structure in the first direction, the first and second contact plugs being in the second region; and contact insulating layers in contact with portions of the gate electrodes and surrounding each of the first and second contact plugs, the contact insulating layers being in the second region. The first stack structure has, in the second region, first pad areas in which the gate electrodes extend further than upper gate electrodes, respectively, in the second direction to be connected to the first contact plugs, respectively, and first dummy areas located on at least one side of each of the first pad areas and spaced apart from the first contact plugs, the second stack structure has, in the second region, second pad areas in which the gate electrodes extend further than upper gate electrodes, respectively, in the second direction and connected to the second contact plugs, respectively, and second dummy areas located on at least one side of each of the second pad areas and spaced apart from the second contact plugs, and the first pad areas overlap the second dummy areas in the first direction, and the second pad areas overlap the first dummy areas in the first direction.

According to some example embodiments, a semiconductor device may include a first substrate; circuit elements on the first substrate; lower interconnection lines electrically connected to the circuit elements; a second substrate on the lower interconnection lines; gate electrodes stacked on the second substrate to be spaced apart from each other in a first direction, the gate electrodes at least partially defining first and second stack structures; channel structures penetrating through the gate electrodes, the channel structures extending in the first direction, the channel structures respectively including a channel layer; and first and second contact plugs each penetrating through the first and second stack structures, the first and second contact plugs being connected to the gate electrodes, respectively, the first and second contact plugs extending in the first direction. The first stack structure has first pad areas in which the gate electrodes extend further than upper gate electrodes, respectively, in a second direction and are connected to the first contact plugs, respectively, the second stack structure has second pad areas in which the gate electrodes extend further than upper gate electrodes, respectively, in the second direction and are connected to the second contact plugs, respectively, and the first pad areas and the second pad areas are offset in relation to each other so as not to overlap each other in the first direction.

According to some example embodiments, a data storage system may include a semiconductor storage device including a first substrate, circuit elements on the first substrate, lower interconnection lines electrically connected to the circuit elements, a second substrate on the lower interconnection lines, gate electrodes stacked on the second substrate to be spaced apart from each other in a first direction and at least partially defining first and second stack structures, channel structures penetrating through the gate electrodes and extending in the first direction and respectively including a channel layer, first and second contact plugs each penetrating through the first and second stack structures, connected to the gate electrodes, respectively, and extending in the first direction, and an input/output pad electrically connected to the circuit elements; and a controller electrically connected to the semiconductor storage device through the input/output pad and configured to control the semiconductor storage device. The first stack structure includes first pad areas in which the gate electrodes extend further than upper gate electrodes, respectively, in a second direction and are connected to the first contact plugs, respectively, the second stack structure includes second pad areas in which the gate electrodes extend further than upper gate electrodes, respectively, in the second direction and are connected to the second contact plugs, respectively, and the first pad areas and the second pad areas are offset in relation to each other so as not to overlap each other in the first direction.

BRIEF DESCRIPTION OF DRAWINGS

The above and other aspects, features, and advantages of the present inventive concepts will be more clearly understood from the following detailed description, taken in conjunction with the accompanying drawings, in which.

DETAILED DESCRIPTION

Figure 1:
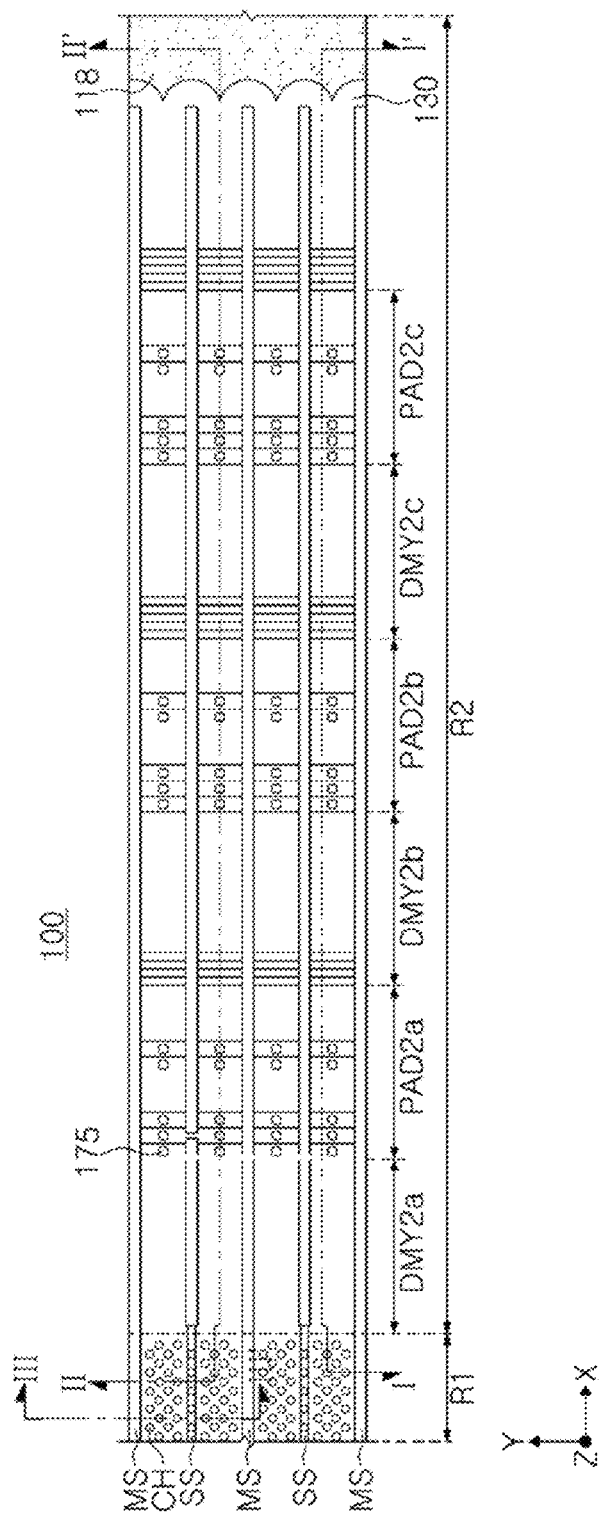
FIG. 1 is a schematic plan view of a semiconductor device according to some example embodiments.

Hereinafter, example embodiments of the present inventive concepts will be described with reference to the accompanying drawings.

It will be understood that when an element such as a layer, film, region, or substrate is referred to as being "on" another element, it may be directly on the other element or intervening elements may also be present. In contrast, when an element is referred to as being "directly on" another element, there are no intervening elements present. It will further be understood that when an element is referred to as being "on" another element, it may be above or beneath or adjacent (e.g., horizontally adjacent) to the other element.

It will be understood that elements and/or properties thereof (e.g., structures, surfaces, directions, or the like), which may be referred to as being "perpendicular," "parallel," "coplanar," or the like with regard to other elements and/or properties thereof (e.g., structures, surfaces, directions, or the like) may be "perpendicular," "parallel," "coplanar," or the like or may be "substantially perpendicular," "substantially parallel," "substantially coplanar," respectively, with regard to the other elements and/or properties thereof.

Elements and/or properties thereof (e.g., structures, surfaces, directions, or the like) that are "substantially perpendicular" with regard to other elements and/or properties thereof will be understood to be "perpendicular" with regard to the other elements and/or properties thereof within manufacturing tolerances and/or material tolerances and/or have a deviation in magnitude and/or angle from "perpendicular," or the like with regard to the other elements and/or properties thereof that is equal to or less than 10% (e.g., a. tolerance of ±10%).

Elements and/or properties thereof (e.g., structures, surfaces, directions, or the like) that are "substantially parallel" with regard to other elements and/or properties thereof will be understood to be "parallel" with regard to the other elements and/or properties thereof within manufacturing tolerances and/or material tolerances and/or have a deviation in magnitude and/or angle from "parallel," or the like with regard to the other elements and/or properties thereof that is equal to or less than 10% (e.g., a. tolerance of ±10%).

Elements and/or properties thereof (e.g., structures, surfaces, directions, or the like) that are "substantially coplanar" with regard to other elements and/or properties thereof will be understood to be "coplanar" with regard to the other elements and/or properties thereof within manufacturing tolerances and/or material tolerances and/or have a deviation in magnitude and/or angle from "coplanar," or the like with regard to the other elements and/or properties thereof that is equal to or less than 10% (e.g., a. tolerance of ±10%).

It will be understood that elements and/or properties thereof may be recited herein as being "the same" or "equal" as other elements, and it will be further understood that elements and/or properties thereof recited herein as being "identical" to, "the same" as, or "equal" to other elements may be "identical" to, "the same" as, or "equal" to or "substantially identical" to, "substantially the same" as or "substantially equal" to the other elements and/or properties thereof. Elements and/or properties thereof that are "substantially identical" to, "substantially the same" as or "substantially equal" to other elements and/or properties thereof will be understood to include elements and/or properties thereof that are identical to, the same as, or equal to the other elements and/or properties thereof within manufacturing tolerances and/or material tolerances. Elements and/or properties thereof that are identical or substantially identical to and/or the same or substantially the same as other elements and/or properties thereof may be structurally the same or substantially the same, functionally the same or substantially the same, and/or compositionally the same or substantially the same.

It will be understood that elements and/or properties thereof described herein as being "substantially" the same and/or identical encompasses elements and/or properties thereof that have a relative difference in magnitude that is equal to or less than 10%. Further, regardless of whether elements and/or properties thereof are modified as "substantially," it will be understood that these elements and/or properties thereof should be construed as including a manufacturing or operational tolerance (e.g., ±10%) around the stated elements and/or properties thereof.

When the terms "about" or "substantially" are used in this specification in connection with a numerical value, it is intended that the associated numerical value include a tolerance of ±10% around the stated numerical value. When ranges are specified, the range includes all values therebetween such as increments of 0.1%.

FIG. 1 is a schematic plan view of a semiconductor device according to some example embodiments.

Figure 2A:
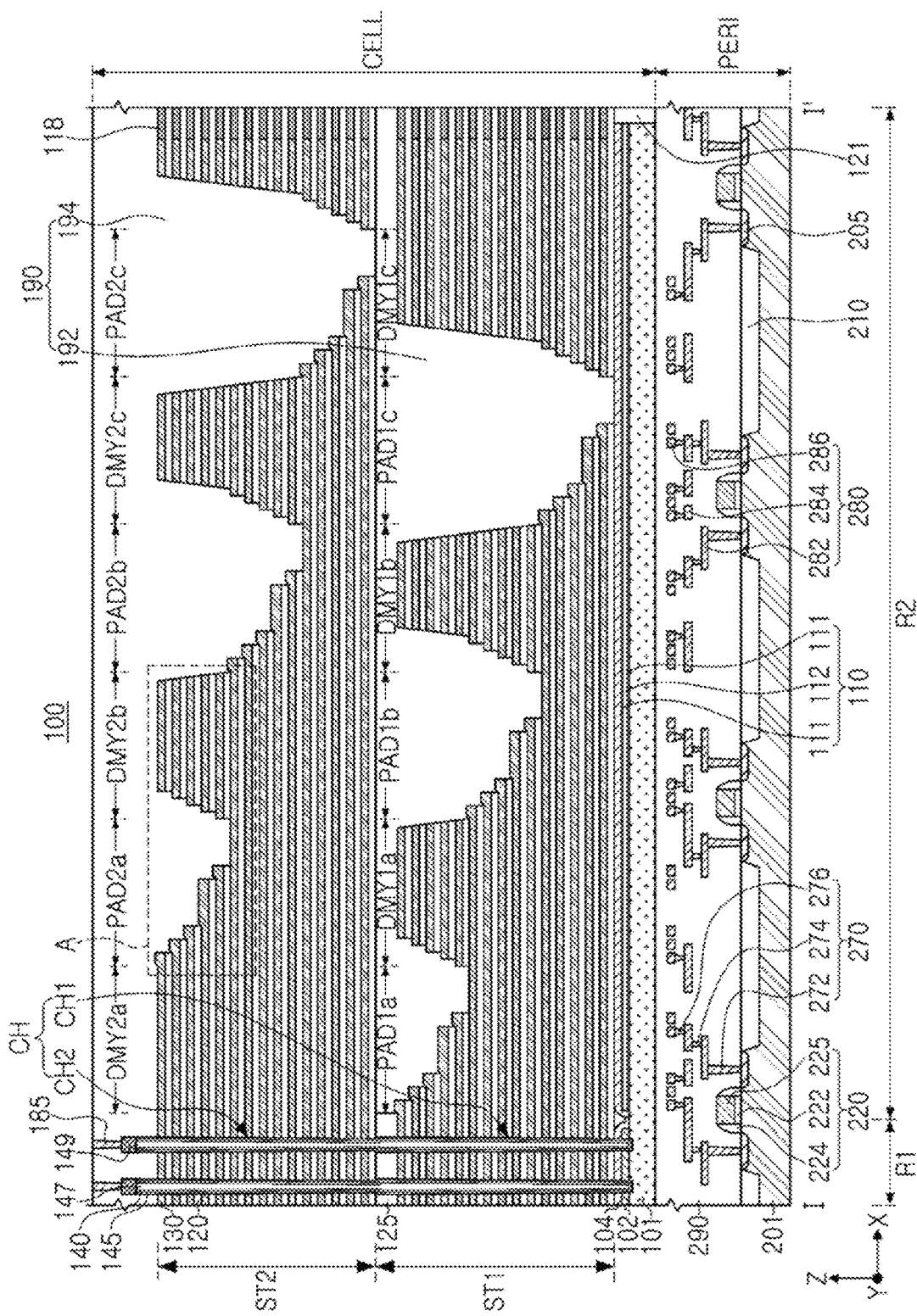
FIGS. 2A, 2B, and 2C are schematic cross-sectional views of a semiconductor device according to some example embodiments.
Figure 2B:
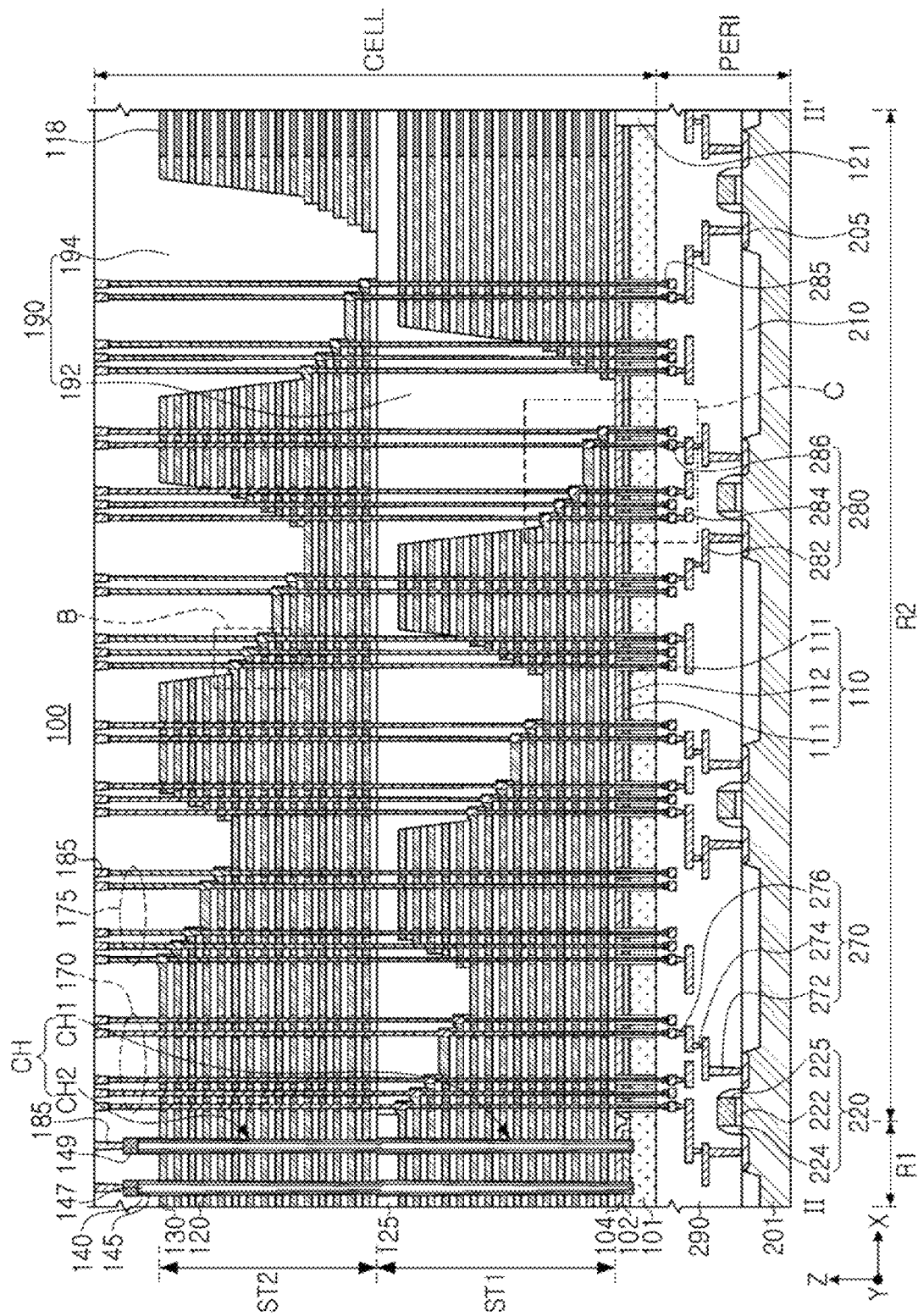
Figure 2C:
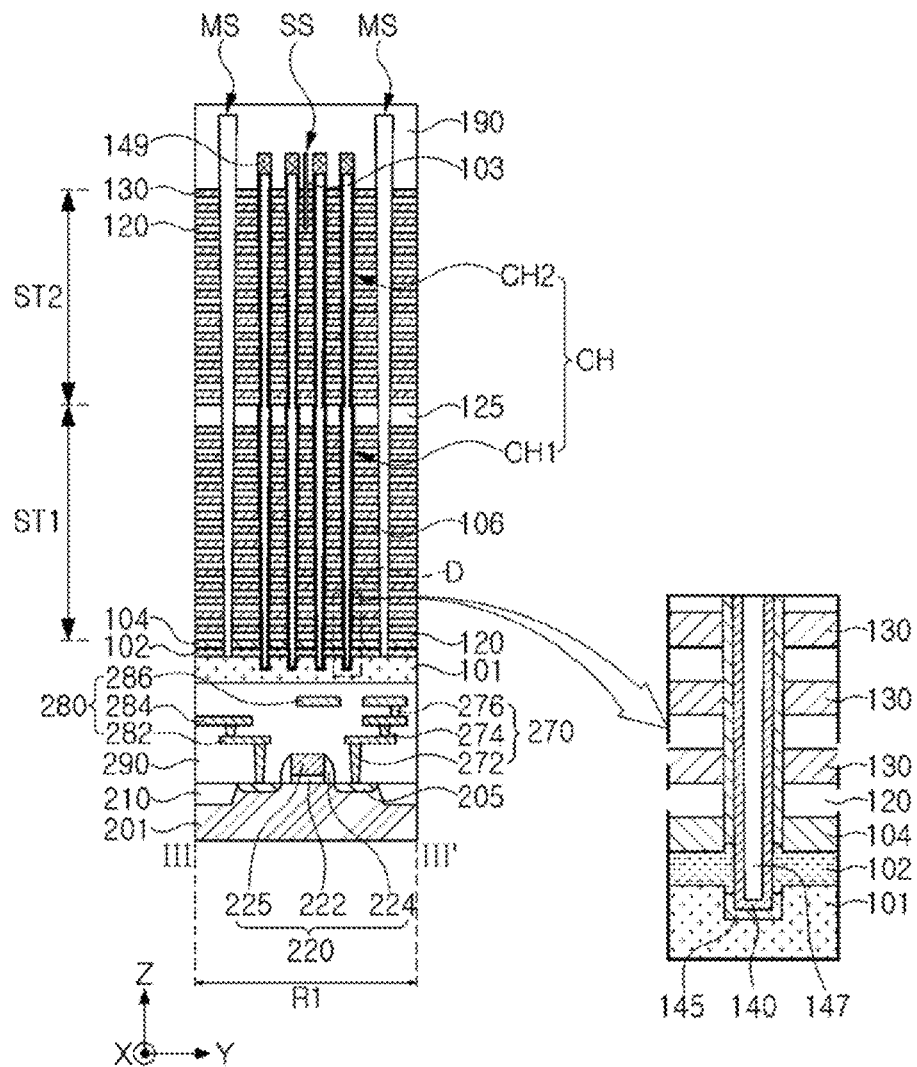

FIGS. 2A to 2C are schematic cross-sectional views of a semiconductor device according to some example embodiments. FIGS. 2A to 2C illustrate cross-sections taken along cutting lines I-I', and of FIG. 1, respectively.

Figure 3A:
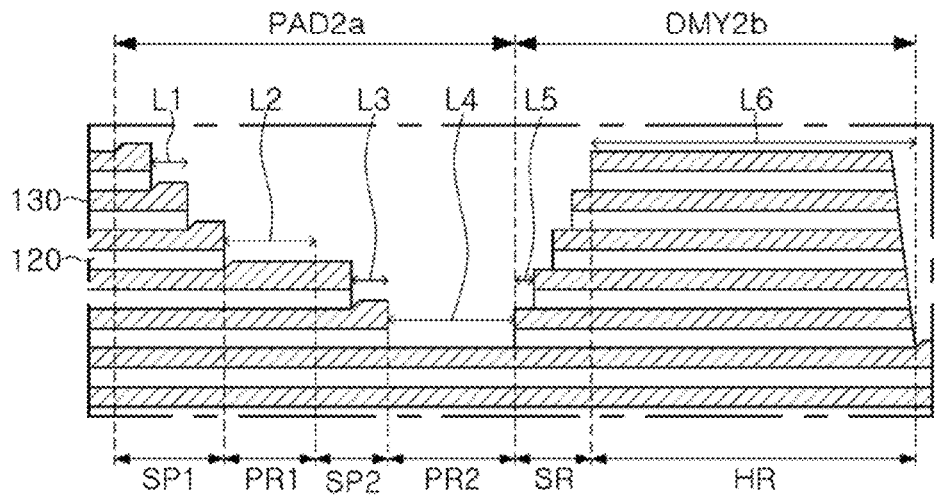
FIGS. 3A, 3B, and 3C are partially enlarged views of a semiconductor device according to some example embodiments.
Figure 3B:
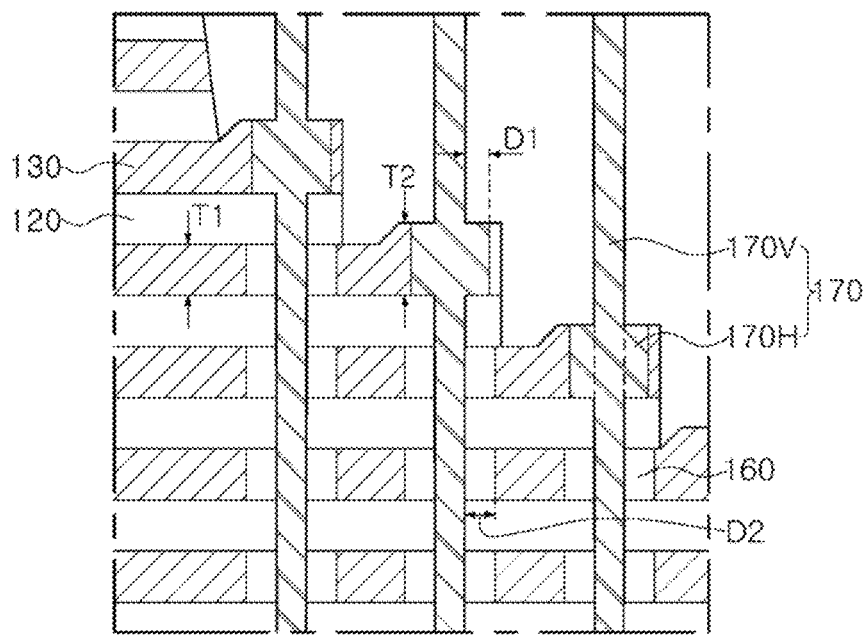
Figure 3C:
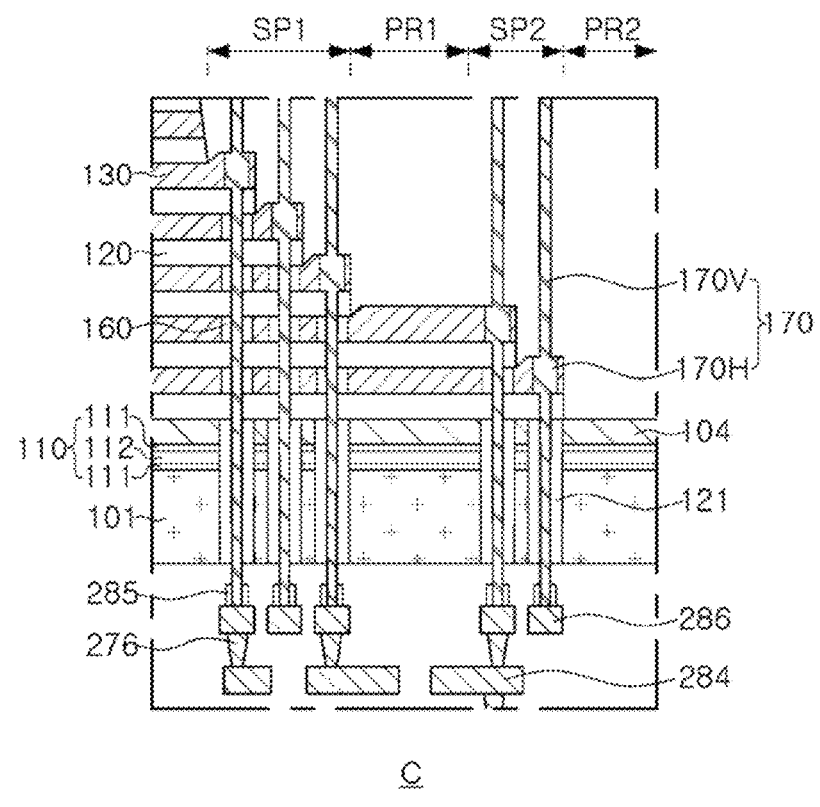

FIGS. 3A to 3C are partially enlarged views of a semiconductor device according to some example embodiments. FIGS. 3A to 3C are enlarged views of region 'A' of FIG. 2A, region 'B' of FIG. 2B, and region 'C' of FIG. 2B, respectively.

First, referring to FIGS. 1 to 2C, a semiconductor device 100 may include a peripheral circuit region PERI that is a first semiconductor structure including a first substrate 201, and a memory cell region CELL that is a second semiconductor structure including a second substrate 101. The memory cell region CELL may be disposed on top of the peripheral circuit region PERI. Conversely, in some example embodiments, the cell region CELL may be disposed below the peripheral circuit region PERI.

The peripheral circuit region PERI may include a first substrate 201, impurity regions 205 and device isolation layers 210 in the first substrate 201, circuit elements 220 disposed on the first substrate 201, lower contact plugs 270, lower interconnection lines 280, and a peripheral region insulating layer 290.

The first substrate 201 may have an upper surface extending in the X direction and the Y direction. An active region may be defined in the first substrate 201 by the device isolation layers 210. The Impurity regions 205 including impurities may be disposed in a portion of the active region. The first substrate 201 may include a semiconductor material, for example, a group IV semiconductor, a group III-V compound semiconductor, or a group II-VI compound semiconductor. The first substrate 201 may be provided as a bulk wafer or an epitaxial layer.

The circuit elements 220 may include planar transistors. Each of the circuit elements 220 may include a circuit gate dielectric layer 222, a spacer layer 224, and a circuit gate electrode 225. The impurity regions 205 may be disposed as source/drain regions in the first substrate 201, at both sides of the circuit gate electrode 225.

The lower contact plugs 270 and the lower interconnection lines 280 may form (e.g., at least partially define) a lower interconnection structure electrically connected to the circuit elements 220 and the impurity regions 205. The lower contact plugs 270 may have a cylindrical shape, and the lower interconnection lines 280 may have a line shape. The lower contact plugs 270 may include first to third lower contact plugs 272, 274, and 276 sequentially disposed from the first substrate 201. The lower interconnection lines 280 may include first to third lower interconnection lines 282, 284, and 286 sequentially disposed from the first substrate 201. The lower contact plugs 270 and the lower interconnection lines 280 may include a conductive material, for example, tungsten (W), copper (Cu), aluminum (Al), or the like, and each configuration may further include a diffusion barrier. Pad layers 285 may be further disposed on the third lower interconnection lines 286. However, in some example embodiments, the number of layers and the arrangement of the lower contact plugs 270 and the lower interconnection lines 280 may be variously changed.

The peripheral region insulating layer 290 may be disposed on the circuit element 220, on the first substrate 201. The peripheral region insulating layer 290 may be formed of an insulating material and may include one or more insulating layers.

The memory cell region CELL may include a second substrate 101 having a first region R1 and a second region R2, gate electrodes 130 stacked on the second substrate 101 and forming (e.g., at least partially defining or completely defining) first and second stack structures ST1 and ST2, interlayer insulating layers 120 alternately stacked with the gate electrodes 130 on the second substrate 101 in the Z direction, channel structures CH disposed to penetrate through the first and second stack structures ST1 and ST2 and to extend in the Z direction, separation regions MS extending (e.g., in the X direction) while penetrating through the first and second stack structures ST1 and ST2 (e.g., in the Z direction), first and second contact plugs 170 and 175 each penetrating through the first and second stack structures ST1 and ST2, and connected to the gate electrodes 130 of the first and second stack structures ST1 and ST2 and extending into the peripheral circuit region PERI in the Z direction, and contact insulating layers 160 surrounding each of the first and second contact plugs 170 and 175.

The memory cell region CELL may further include a substrate insulating layer 121, first and second horizontal conductive layers 102 and 104 disposed below the gate electrodes 130, on the first region R1, a horizontal insulating layer 110 disposed below the gate electrodes 130, on the second region R2, upper separation regions SS penetrating through a portion of the second stack structure ST2, sacrificial insulating layers 118 outside of the gate electrodes 130, upper contacts 185 on the channel structures CH and the first and second contact plugs 170 and 175, and a cell region insulating layer 190 covering the gate electrodes 130.

The first region R1 of the second substrate 101 is a region in which the gate electrodes 130 are vertically stacked and the channel structures CH are disposed, and may be a region in which memory cells are disposed, and the second region R2 is a region in which the gate electrodes 130 extend to have different lengths, and may correspond to a region for electrically connecting the memory cells to the peripheral circuit region PERI. The second region R2 may be disposed on at least one end of the first region R1 in at least one direction, for example, the X direction. The second substrate 101 is in the form of a plate layer and may function as at least a portion of a common source line of the semiconductor device 100. The second substrate 101 may be understood to be on the lower interconnection lines 280.

The second substrate 101 may have an upper surface extending in the X direction and the Y direction. The second substrate 101 may include a semiconductor material, for example, a group IV semiconductor, a group III-V compound semiconductor, or a group II-VI compound semiconductor. For example, the group IV semiconductor may include silicon, germanium, or silicon-germanium. The second substrate 101 may further include impurities. The second substrate 101 may be provided as a polycrystalline semiconductor layer such as a polycrystalline silicon layer, or an epitaxial layer.

The first and second horizontal conductive layers 102 and 104 may be sequentially stacked and disposed on the upper surface of the first region R1 of the second substrate 101. The first horizontal conductive layer 102 may not extend to the second region R2 of the second substrate 101, and the second horizontal conductive layer 104 may extend to the second region R2. The first horizontal conductive layer 102 may function as a portion of a common source line of the semiconductor device 100, for example, as a common source line, together with the second substrate 101. As illustrated in the enlarged view of FIG. 2C, the first horizontal conductive layer 102 may be directly connected to the channel layer 140, around the channel layer 140. The second horizontal conductive layer 104 may contact the second substrate 101 in some regions in which the first horizontal conductive layer 102 and the horizontal insulating layer 110 are not disposed. The second horizontal conductive layer 104 may cover an end of the first horizontal conductive layer 102 or the horizontal insulating layer 110 in the some regions, and may be bent to extend onto the second substrate 101. As shown, the second horizontal conductive layer 104 may extend in both the first and second regions R1 and R2 and may be on (e.g., above) both the first horizontal conductive layer 102 and the horizontal insulating layer 110.

The first and second horizontal conductive layers 102 and 104 may include a semiconductor material, such as polycrystalline silicon. In this case, at least the first horizontal conductive layer 102 may be a layer doped with impurities of the same conductivity type as that of the second substrate 101, and the second horizontal conductive layer 104 may be a doped layer or a layer including impurities diffused from the first horizontal conductive layer 102. However, the material of the second horizontal conductive layer 104 is not limited to the semiconductor material, and may be replaced with an insulating layer.

The horizontal insulating layer 110 may be disposed on the second substrate 101, in parallel to the first horizontal conductive layer 102 in at least a portion of the second region R2. The horizontal insulating layer 110 may include first and second horizontal insulating layers 111 and 112 alternately stacked on the second region R2 of the second substrate 101. The horizontal insulating layer 110 may be layers remaining after a portion is replaced with the first horizontal conductive layer 102 in a process of manufacturing the semiconductor device 100. It will be understood that elements "on" the first region R1 and/or the second region R2 of the second substrate 101 may be referred to herein interchangeably as being "in" the first region R1 and/or the second region R2.

The horizontal insulating layer 110 may include silicon oxide, silicon nitride, silicon carbide, or silicon oxynitride. The first horizontal insulating layers 111 and the second horizontal insulating layer 112 may include different insulating materials. For example, the first horizontal insulating layers 111 may be formed of the same material as the interlayer insulating layers 120, and the second horizontal insulating layer 112 may be formed of a material different from that of the interlayer insulating layers 120.

The substrate insulating layer 121 may extend in the Z direction in the second region R2 and be disposed to penetrate through the second substrate 101, the horizontal insulating layer 110, and the second horizontal conductive layer 104. The lower surface of the substrate insulating layer 121 may be coplanar with the lower surface of the second substrate 101 or may be located at a level lower than the lower surface of the second substrate 101. The substrate insulating layer 121 may be disposed to surround the first and second contact plugs 170 and 175, respectively. Accordingly, the first and second contact plugs 170 and 175 connected to different gate electrodes 130 may be electrically isolated from each other. In some example embodiments, the substrate insulating layer 121 may be relatively large to surround all or a portion of the first and second contact plugs 170 and 175. The substrate insulating layer 121 may also be disposed outside the second substrate 101. The substrate insulating layer 121 may include, for example, silicon oxide, silicon nitride, silicon carbide, or silicon oxynitride.

The gate electrodes 130 may be vertically spaced apart (e.g., isolated from direct contact with each other) and stacked on the second substrate 101 to form (e.g., at least partially define) the first and second stack structures ST1 and ST2. The gate electrodes 130 may form the first and second stack structures ST1 and ST2 together with the interlayer insulating layers 120, for example (e.g., the gate electrodes 130 and interlayer insulating layers 120 may collectively partially or completely define the first and second stack structures ST1 and ST2). The gate electrodes 130 are vertically spaced apart from each other and stacked on the first region R1, and extend from the first region R1 to the second region R2 at different lengths to form a stepped structure in the form of a step in a portion of the second region R2. The gate electrodes 130 may also be disposed to have a stepped structure with respect to each other in the Y direction.

The gate electrodes 130 may include lower gate electrodes forming the gate of the ground select transistor, memory gate electrodes forming the plurality of memory cells, and upper gate electrodes forming the gates of the string select transistors. The number of the memory gate electrodes constituting the memory cells may be determined according to the capacity of the semiconductor device 100. According to some example embodiments, the number of the upper and lower gate electrodes may each be 1 to 4 or more, and may have the same or different structure as the memory gate electrodes. In some example embodiments, the gate electrodes 130 may further include an erase gate electrode forming an erase transistor, disposed above the upper gate electrodes and/or below the lower gate electrodes and used for an erase operation using a gate induced drain leakage (GIDL) phenomenon. Some of the gate electrodes 130, for example, memory gate electrodes 130 adjacent to the upper or lower gate electrodes, may be dummy gate electrodes.

The gate electrodes 130 may include a metal material, for example, tungsten (W). In some example embodiments, the gate electrodes 130 may include polycrystalline silicon or a metal silicide material. In some example embodiments, the gate electrodes 130 may further include a diffusion barrier, and for example, the diffusion barrier may include tungsten nitride (WN), tantalum nitride (TaN), titanium nitride (TiN), or a combination thereof.

The first and second stack structures ST1 and ST2 may be sequentially stacked on the second substrate 101 in the Z direction. The first and second stack structures ST1 and ST2 may include gate electrodes 130 and interlayer insulating layers 120 that are alternately stacked.

The first stack structure ST1 may include first pad areas PAD1a, PAD1b, and PAD1c and first dummy areas DMY1a, DMY1b, and DMY1c in the second region R2. The first pad areas PAD1a, PAD1b, and PAD1c and the first dummy areas DMY1a, DMY1b, and DMY1c may be alternately disposed in the X direction. The second stack structure ST2 may include second pad areas PAD2a, PAD2b, and PAD2c and second dummy areas DMY2a, DMY2b, and DMY2c in the second region R2. The second pad areas PAD2a, PAD2b, and PAD2c and the second dummy areas DMY2a, DMY2b, and DMY2c may be alternately disposed in the X direction. As shown, the first pad areas PAD1a, PAD1b, and PAD and the second pad areas PAD2a, PAD2b, and PAD2c may be alternately disposed in the X direction.

The first pad areas PAD1a, PAD1b, and PAD1c and the second pad areas PAD2a, PAD2b, and PAD2c may be shifted (e.g., offset in the X direction in relation to each other) so as not to overlap each other in the Z direction. The first pad areas PAD1a, PAD1b, and PAD1c overlap the second dummy areas DMY2a, DMY2b, and DMY2c in the Z direction, and the second pad areas PAD2a, PAD2b, and PAD2c may overlap the first dummy areas DMY1a, DMY1b, and DMY1c in the Z direction. In the first pad areas PAD1a, PAD1b, and PAD1c and the second pad areas PAD2a, PAD2b, and PAD2c, shapes of the gate electrodes 130 may correspond to each other. For example, shapes of corresponding gate electrodes (e.g., gate electrodes 130 of a same stack number beneath the uppermost gate electrode 130) in separate pad regions may be similar or the same.

As illustrated in FIG. 2B, in the first pad areas PAD1a, PAD1b and PAD1c and the second pad areas PAD2a, PAD2b and PAD2c, the gate electrodes 130 may be extended further than the upper gate electrodes 130, respectively, in the X direction to be connected to the first and second contact plugs 170 and 175, respectively. As shown, first dummy areas DMY1a, DMY1b, and DMY1c may be located on at least one side of each of the first pad areas PAD1a, PAD1b, and PAD1c. As shown, second dummy areas DMY2a, DMY2b, and DMY2c may be located on at least one side of each of the second pad areas PAD2a, PAD2b, and PAD2c. The first dummy areas DMY1a, DMY1b, and DMY1c may be spaced apart from the first contact plugs 170. The second dummy areas DMY2a, DMY2b, and DMY2c may be spaced apart from the second contact plugs 175. In the first dummy areas DMY1a, DMY1b and DMY1c and the second dummy areas DMY2a, DMY2b and DMY2c, the gate electrodes 130 are not directly connected to the first and second contact plugs 170 and 175, but are disposed to be spaced apart from the first and second contact plugs 170 and 175 by the contact insulating layers 160. As shown, the first contact plugs 170 may not extend through any of the first dummy areas DMY1a, DMY1b and DMY1c, and the second contact plugs 175 may not extend through any of the second dummy areas DMY2a, DMY2b, and DMY2c.

As illustrated in FIG. 3B, the gate electrodes 130 may extend from the first region R1 toward the second region R2, with a first thickness T1 (e.g., the gate electrodes 130 may have a first thickness T1 in the first region R1). In at least some of the first pad areas PAD1a, PAD1b and PAD1c and the second pad areas PAD2a, PAD2b and PAD2c, uppermost gate electrodes 130 may have a second thickness T2 greater than the first thickness T1. The uppermost gate electrodes 130 may be gate electrodes 130 connected to the first and second contact plugs 170 and 175. In detail, among the first pad areas PAD1a, PAD1b, and PAD1c and the second pad areas PAD2a, PAD2b, and PAD2c, in at least first and second sub-pad areas SP1 and SP2 of FIG. 3A connected to the first and second contact plugs 170 and 175, the gate electrodes 130 may have the second thickness T2. The second thickness T2 may range from about 150% to about 210% of the first thickness T1.

Each of the first pad areas PAD1a, PAD1b and PAD1c and the second pad areas PAD2a, PAD2b and PAD2c may have a height lowered in the X direction as it moves away from the first region R1 (e.g., a height decreasing as a distance from the first region R1 increased), and for example, may have a reduced maximum height (e.g., the first pad areas PAD1a, PAD1b and PAD1c and the second pad areas PAD2a, PAD2b and PAD2c may have maximum heights that are decreased in the X direction). In the first dummy areas DMY1a, DMY1b and DMY1c and the second dummy areas DMY2a, DMY2b and DMY2c, the gate electrodes 130 may be stacked in a number (e.g., quantity) equal to or greater than that (e.g., the number/quantity of stacked gate electrodes) in the adjacent first pad areas PAD1a, PAD1b, and PAD1c and second pad areas PAD2a, PAD2b, and PAD2c. The first and second stack structures ST1 and ST2 may have the shape of gate electrodes 130 corresponding to each other in the second region R2. For example, the shape or profile of the gate electrodes 130 of the first pad areas PAD1a, PAD1b, and PAD1c may match the shape or profile of the gate electrodes 130 of the second pad areas PAD2a, PAD2b, and PAD2c. However, the second pad area PAD2a closest to the first region R1 may be shifted in the X direction by the length of the first pad area PAD1a, and accordingly, other second pad areas PAD2b and PAD2c and some second dummy areas DMY2b and DMY2c may also be shifted.

In some example embodiments, the first and second stack structures ST1 and ST2 may have first pad areas PAD1a, PAD1b, and PAD1c and second pad areas PAD2a, PAD2b, and PAD2c, respectively, which are mutually shifted and stacked up and down, thereby significantly reducing the length of the second region R2 of the semiconductor device 100. For example, in the case of the comparative example, six pad areas from the upper portion and five dummy areas therebetween may be alternately disposed in the X direction, with respect to the entirety of the first and second stack structures ST1 and ST2. As compared therewith, in the case of some example embodiments, the length and area of the second region R2 may be relatively reduced.

Referring to FIG. 3A, one second pad area PAD2a and one second dummy area DMY2b are enlarged. The second pad area PAD2a includes the first and second sub-pad areas SP1 and SP2, and may further include first and second flat regions PR1 and PR2 disposed on at least one side of the first and second sub-pad areas SP1 and SP2. In some example embodiments, the number of steps in each of the first and second sub-pad areas SP1 and SP2 and the number of the first and second flat regions PR1 and PR2 in one second pad area PAD2a may be variously changed.

The first and second sub-pad areas SP1 and SP2 may be pad areas substantially connected to the second contact plugs 175. Accordingly, in the claims, "pad area" may be interpreted as the first pad areas PAD1a, PAD and PAD and the second pad areas PAD2a, PAD2b and PAD2c, or may be interpreted as the first and second sub-pad areas SP1 and SP2. The first and second sub-pad areas SP1 and SP2 may have a step region having a stepped shape, and may have a form in which the number of gate electrodes 130 stacked decreases along the X direction, for example, a step-down shape. In each step region, a number (e.g., quantity) of gate electrodes 130 stacked in the Z direction may decrease in the X direction. The first pad areas PAD1a, PAD1b and PAD1c and the second pad areas PAD2a, PAD2b, and PAD2c may be understood to each have a step shape that is at least partially formed and/or defined by the gate electrodes 130. Each of the first pad areas PAD1a, PAD1b and PAD1c may be understood to include, as shown in FIG. 3A, at least first and second sub-pad areas SP1 and SP2 and at least one flat region (e.g., PR1 and/or PR2) on at least one side of the first and second sub-pad areas SP1 and SP2.

As shown, the first pad areas PAD1a, PAD1b and PAD1c and the second pad areas PAD2a, PAD2b and PAD2c and the first and second dummy areas DMY1a, DMY1b, DMY1c, DMY2b, and DMY2c may each have a region in which the gate electrodes 130 form (e.g., define) a step shape. In the first and second pad areas PAD1a, PAD1b, PAD1c, PAD2a, PAD2b and PAD2c, the region may have a first slope, and in the first and second dummy areas DMY1a, DMY1b, DMY1c, DMY2b, and DMY2c, the region may have a second slope greater than the first slope.

The first and second flat regions PR1 and PR2 may have a shape in which the gate electrodes 130 extend without a step difference. The first and second flat regions PR1 and PR2 may be regions in which the gate electrodes 130 are not connected to the second contact plugs 175. The first and second flat regions PR1 and PR2 may be regions for disposition of the lower interconnection structure, a manufacturing process of the semiconductor device 100, and the like. As illustrated in FIG. 3C, the first contact plugs 170 connected to the gate electrodes 130 in one first pad area PAD1c may be connected to the lower interconnection lines 280 of the peripheral circuit region PERI. In this case, at least a portion of the lower interconnection lines 280, for example, the second lower interconnection lines 284, may extend from below the first and second sub-pad areas SP1 and SP2, to below at least one flat region, for example, to below the first flat region PR1, for routing and thus may at least partially overlap at least one flat region (e.g., PR1) in the Z direction.

In FIG. 3A and the like, the first flat region PR1 has an increased thickness as in the second thickness T2 of FIG. 3B, and the second flat region PR2 has a non-increased thickness, but the configuration is not limited thereto. In some example embodiments, the second flat region PR2 may also have an increased thickness as in the second thickness T2 of FIG. 3B.

Second and fourth lengths L2 and L4 in the X direction of the gate electrode 130 of which the upper surface is exposed, in the first and second flat regions PR1 and PR2, may be greater than first and third lengths L1 and L3 in the X direction of the gate electrode 130 of which the upper surface is exposed in the first and second sub-pad areas SP1 and SP2. The second and fourth lengths L2 and L4 may be the same as or different from each other, and the first and third lengths L1 and L3 may also be the same or different from each other.

The second dummy area DMY2b may include a step region SR and a protruding region HR adjacent to the second pad area PAD2a. The step region SR may have a shape in which the number of gate electrodes 130 stacked increases along the X direction, by an amount equal to the number of steps in the second pad area PAD2a, for example, the form of a staircase going upwards. The protruding region HR may have a flat upper surface and may have a shape in which all of the gate electrodes 130 are stacked. Accordingly, as in FIGS. 2A and 2B, in the second dummy areas DMY2a, DMY2b, and DMY2c, the heights of the upper surfaces of the protruding regions HR are constant, and thus the heights of the upper surfaces, e.g., the maximum heights, may be the same. The first and second dummy areas DMY1a, DMY1b, DMY1c, DMY2a, DMY2b, and DMY2c may each have a protruding region HR in which the gate electrodes 130 are stacked in a same quantity as or a greater quantity than a quantity of stacked gate electrodes in the first and second pad areas PAD1a, PAD1b, PAD1c, PAD2a, PAD2b, and PAD2c. The maximum heights of the respective protruding regions HR of the first dummy areas DMY1a, DMY1b, and DMY1c may be the same as each other (e.g., may all be a same maximum height). The maximum heights of the respective protruding regions HR of the second dummy areas DMY2a, DMY2b, and DMY2c may be the same as each other (e.g., may all be a same maximum height). The maximum heights of the respective protruding regions HR of the second dummy areas DMY2a, DMY2b, and DMY2c may sequentially decrease in the X-direction.

In the step region SR, a fifth length L5 in the X direction of the gate electrode 130 of which the upper surface is exposed may be smaller than the first and third lengths L1 and L3. Accordingly, the slope of the step region SR may be greater than the slope of the first and second sub-pad areas SP1 and SP2. By reducing or minimizing the fifth length L5, the total length and area of the second dummy area DMY2b may be significantly reduced or minimized. A sixth length L6 of the protruding region HR may be greater than the second and fourth lengths L2 and L4, but is not limited thereto. The sixth length L6 may be determined in consideration of widths of the first pad areas PAD1a, PAD1b, and PAD1c positioned therebelow, process margins, and the like. The uppermost gate electrode 130 of the protruding region HR may have a thickness that is not increased as in the first thickness T1 of FIG. 3B. For example, in some example embodiments, each of the first and second dummy areas DMY1a, DMY1b, DMY1c, DMY2a, DMY2b, and DMY2c may have a protruding region HR in which the gate electrodes 130 are stacked in a greater quantity than a quantity of stacked gate electrodes 130 in the first and second pad areas PAD1a, PAD1b, PAD1c, PAD1a, PAD1b, and PAD1c, and, in respective protruding regions of the first and second dummy areas DMY1a, DMY1b, DMY1c, DMY2a, DMY2b, and DMY2c, an uppermost gate electrode 130 of the gate electrodes 130 has the first thickness T1. Additionally, the contact insulating layers 160 may be below the uppermost gate electrodes 130 in the first and second pad areas PAD1a, PAD1b, PAD1c, PAD1a, PAD1b, and PAD1c.

The length of one second dummy area DMY2b and the length of one second pad area PAD2a may be the same as or different from each other. For example, each of the first pad areas PAD1a, PAD1b, and PAD and the second pad areas PAD2a, PAD2b, and PAD2c may have a length in the range of about 30 μm to about 70 μm in the X direction. The above descriptions with reference to FIG. 3A may be equally applied to the other pad areas PAD1a, PAD1b, PAD1c, PAD2b, and PAD2c and the dummy areas DMY1a, DMY1b, DMY1c, DMY2a, DMY2b, and DMY2c.

The interlayer insulating layers 120 may be disposed between the gate electrodes 130. Like the gate electrodes 130, the interlayer insulating layers 120 may be disposed to be spaced apart from each other in a direction perpendicular to the upper surface of the second substrate 101 and to extend in the X direction. The interlayer insulating layers 120 may include an insulating material such as silicon oxide or silicon nitride.

The sacrificial insulating layers 118 may be positioned at the same height level and at the same thickness as the gate electrodes 130, and may be disposed outside the gate electrodes 130 such that side surfaces thereof are in contact with the gate electrodes 130. The sacrificial insulating layers 118 may be disposed to have the same or different width from the lower substrate insulating layer 121. The sacrificial insulating layers 118 may be formed of an insulating material different from that of the interlayer insulating layers 120, and may include, for example, silicon oxide, silicon nitride, or silicon oxynitride. A through-via may be further disposed to penetrate through the stack structure of the sacrificial insulating layers 118 and the interlayer insulating layers 120 to connect the peripheral circuit region PERI and the memory cell region CELL.

The separation regions MS may be disposed to extend in the X direction through the gate electrodes 130 in the first region R1 and the second region R2. As illustrated in FIG. 1, the separation regions MS may be disposed parallel to each other. A portion of the separation regions MS may extend as one along the first region R1 and the second region R2, and the others may extend only to a portion of the second region R2, or may be intermittently disposed in the first region R1 and the second region R2. However, in some example embodiments, the arrangement order and arrangement interval of the separation regions MS may be variously changed. The separation regions MS may penetrate through the entire gate electrodes 130 stacked on the second substrate 101 to be connected to the second substrate 101 as illustrated in FIG. 2C. The isolation insulating layer 106 may be disposed in the separation regions MS.

The upper separation regions SS may extend in the X direction, between the separation regions MS. The upper separation regions SS may be disposed in a portion of the second region R2 and in the first region R1, to penetrate through some gate electrodes 130 including an uppermost gate electrode 130 among the gate electrodes 130. As illustrated in FIG. 2C, the upper separation regions SS may separate, for example, a total of three gate electrodes 130 from each other in the Y direction. However, the number of gate electrodes 130 separated by the upper separation regions SS may be variously changed in some example embodiments. The upper separation regions SS may include an upper isolation insulating layer 103.

The channel structures CH respectively form one memory cell string, and may be disposed to be spaced apart from each other while forming rows and columns on the first region R1. The channel structures CH may be disposed to form a grid pattern in the X-Y plane or may be disposed in a zigzag shape in one direction. The channel structures CH may have a columnar shape, and may have an inclined side that becomes narrower as they get closer to the second substrate 101 according to an aspect ratio. In some example embodiments, the channel structures CH disposed adjacent to the end of the first region R1 may be dummy channels that do not substantially form a memory cell string. The dummy channels may also be disposed in the second region R2 to serve as a support during the manufacturing process of the semiconductor device 100. However, in some example embodiments, supports having a structure different from that of the channel structures CH may be further separately disposed in the second region R2.

The channel structures CH may include vertically stacked first and second channel structures CH1 and CH2. The channel structures CH have a form in which the first channel structures CH1 penetrating through the first stack structure ST1 and the second channel structures CH2 penetrating through the second stack structure ST2 are connected, and may have a bent portion due to a difference in width in the connection region. However, according to some example embodiments, the number of channel structures stacked in the Z direction may be variously changed.

Each of the channel structures CH may include a channel layer 140, a gate dielectric layer 145, a channel-filling insulating layer 147, and a channel pad 149 disposed in the channel hole. As illustrated in the enlarged view of FIG. 2C, the channel layer 140 may be formed in an annular shape surrounding the channel-filling insulating layer 147 therein, or may have a columnar shape such as a cylinder or a prism without the channel-filling insulating layer 147 according to some example embodiments. A lower portion of the channel layer 140 may be connected to the first horizontal conductive layer 102. The channel layer 140 may include a semiconductor material such as polycrystalline silicon or single crystal silicon.

The gate dielectric layer 145 may be disposed between the gate electrodes 130 and the channel layer 140. Although not illustrated in detail, the gate dielectric layer 145 may include a tunneling layer, a charge storage layer, and a blocking layer sequentially stacked from the channel layer 140. The tunneling layer may tunnel charges into the charge storage layer, and may include, for example, silicon oxide ($SiO_2$), silicon nitride ($Si_3N_4$), silicon oxynitride (SiON), or combinations thereof. The charge storage layer may be a charge trapping layer or a floating gate conductive layer. The blocking layer may include silicon oxide ($SiO_2$), silicon nitride ($Si_3N_4$), silicon oxynitride (SiON), a high-k dielectric material, or combinations thereof. In some example embodiments, at least a portion of the gate dielectric layer 145 may extend in a horizontal direction along the gate electrodes 130.

The channel pad 149 may only be disposed on the upper end of the upper second channel structure CH2. The channel pad 149 may include, for example, doped polycrystalline silicon.

The channel layer 140, the gate dielectric layer 145, and the channel-filling insulating layer 147 may be connected to each other between the first channel structure CH1 and the second channel structure CH2. A relatively thick upper interlayer insulating layer 125 may be disposed between the first channel structure CH1 and the second channel structure CH2, for example, between the first and second stack structures ST1 and ST2. However, the thickness and shape of the interlayer insulating layers 120 and the upper interlayer insulating layer 125 may be variously changed in some example embodiments.

The first and second contact plugs 170 and 175 may penetrate through the uppermost gate electrodes 130 and contact insulating layers 160 therebelow in the second region R2, and may be connected to the uppermost gate electrodes 130. The first contact plugs 170 may be disposed to be connected to the gate electrodes 130 of the first stack structure ST1 in the first pad areas PAD1a, PAD1b, and PAD1c. The second contact plugs 175 may be disposed to be connected to the gate electrodes 130 of the second stack structure ST2 in the second pad areas PAD2a, PAD2b, and PAD2c.

The first and second contact plugs 170 and 175 may penetrate through at least a portion of the cell region insulating layer 190 and may be disposed to be connected to each of the gate electrodes 130 of which upper surfaces are exposed through a step difference in the first and second stack structures ST1 and ST2. The first and second contact plugs 170 and 175 may be directly connected to the gate electrodes 130 in a region in which the thickness of the gate electrodes 130 is increased. The first and second contact plugs 170 and 175 penetrate through the second substrate 101, the second horizontal conductive layer 104, and the horizontal insulating layer 110, below the gate electrodes 130, and may be connected to the lower interconnection lines 280 in the peripheral circuit region PERI. The first and second contact plugs 170 and 175 may be spaced apart from (e.g., isolated from direct contact with) the second substrate 101, the second horizontal conductive layer 104, and the horizontal insulating layer 110 by the substrate insulating layer 121.

As illustrated in FIG. 3B, each of the first contact plugs 170 may include a vertical extension portion 170V extending in the Z direction, and a horizontal extension portion 170H extending horizontally from the vertical extension portion 170V and contacting the gate electrode 130. The vertical extension portion 170V may have a cylindrical shape in which the width decreases toward the second substrate 101 due to the aspect ratio. The horizontal extension portion 170H is disposed along the circumference of the vertical extension portion 170V, and may extend from a side surface of the vertical extension portion 170V to the other end by a first dimension D1. The first dimension D1 may be shorter than a second dimension D2 of the contact insulating layers 160 provided therebelow. For example, a length from a side surface of the vertical extension portion 170V to an end of the horizontal extension portion 170H may be less than a length from the side surface of the vertical extension portion 170V to ends of the contact insulating layers 160. The second contact plugs 175 may also have the same shape and structure as shown for the first contact plugs 170 in FIG. 3B. For example, each contact plug of the first and second contact plugs 170 and 175 may include a vertical extension portion 170V extending in the Z direction and a horizontal extension portion 170H extending horizontally from the vertical extension portion 170V, to contact an uppermost gate electrode 130 in one pad area of the first and second pad areas PAD1a, PAD1b, PAD1c, PAD2a, PAD2b, and PAD2c.

As illustrated in FIG. 3C, the first and second contact plugs 170 and 175 may be surrounded by the substrate insulating layer 121 to be electrically separated from the second substrate 101. The substrate insulating layer 121 may be understood to include multiple substrate insulating layers 121 that penetrate through the second substrate 101 and respectively (e.g., each) surround the first and second contact plugs 170 and 175. A region of the first and second contact plugs 170 and 175 including lower ends may be surrounded by pad layers 285 on the third lower interconnection lines 286. The pad layers 285 may be layers for protecting the lower interconnection lines 280 during the manufacturing process of the semiconductor device 100, and may include a conductive material, for example, polycrystalline silicon.

The first and second contact plugs 170 and 175 may include, for example, at least one of tungsten (W), copper (Cu), aluminum (Al), and alloys thereof. In some example embodiments, the first and second contact plugs 170 and 175 may further include a barrier on sidewalls and bottom surfaces of the contact holes in which the first and second contact plugs 170 and 175 are disposed. The barrier may include, for example, at least one of titanium (Ti), titanium nitride (TiN), tantalum (Ta), and tantalum nitride (TaN).

The contact insulating layers 160 may be disposed to surround side surfaces of the first and second contact plugs 170 and 175. The contact insulating layers 160 may be disposed below the uppermost gate electrode 130 in the first and second sub-pad areas SP1 and SP2 of each of the first pad areas PAD1a, PAD1b and PAD1c and the second pad areas PAD2a, PAD2b, and PAD2c. The contact insulating layers 160 may be interposed between gate electrodes 130 excluding the gate electrodes 130 connected to the first and second contact plugs 170 and 175, and the first and second contact plugs 170 and 175.

Inner side surfaces of the contact insulating layers 160 may surround the first and second contact plugs 170 and 175, and outer side surfaces of the contact insulating layers 160 may be surrounded by the gate electrodes 130. Each of the first and second contact plugs 170 and 175 may be physically and electrically connected to one gate electrode 130 by the contact insulating layers 160, and may be electrically separated from the other gate electrodes 130. The contact insulating layers 160 may be understood to be in contact with portions of the gate electrodes 130.

The contact insulating layers 160 may include an insulating material, for example, at least one of silicon oxide, silicon nitride, and silicon oxynitride.

The upper contacts 185 may form a portion of an upper interconnection structure electrically connected to memory cells in the memory cell region CELL. The upper contacts 185 may be connected to the channel structures CH and the first and second contact plugs 170 and 175. The semiconductor device 100 may further include contacts and interconnection lines connected to the upper contacts 185. In some example embodiments, the number and arrangement of contacts and interconnection lines constituting the upper interconnection structure may be variously changed. The upper contacts 185 may include a metal, for example, tungsten (W), copper (Cu), aluminum (Al), or the like.

The cell region insulating layer 190 may include a first cell region insulating layer 192 covering the first stack structure ST1, and a second cell region insulating layer 194 covering the second stack structure ST2. In some example embodiments, each of the first and second cell region insulating layers 192 and 194 may also be comprised of a plurality of insulating layers. The cell region insulating layer 190 may be formed of an insulating material.

Figure 4A:
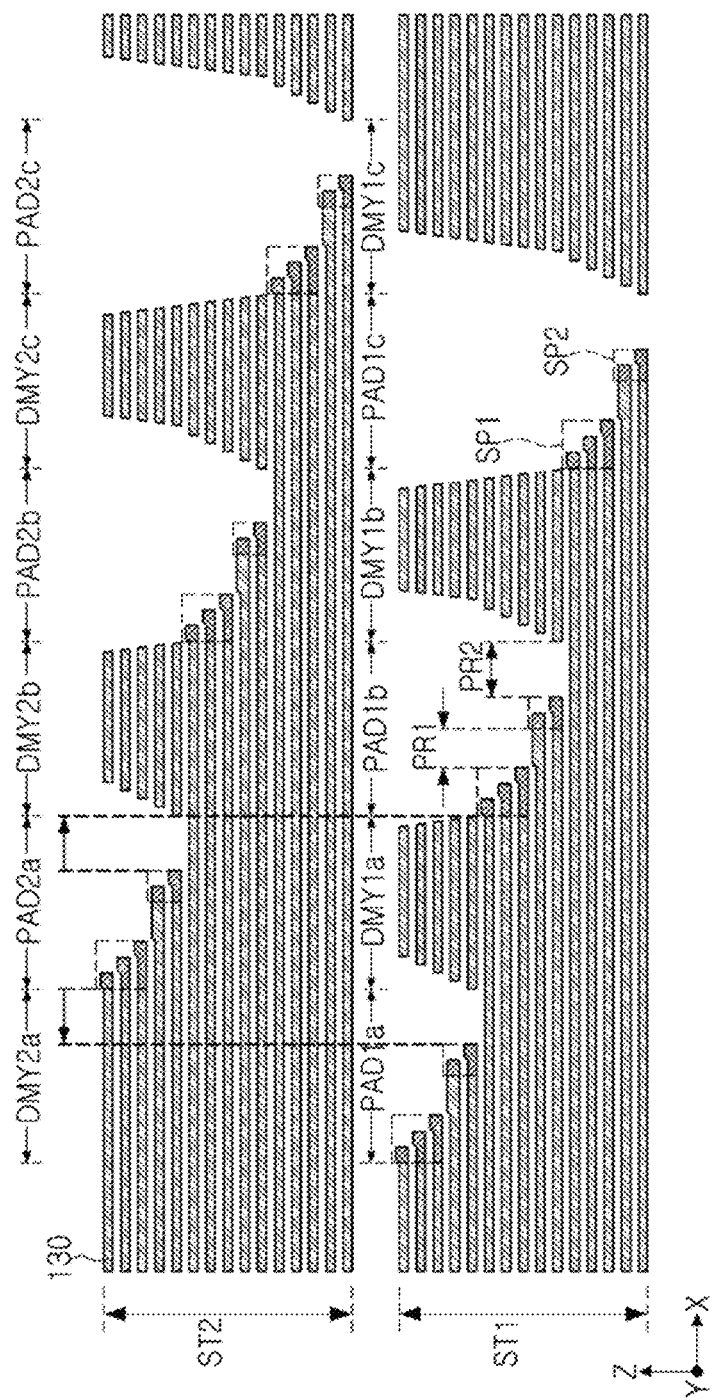
FIG. 4A is a cross-sectional view schematically illustrating some configurations of a semiconductor device according to some example embodiments.
Figure 4B:
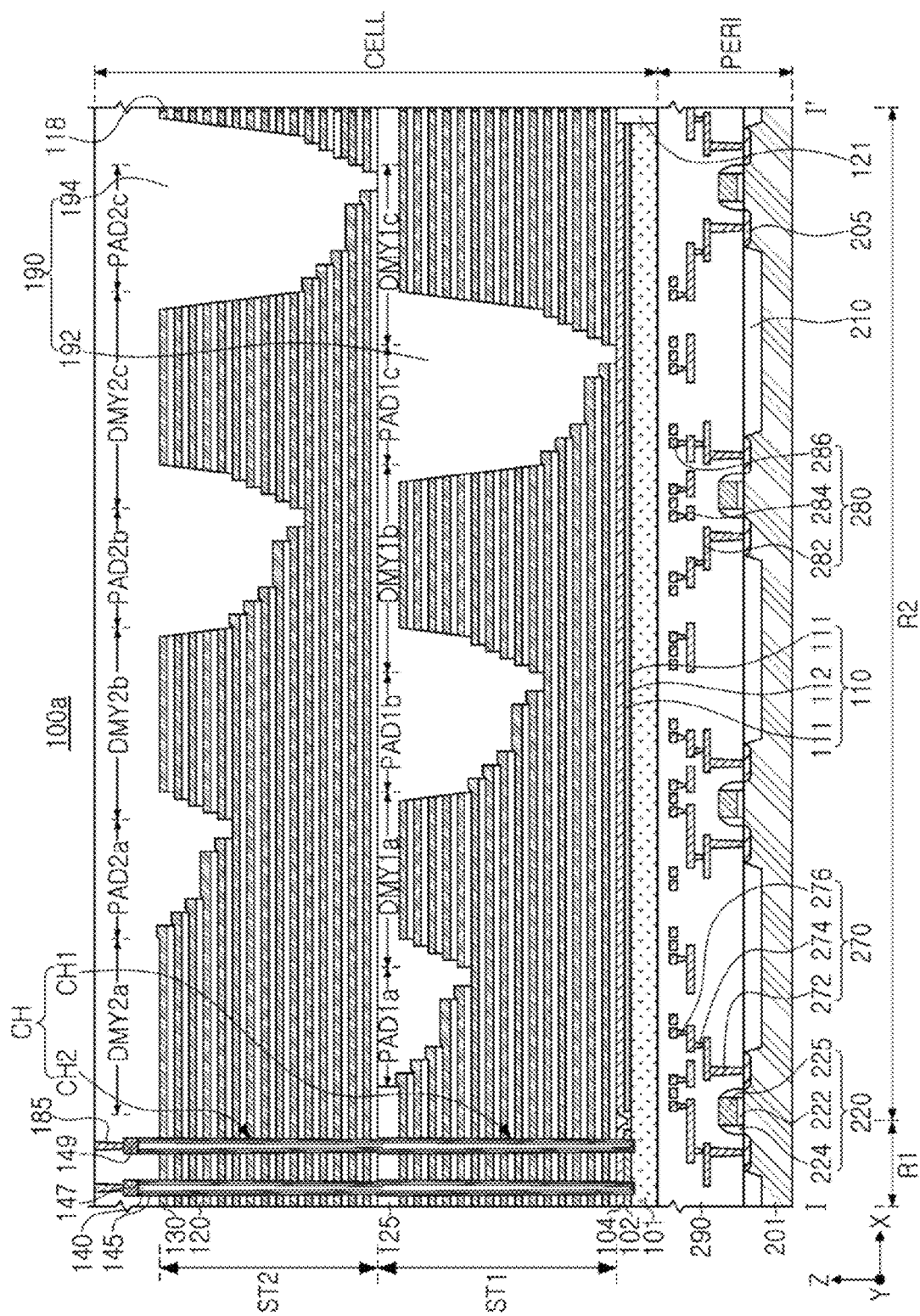
FIGS. 4B and 4C are schematic cross-sectional views of a semiconductor device according to some example embodiments.
Figure 4C:
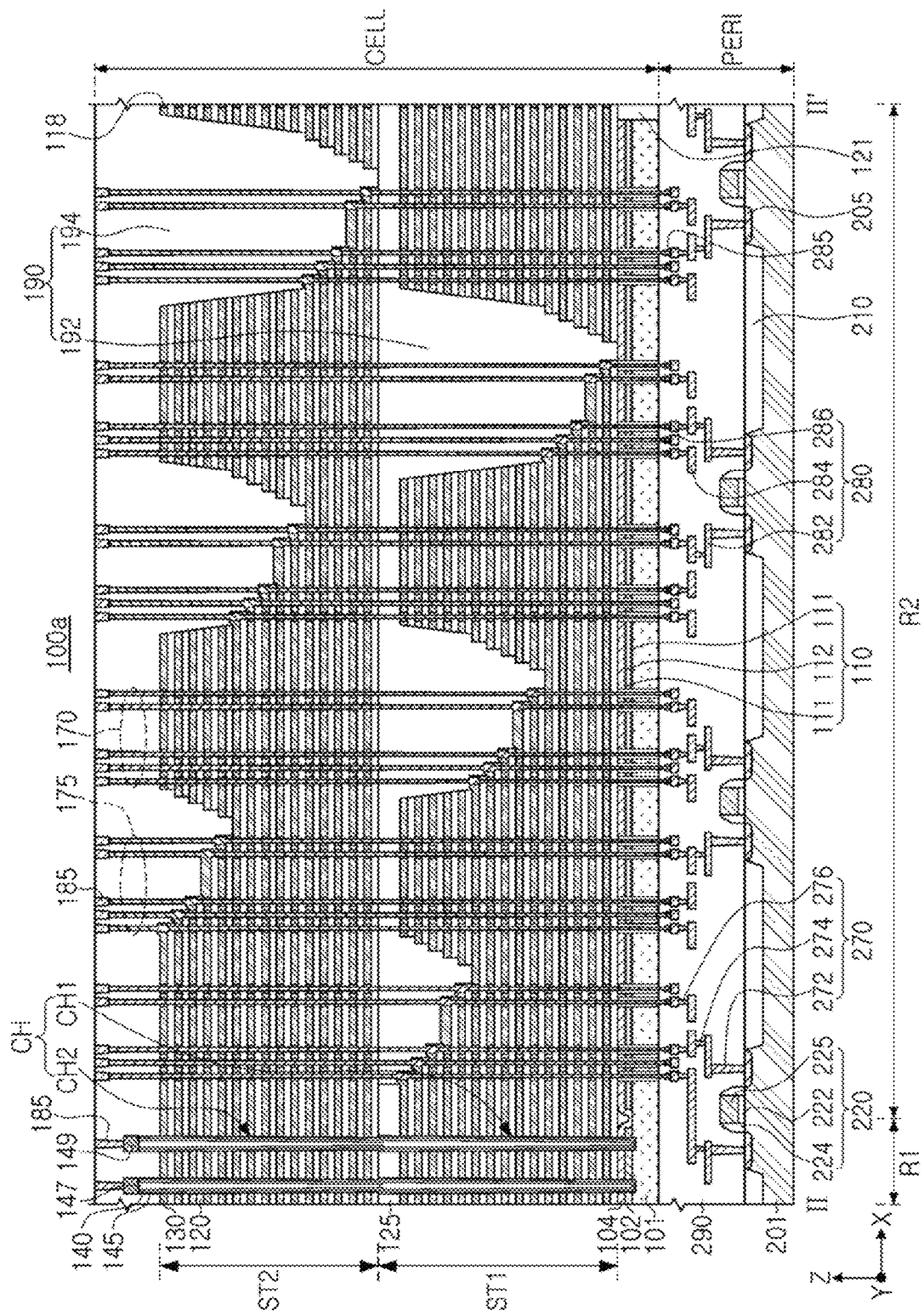

FIG. 4A is a cross-sectional view schematically illustrating some configurations of a semiconductor device according to some example embodiments. FIGS. 4B and 4C are schematic cross-sectional views of a semiconductor device according to some example embodiments. FIG. 4B illustrates a cross section corresponding to FIG. 2A, and FIG. 4C illustrates a cross section corresponding to FIG. 2B.

Referring to FIG. 4A, the gate electrodes 130 of FIG. 2A are illustrated. As described above with reference to FIGS. 1 to 3C, the first pad areas PAD1a, PAD1b, and PAD1c overlap the second dummy areas DMY2a, DMY2b and DMY2c in the Z direction, and the second pad areas PAD2a, PAD2b, and PAD2c may overlap the first dummy areas DMY1a, DMY1b, and DMY1c in the Z direction. In the first pad areas PAD1a, PAD1b, and PAD and the second pad areas PAD2a, PAD2b, and PAD2c, regions in which the first and second contact plugs 170 and 175 are substantially connected to the gate electrodes 130 may be the first and second sub-pad areas SP1 and SP2. Accordingly, in some example embodiments, the first pad areas PAD1a, PAD1b and PAD1c and the second pad areas PAD2a, PAD2b and PAD2c may have a shift degree that is changed such that some of the first and second pad areas overlap each other, within a range in which the first and second sub-pad areas SP1 and SP2 do not overlap in the Z direction.

Hereinafter, a case in which the first stack structure ST1 is fixed and the second stack structure ST2 is shifted will be described as a reference. As indicated by a dotted line in FIG. 4A, in a range in which the first sub-pad area SP1 of the second pad area PAD2a overlaps the second flat region PR2 of the first pad area PAD1a, the second pad areas PAD2a, PAD2b, and PAD2c may be moved to the left in the X direction. For example, when the second pad areas PAD2a, PAD2b, and PAD2c move to the maximum left, the left end of the first sub-pad area SP1 of the second pad area PAD2a may be parallel to the right end of the second sub-pad area SP2 of the first pad area PAD1a.

Also, in the range where the second sub-pad area SP2 of the second pad area PAD2a overlaps the first dummy area DMY1a, the second pad areas PAD2a, PAD2b, and PAD2c may be moved rightward in the X direction. For example, when the second pad areas PAD2a, PAD2b, and PAD2c move to the maximum right, the right end of the second sub-pad area SP2 of the second pad area PAD2a may be parallel to the right end of the first dummy area DMY1a.

As such, in some example embodiments, in a rage in which the first and second sub-pad areas SP1 and SP2 of the first stack structure ST1 and the first and second sub-pad areas SP1 and SP2 of the second stack structure ST2 do not overlap in the Z direction, relative shift degrees of the first and second stack structures ST1 and ST2 may be variously changed.

Referring to FIGS. 4B and 4C, a semiconductor device 100a according to some example embodiments may have a structure in which relative shift degrees of the first and second stack structures ST1 and ST2 are different from those of the example embodiments of FIGS. 2A and 2B.

The first contact plugs 170 may be disposed to penetrate through flat regions of the second dummy areas DMY2a, DMY2b, and DMY2c, for example, the protruding regions HR (refer to FIG. 3A), and the second contact plugs 175 may be disposed to penetrate through flat regions of the first dummy areas DMY1a, DMY1b, and DMY1c, for example, the protruding regions HR.

Figure 5:
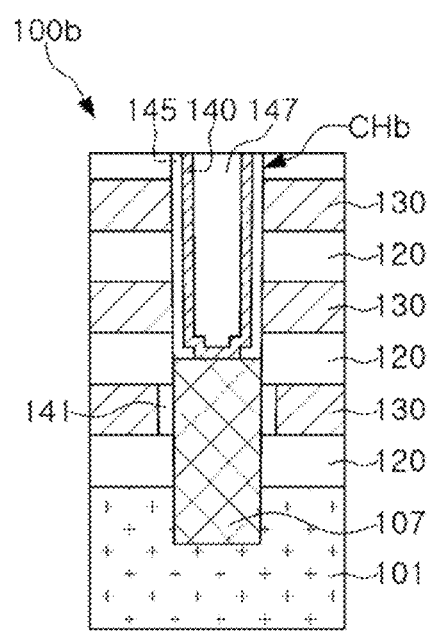
FIG. 5 is a partially enlarged view schematically illustrating a semiconductor device according to some example embodiments.

FIG. 5 is a partially enlarged view schematically illustrating a semiconductor device according to some example embodiments. FIG. 5 is an enlarged view of a cross section corresponding to region 'D' of FIG. 2C.

Referring to FIG. 5, in a semiconductor device 100b, a memory cell region CELL may not include the first and second horizontal conductive layers 102 and 104 on the second substrate 101, unlike in some example embodiments, including the example embodiments of FIGS. 2A to 2C. In addition, the channel structure CHb may further include an epitaxial layer 107.

The epitaxial layer 107 is disposed on the second substrate 101, on the lower end of the channel structure CHb, and may be disposed on a side surface of the at least one gate electrode 130. The epitaxial layer 107 may be disposed in a recessed region of the second substrate 101. The height of the lower surface of the epitaxial layer 107 may be higher than the upper surface of a lowermost gate electrode 130 and lower than the lower surface of the gate electrode 130 thereabove, but the configuration is not limited to the illustration. The epitaxial layer 107 may be connected to the channel layer 140 through the upper surface. A gate insulating layer 141 may be further disposed between the epitaxial layer 107 and the gate electrode 130 in contact with the epitaxial layer 107.

Figure 6A:
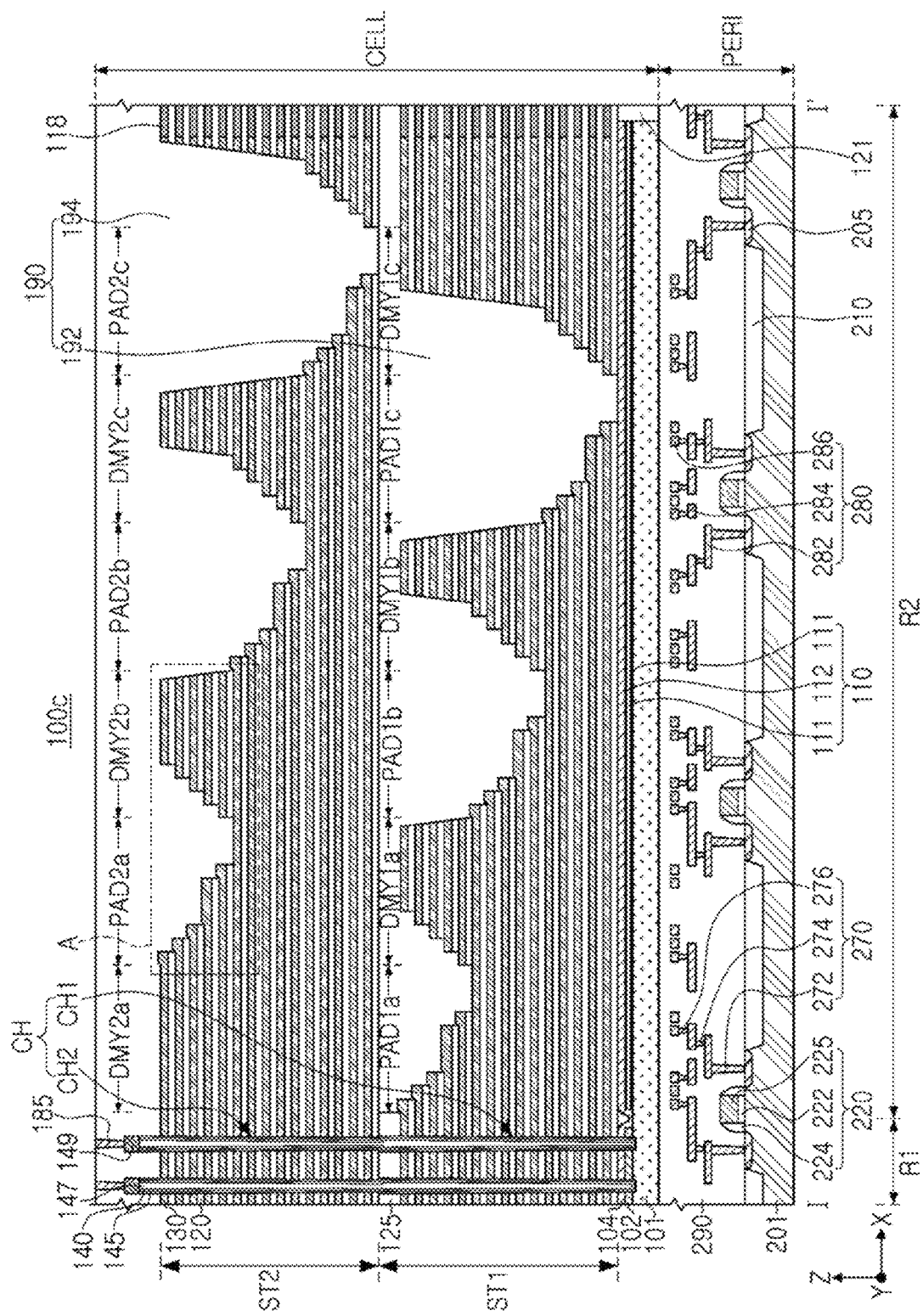
FIGS. 6A and 6B are cross-sectional views and partially enlarged views schematically illustrating a semiconductor device according to some example embodiments.
Figure 6B:
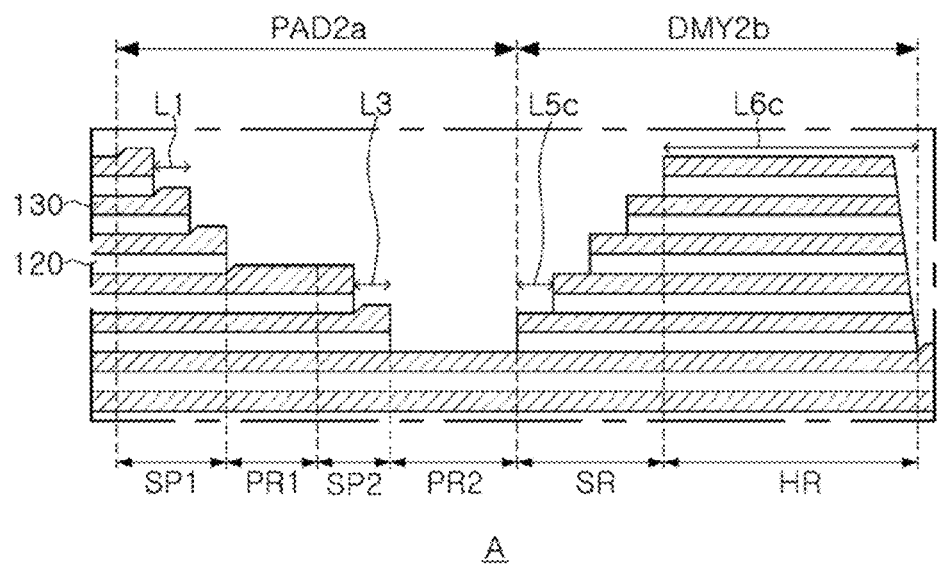

FIGS. 6A and 6B are cross-sectional views and partially enlarged views schematically illustrating a semiconductor device according to some example embodiments. FIG. 6A illustrates a cross-section corresponding to FIG. 2A, and FIG. 6B illustrates a cross-section corresponding to FIG. 3A.

Referring to FIGS. 6A and 6B, in a semiconductor device 100c, the length of a step region SR of first dummy areas DMY1a, DMY1b, and DMY1c and second dummy areas DMY2a, DMY2b and DMY2c may be different from that in some example embodiments, including the example embodiments of FIGS. 1 to 3C. For example, in the step region SR, a fifth length L5c in the X direction of the gate electrode 130 of which the upper surface is exposed may be substantially the same as first and third lengths L1 and L3 in the X direction of the gate electrode 130 of which the upper surface is exposed in the first and second sub-pad areas SP1 and SP2. In this case, the total length of the second dummy area DMY2b may not increase by relatively reducing a sixth length L6c of the protruding region HR. However, in some example embodiments, the sixth length L6c of the protruding region HR is not reduced and may be, for example, the same as in FIG. 3A, and in this case, the total length of the second dummy area DMY2b may be relatively increased.

In the following embodiments, although a cross-section corresponding to FIG. 2B is not illustrated, the first and second contact plugs 170 and 175 may be disposed to be connected to the gate electrodes 130 in the pad areas in the same manner as in FIG. 2B in a cross-section corresponding to FIG. 2B.

Figure 7A:
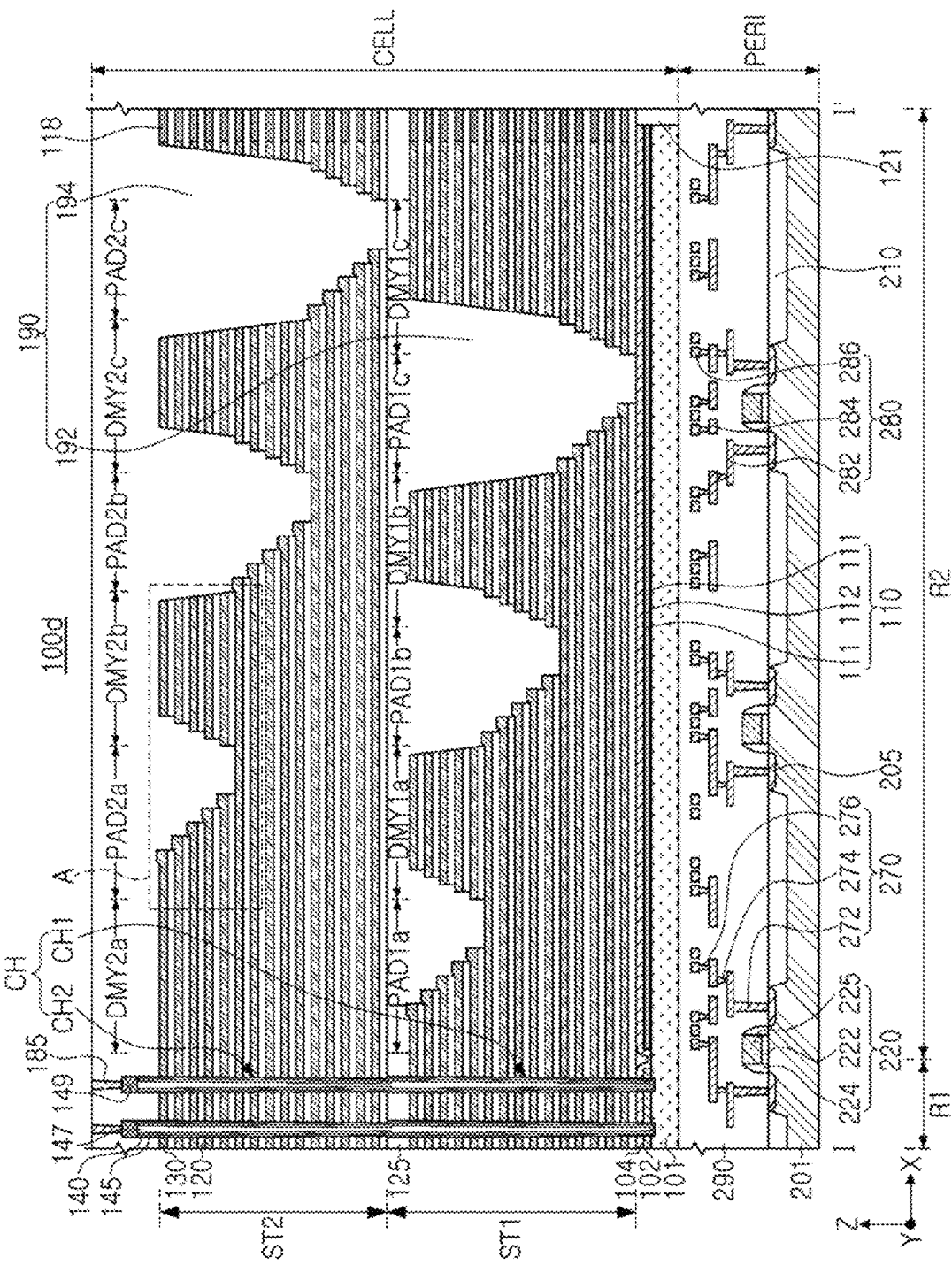
FIGS. 7A and 7B are cross-sectional views and partially enlarged views schematically illustrating a semiconductor device according to some example embodiments.
Figure 7B:
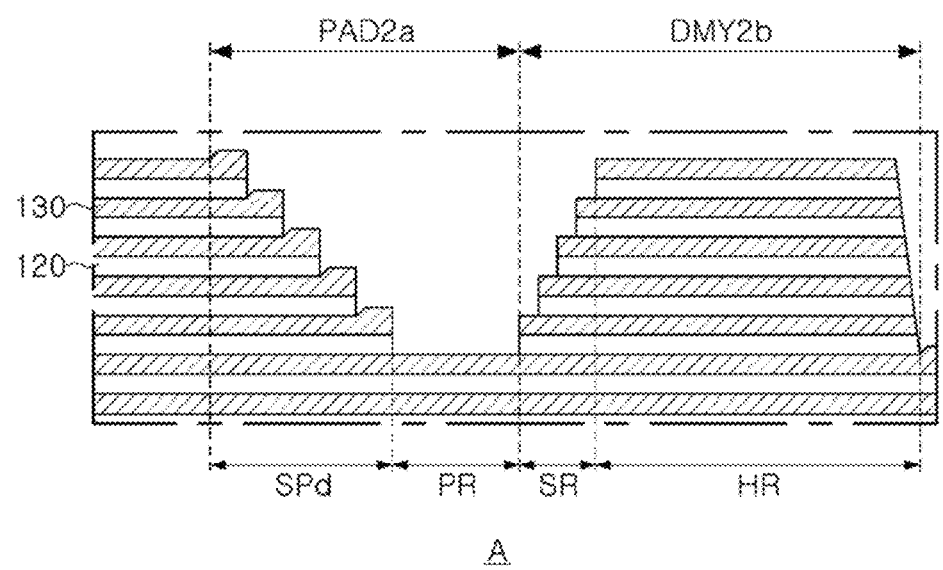

FIGS. 7A and 7B are cross-sectional views and partially enlarged views schematically illustrating a semiconductor device according to some example embodiments. FIG. 7A illustrates a cross section corresponding to FIG. 2A, and FIG. 7B illustrates a cross section corresponding to FIG. 3A.

Referring to FIGS. 7A and 7B, in a semiconductor device 100d, first pad areas PAD1a, PAD1b, and PAD1c and second pad areas PAD2a, PAD2b, and PAD2c may each include only one sub-pad area SPd and one flat region PR unlike some example embodiments, including the example embodiments illustrated in FIGS. 1 to 3C. For example, the first flat region PR1 of FIG. 3A may be omitted. In this case, the length and area of the second region R2 may be further reduced. As such, in some example embodiments, the number and length of the flat regions PR may be variously changed.

Figure 8A:
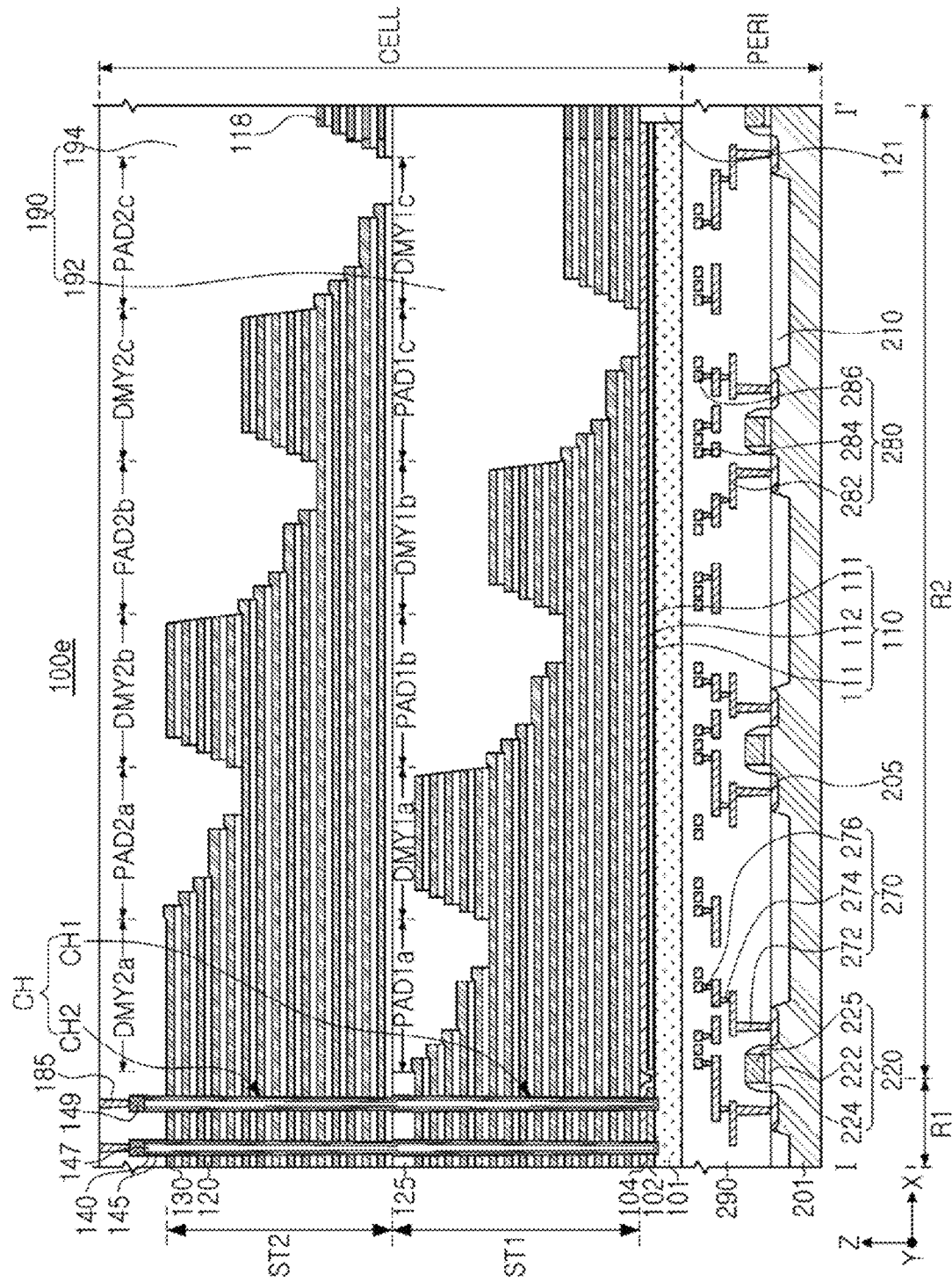
FIGS. 8A and 8B are cross-sectional views schematically illustrating semiconductor devices according to some example embodiments.
Figure 8B:
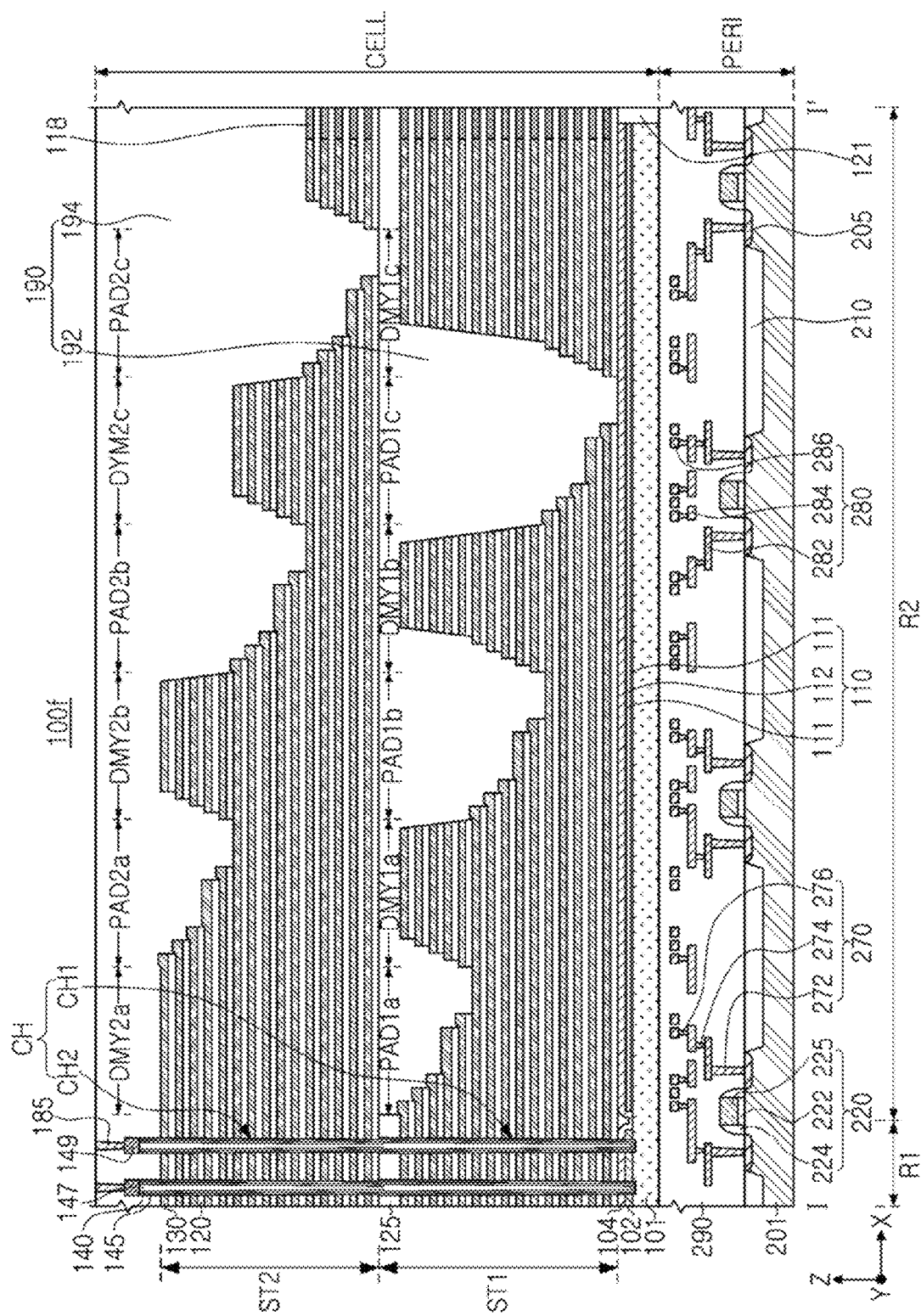

FIGS. 8A and 8B are cross-sectional views schematically illustrating semiconductor devices according to some example embodiments. FIGS. 8A and 8B respectively illustrate cross-sections corresponding to FIG. 2A.

Referring to FIG. 8A, in first and second stack structures ST1 and ST2 of a semiconductor device 100e, first dummy areas DMY1a, DMY1b, and DMY1c and second dummy areas DMY2a, DMY2b, and DMY2c may have different maximum heights. The maximum heights of the first dummy areas DMY1a, DMY1b, and DMY1c and the second dummy areas DMY2a, DMY2b, and DMY2c may sequentially decrease along the X direction. In detail, in the first dummy areas DMY1a, DMY1b and DMY1c and the second dummy areas DMY2a, DMY2b and DMY2c, the height of the protruding regions HR (refer to FIG. 3A), which are flat extending areas, may decrease sequentially in the X direction.

The first dummy areas DMY1a, DMY1b, and DMY1c may have a form in which the number of gate electrodes 130 stacked is sequentially decreased toward the outside of the first region R1 in the X direction. The second dummy areas DMY2a, DMY2b, and DMY2c may also have a form in which the number of the gate electrodes 130 stacked is sequentially decreased toward the outside of the first region R1 in the X direction. In some example embodiments, since the heights of the protruding regions HR are formed to be relatively low, the process of forming the first and second stack structures ST1 and ST2 may be relatively easy.

Referring to FIG. 8B, in the first stack structures ST1 of a semiconductor device 100f, the first dummy areas DMY1a, DMY1b, and DMY1c have a constant maximum height, and in the second stack structure ST2, maximum heights of the second dummy areas DMY2a, DMY2b, and DMY2c may be sequentially decreased along the X direction. The first dummy areas DMY1a, DMY1b, and DMY1c may have a form in which the number of gate electrodes 130 stacked is constant toward the outside of the first region R1 in the X direction. The second dummy areas DMY2a, DMY2b, and DMY2c may have a form in which the number of gate electrodes 130 stacked is sequentially decreased toward the outside of the first region R1 in the X direction. In some example embodiments, the process of forming the second stack structure ST2 may be relatively easy.

Figure 9:
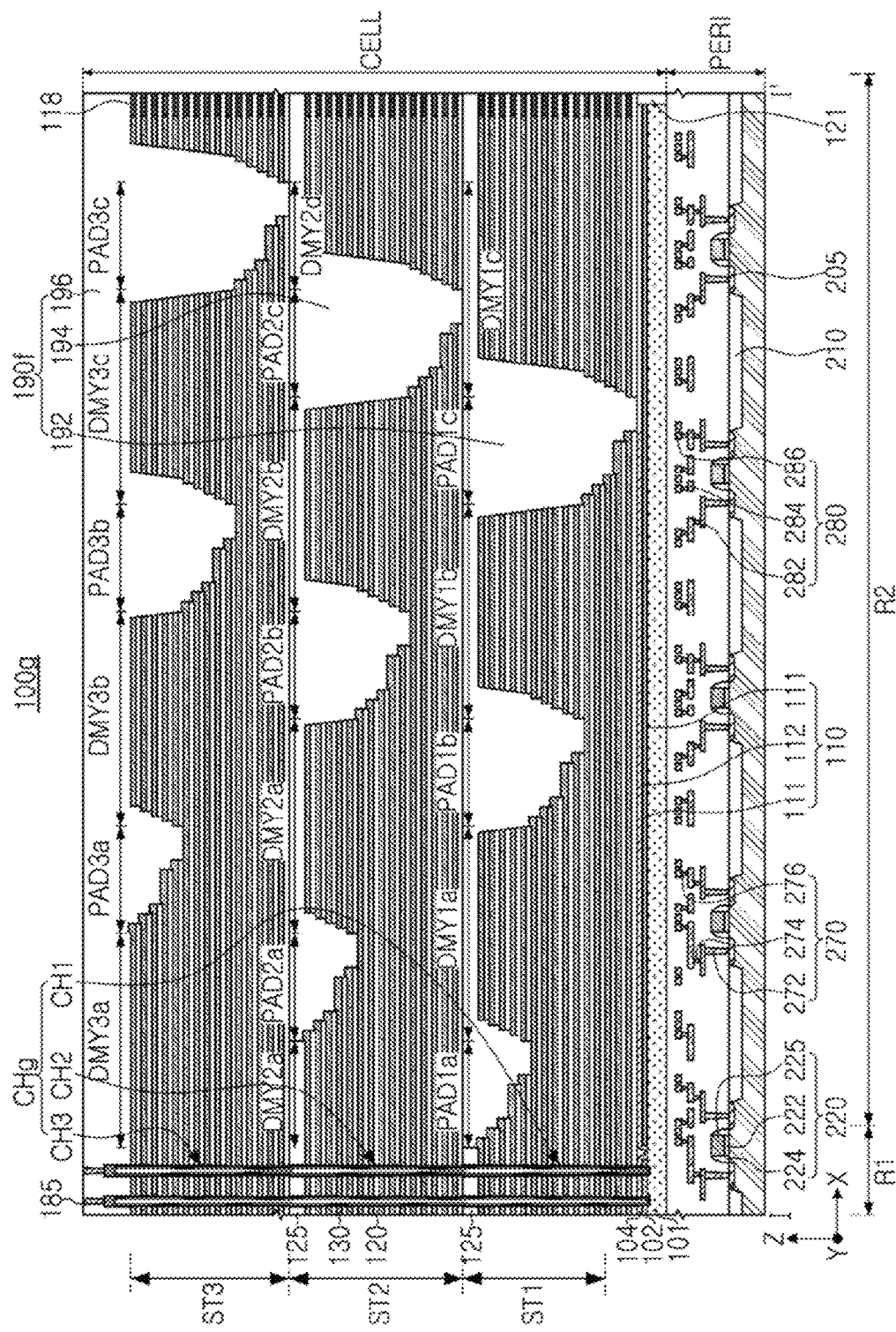
FIG. 9 is a cross-sectional view schematically illustrating a semiconductor device according to some example embodiments.

FIG. 9 is a cross-sectional view schematically illustrating a semiconductor device according to some example embodiments. FIG. 9 illustrates a cross section corresponding to FIG. 2A.

Referring to FIG. 9, in a semiconductor device 100g, the gate electrodes 130 of the memory cell region CELL may form first to third stack structures ST1, ST2, and ST3, and channel structures CHg may have a form in which the first to third channel structures CH1, CH2, and CH3 are stacked. Unlike some example embodiments, including the example embodiments of FIGS. 1 to 3C, the semiconductor device 100g may further include a third stack structure ST3. Hereinafter, a description overlapping with the description described above with reference to FIGS. 1 to 3C will be omitted.

The third stack structure ST3 may include third pad areas PAD3a, PAD3b, and PAD3c and third dummy areas DMY3a, DMY3b, and DMY3c in the second region R2. The third pad areas PAD3a, PAD3b and PAD3c and the third dummy areas DMY3a, DMY3b, and DMY3c may be alternately disposed in the X direction. In some example embodiments, the second stack structure ST2 may further include a rightmost second dummy area DMY2d.

The first pad areas PAD1a, PAD1b and PAD1c, the second pad areas PAD2a, PAD2b and PAD2c, and the third pad areas PAD3a, PAD3b and PAD3c may be disposed to be shifted (e.g., offset in the X direction in relation to each other) so as not to overlap each other in the Z direction. The first pad areas PAD1a, PAD1b, and PAD1c may overlap some of the second dummy areas DMY2a, DMY2b, and DMY2c and the third dummy areas DMY3a, DMY3b, and DMY3c in the Z direction. The second pad areas PAD2a, PAD2b, and PAD2c may overlap the first dummy areas DMY1a, DMY1b, and DMY1c and the third dummy areas DMY3a, DMY3b, and DMY3c in the Z direction. The third pad areas PAD3a, PAD3b, and PAD3c may overlap the first dummy areas DMY1a, DMY1b, and DMY1c and some of the second dummy areas DMY2b, DMY2c, and DMY2d in the Z direction.

In some example embodiments, as described above with reference to FIG. 4A, in a range in which the first and second sub-pad areas SP1 and SP2 of each of the first pad areas PAD1a, PAD1b, and PAD1c, the second pad areas PAD2a, PAD2b and PAD2c, and the third pad areas PAD3a, PAD3b, and PAD3c do not overlap each other, the shift degree of the first to third stack structures ST1, ST2, and ST3 may be changed variously. In some example embodiments, since the third stack structure ST3 is further included, the lengths of the first dummy areas DMY1a, DMY1b, and DMY1c, the second dummy areas DMY2a, DMY2b, and DMY2c, and the third dummy areas DMY3a, DMY3b, and DMY3c in the X direction may be relatively long, compared to some example embodiments, including the example embodiments of FIG. 2A.

In some example embodiments, as described above, three or more stack structures may be stacked in the Z direction, and pad areas of one stack structure may be disposed to overlap a dummy area of another stack structure. Also, although the pad area closest to the first region R1 is illustrated as the pad area PAD1a of the first stack structure ST1 in some example embodiments, example embodiments are not limited thereto. In some example embodiments, the stack structure having the pad area closest to the first region R1 may be variously changed.

Figure 10:
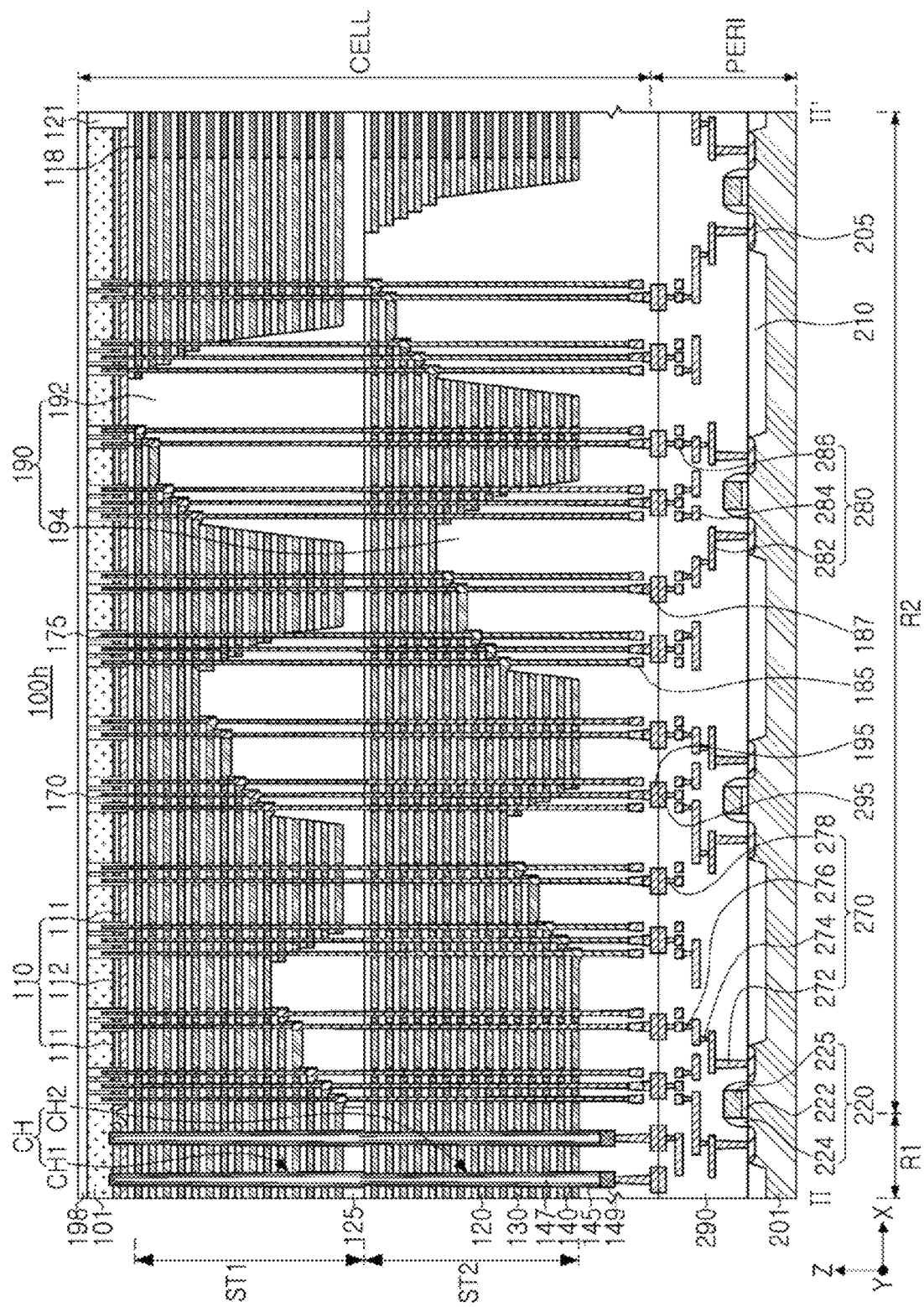
FIG. 10 is a schematic cross-sectional view of a semiconductor device according to some example embodiments.

FIG. 10 is a schematic cross-sectional view of a semiconductor device according to some example embodiments. FIG. 10 illustrates a cross section corresponding to FIG. 2B.

Referring to FIG. 10, a semiconductor device 100h may have a structure in which a peripheral circuit region PERI and a memory cell region CELL are vertically bonded. To this end, the peripheral circuit region PERI may further include fourth lower contact plugs 278 and first bonding metal layers 295, and the memory cell region CELL may further include bonding vias 187, second bonding metal layers 195, and a passivation layer 198 on the second substrate 101. In addition, upper ends of the first and second contact plugs 170 and 175 may be located in the second substrate 101.

The first bonding metal layers 295 may be disposed on the fourth lower contact plugs 278, and upper surfaces of the first bonding metal layers 295 may be exposed to the upper surface of the peripheral circuit region PERI through the peripheral region insulating layer 290. The second bonding metal layers 195 may be disposed below bonding vias 187, such that lower surfaces of the second bonding metal layers 195 may be exposed to the lower surface of the memory cell region CELL through the cell region insulating layer 190. The first bonding metal layers 295 and the second bonding metal layers 195 may include a conductive material, for example, copper (Cu). In some example embodiments, the peripheral region insulating layer 290 and the cell region insulating layer 190 may each further include a bonding dielectric layer surrounding the first bonding metal layers 295 and the second bonding metal layers 195 and disposed to a predetermined depth from one surface. The bonding dielectric layer may include at least one of, for example, SiO, SiN, SiCN, SiOC, SiON, and SiOCN. The passivation layer 198 may be disposed on the second substrate 101 to protect the second substrate 101, and may include an insulating material.

The peripheral circuit region PERI and the memory cell region CELL may be bonded by bonding the first bonding metal layers 295 and the second bonding metal layers 195 and bonding between the bonding dielectric layers. The bonding of the first bonding metal layers 295 and the second bonding metal layers 195 may be, for example, copper (Cu)-to-copper (Cu) bonding, and the bonding of the bonding dielectric layers may be, for example, dielectric-to-dielectric bonding, such as SiCN-to-SiCN bonding. The peripheral circuit region PERI and the memory cell region CELL may be bonded by hybrid bonding including copper (Cu)-to-copper (Cu) bonding and dielectric-to-dielectric bonding.

Upper ends of the first and second contact plugs 170 and 175 may be positioned to be electrically separated from each other by the substrate insulating layer 121 in the second substrate 101. However, in some example embodiments, the second substrate 101 may include an insulating region, and ends of the first and second contact plugs 170 and 175 may also be connected to the insulating region.

FIGS. 11A to 11M are schematic cross-sectional views illustrating a method of manufacturing a semiconductor device according to some example embodiments. In FIGS. 11A to 11M, regions corresponding to the region illustrated in FIG. 2B are illustrated.

Figure 11A:
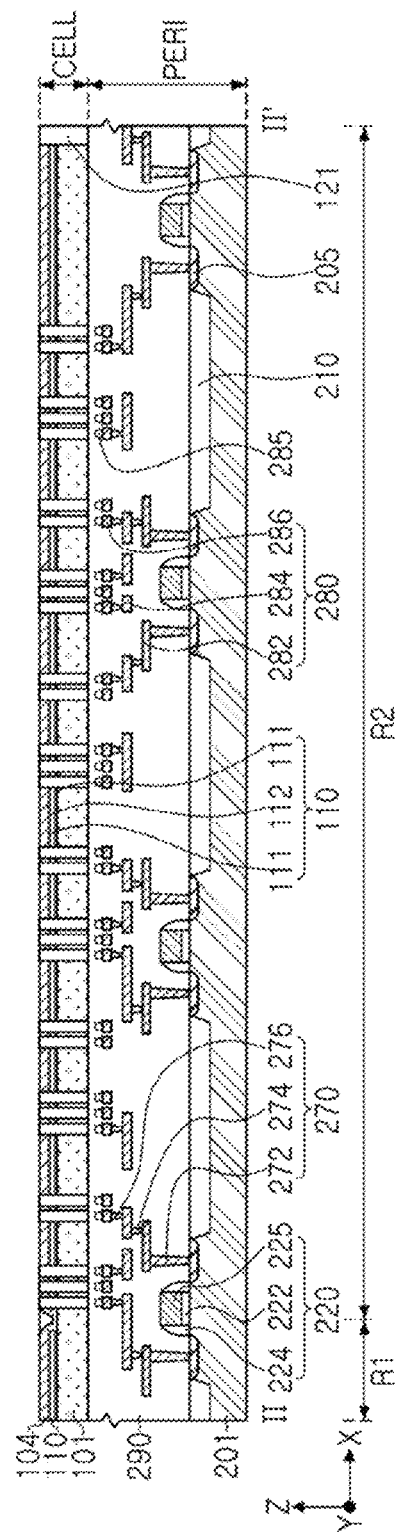
FIGS. 11A, 11B, 11C, 11D, 11E, 11F, 11G, 11H, 11I, 11J, 11K, 11L, and 11M are schematic cross-sectional views illustrating a method of manufacturing a semiconductor device according to some example embodiments.

Referring to FIG. 11A, a peripheral circuit region PERI including circuit elements 220 and lower interconnection structures may be formed on a first substrate 201, and a second substrate 101 on which the memory cell region CELL is provided, a horizontal insulating layer 110, a second horizontal conductive layer 104, and a substrate insulating layer 121 may be formed on the peripheral circuit region PERI.

First, device isolation layers 210 may be formed in the first substrate 201, and a circuit gate dielectric layer 222 and a circuit gate electrode 225 may be sequentially formed on the first substrate 201. The device isolation layers 210 may be formed by, for example, a shallow trench isolation (STI)

process. The circuit gate dielectric layer 222 and the circuit gate electrode 225 may be formed using atomic layer deposition (ALD) or chemical vapor deposition (CVD). The circuit gate dielectric layer 222 may be formed of silicon oxide, and the circuit gate electrode 225 may be formed of at least one of polycrystalline silicon or metal silicide layer, but the configuration is not limited thereto. Next, a spacer layer 224 may be formed on both sides of the circuit gate dielectric layer 222 and the circuit gate electrode 225. In some example embodiments, the spacer layer 224 may be formed of a plurality of layers. Next, impurity regions 205 may be formed using an ion implantation process.

Lower contact plugs 270 of the lower interconnection structures may be formed by partially forming the peripheral region insulating layer 290, then removing a portion via partial etching and then filling a conductive material. Lower interconnection lines 280 may be formed by, for example, depositing a conductive material and then patterning the same. Pad layers 285 may be further formed on third lower interconnection lines 286.

The peripheral region insulating layer 290 may be comprised of a plurality of insulating layers. The peripheral region insulating layer 290 may be formed, by partial formation in respective operations of forming the lower interconnection structures, and by forming a portion on an uppermost lower interconnection line of the lower interconnection lines 280, to ultimately cover the circuit elements 220 and the lower interconnection structures.

Next, the second substrate 101 may be formed on the peripheral region insulating layer 290. The second substrate 101 may be formed of, for example, polycrystalline silicon, and may be formed by a CVD process. Polycrystalline silicon constituting the second substrate 101 may include impurities.

First and second horizontal insulating layers 111 and 112 constituting the horizontal insulating layer 110 may be alternately stacked on the second substrate 101. The horizontal insulating layer 110 may be partially replaced with the first horizontal conductive layer 102 of FIG. 2B through a subsequent process. The first horizontal insulating layers 111 may include a material different from that of the second horizontal insulating layer 112. For example, the first horizontal insulating layers 111 are formed of the same material as that of interlayer insulating layers 120, and the second horizontal insulating layer 112 may be formed of the same material as that of a subsequent sacrificial insulating layers 118. The horizontal insulating layer 110 may be partially removed by a patterning process in some regions, for example, in the second region R2 of the second substrate 101.

The second horizontal conductive layer 104 may be formed on the horizontal insulating layer 110 and may be in contact with the second substrate 101 in a region from which the horizontal insulating layer 110 has been removed. Accordingly, the second horizontal conductive layer 104 may be bent along the ends of the horizontal insulating layer 110, cover the ends, and extend onto the second substrate 101.

The substrate insulating layer 121 may be formed to penetrate through the second substrate 101, in regions in which the first and second contact plugs 170 and 175 (refer to FIG. 2B) are to be disposed and in regions outside of the gate electrodes 130. The substrate insulating layer 121 may be formed by removing portions of the second substrate 101, the horizontal insulating layer 110, and the second horizontal conductive layer 104, and then filling the region with an insulating material. After the insulating material is filled, a planarization process may be further performed using a chemical mechanical polishing (CMP) process. Accordingly, the upper surface of the substrate insulating layer 121 may be substantially coplanar with the upper surface of the second horizontal conductive layer 104.

Figure 11B:
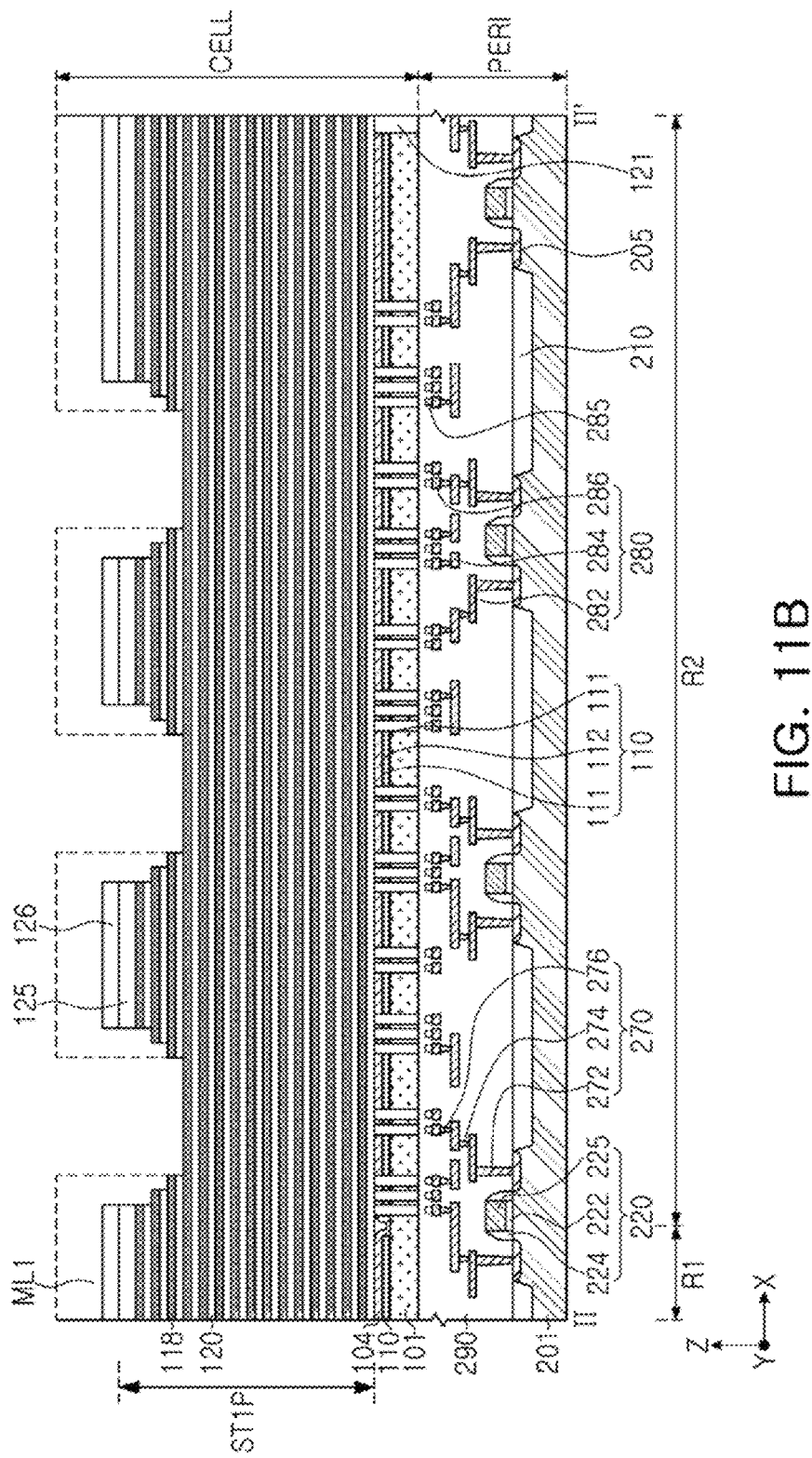

Referring to FIG. 11B, a first preliminary stack structure ST1P may be formed by alternately stacking the sacrificial insulating layers 118 and the interlayer insulating layers 120 on the second horizontal conductive layer 104, and a first step forming process may be performed on the first preliminary stack structure ST1P.

A relatively thick upper interlayer insulating layer 125 may be formed on an uppermost portion of the first preliminary stack structure ST1P of the sacrificial insulating layers 118 and the interlayer insulating layers 120, and an etch stop layer 126 may be formed thereon. The sacrificial insulating layers 118 may be layers replaced with the gate electrodes 130 (see FIG. 2B) through a subsequent process. Therefore, the first preliminary stack structure ST1P may form the first stack structure ST1 (see FIG. 2B).

The sacrificial insulating layers 118 may be formed of a material different from that of the interlayer insulating layers 120, and may be formed of a material that may be etched with etching selectivity for the interlayer insulating layers 120 under specific etching conditions. For example, the interlayer insulating layer 120 and the upper interlayer insulating layer 125 may be formed of at least one of silicon oxide and silicon nitride, and the sacrificial insulating layers 118 may be formed of a material different from the interlayer insulating layer 120, for example, selected from among silicon, silicon oxide, silicon carbide, and silicon nitride. In some example embodiments, the thicknesses of the interlayer insulating layers 120 may not all be the same. In addition, the thicknesses of the interlayer insulating layers 120 and the sacrificial insulating layers 118 and the number of films constituting the interlayer insulating layers 120 and the sacrificial insulating layers 118 may be variously changed from those illustrated. The etch stop layer 126 may be a layer for protecting the lower structure when the stepped structure is formed, and may also be referred to as a hard mask layer.

Next, a first mask layer ML1 may be formed and the first preliminary stack structure ST1P exposed using the first mask layer ML1 may be etched. The first mask layer ML1 may be, for example, a photoresist layer, and may be formed by a photolithography process. The process of trimming the first mask layer ML1 and the process of etching the first preliminary stack structure ST1P may be repeatedly performed. When the trimming process for the first mask layer ML1 is repeated, the exposed area of the first preliminary stack structure ST1P may be sequentially increased.

Figure 11C:
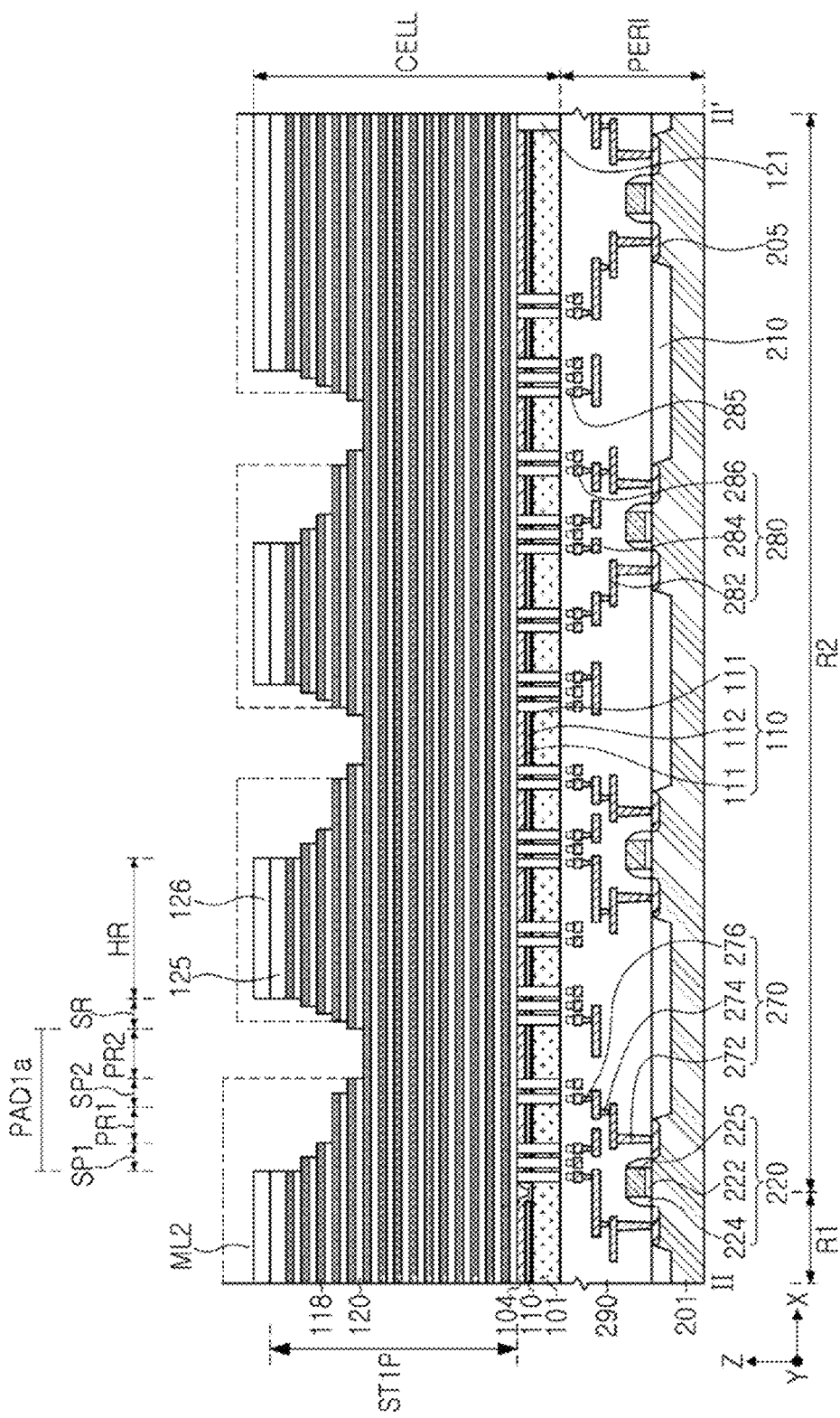

Referring to FIG. 11C, a second step forming process may be performed on the first preliminary stack structure ST1P.

The first preliminary stack structure ST1P may be etched while the area exposed by a second mask layer ML2 is sequentially increased by trimming the second mask layer ML2. The second mask layer ML2 may be first formed in such a manner that an end thereof is positioned in the middle of the flat upper surface of the step region SR. Accordingly, the length of each upper surface of the step region SR may be shorter than that in the first and sub-pad areas SP1 and SP2.

Accordingly, the shapes of the first sub-pad area SP1, the first flat region PR1, the second sub-pad area SP2, and the step region SR may be formed. Also, in this operation, a first-first pad area PAD1a may be formed.

Figure 11D:
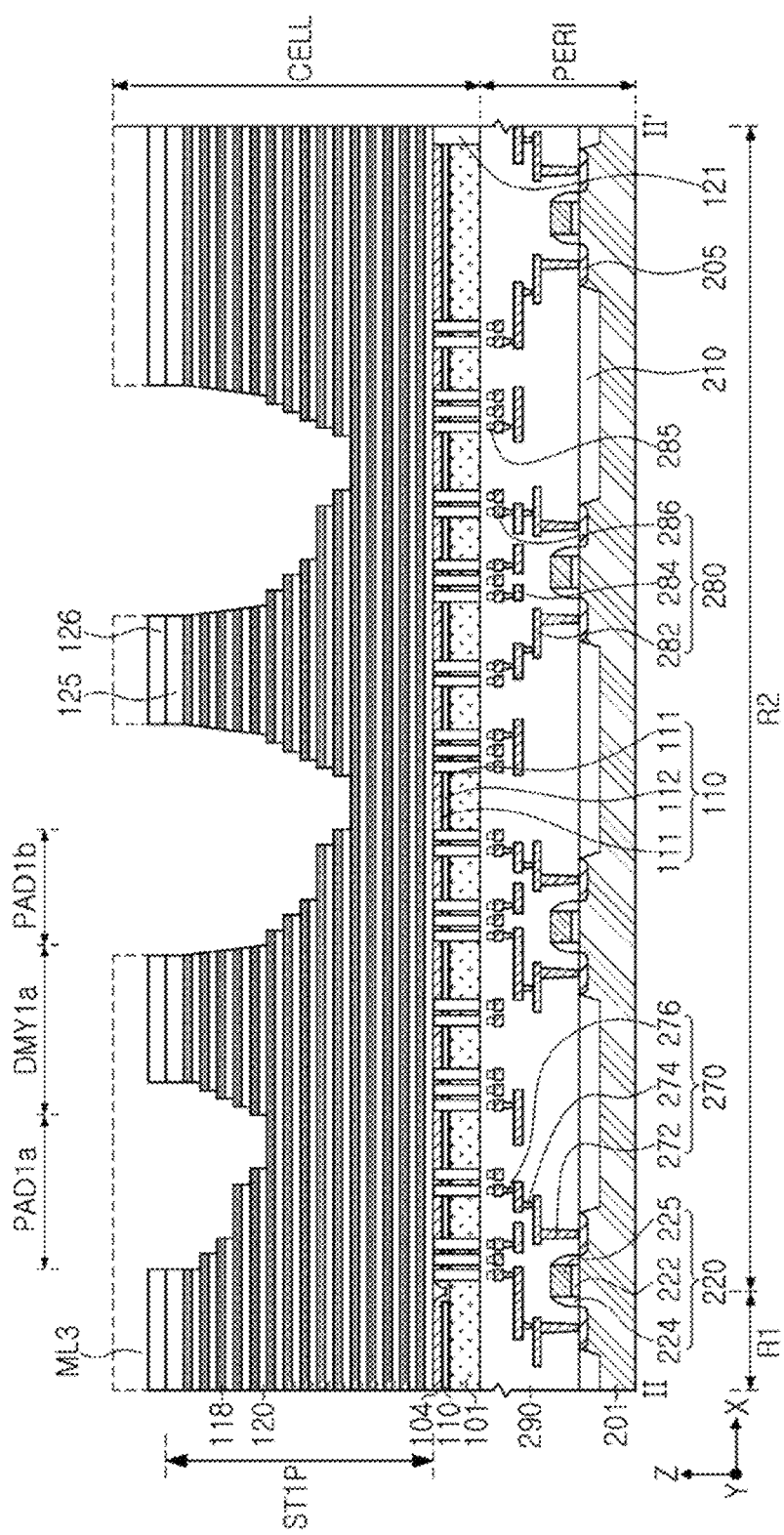

Referring to FIG. 11D, a third step forming process may be performed on the first preliminary stack structure ST1P.

The third mask layer ML3 is used to expose second and third-first pad areas PAD1b and PAD1c and step regions SR of second and third-first dummy areas DMY1b and DMY1c, thereby etching the first preliminary stack structure ST1P. Accordingly, a first-first dummy area DMY1a and a second-first pad area PAD1b may be formed.

Figure 11E:
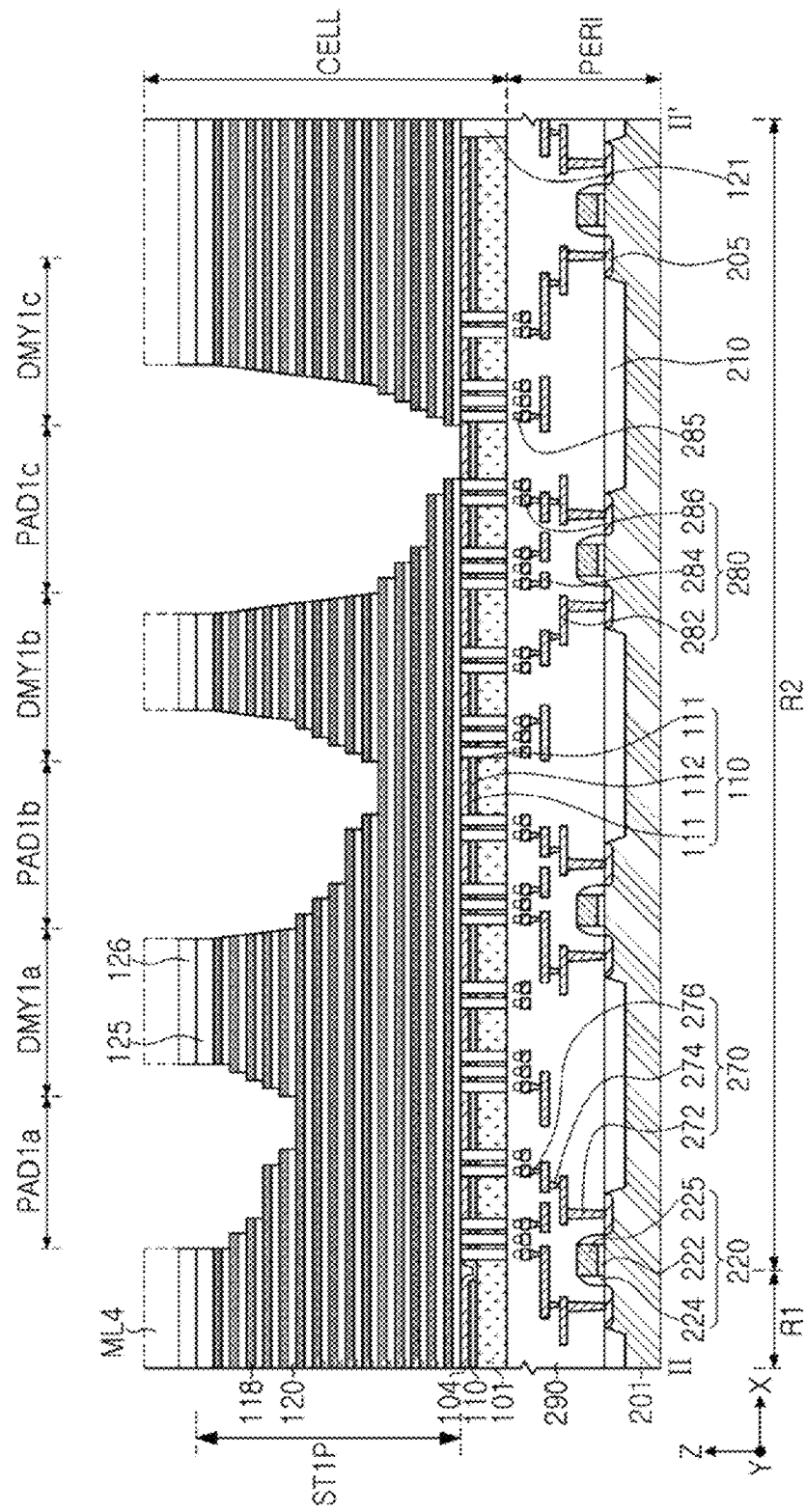

Referring to FIG. 11E, a fourth step forming process may be performed on the first preliminary stack structure ST1P.

The first preliminary stack structure ST1P may be etched by exposing the third-first pad area PAD1c and a step region SR of the third-first dummy area DMY1c using a fourth mask layer ML4. Accordingly, a second-first dummy area DMY1b, a third-first pad area PAD1c, and a third-first dummy area DMY1c may be formed.

Figure 11F:
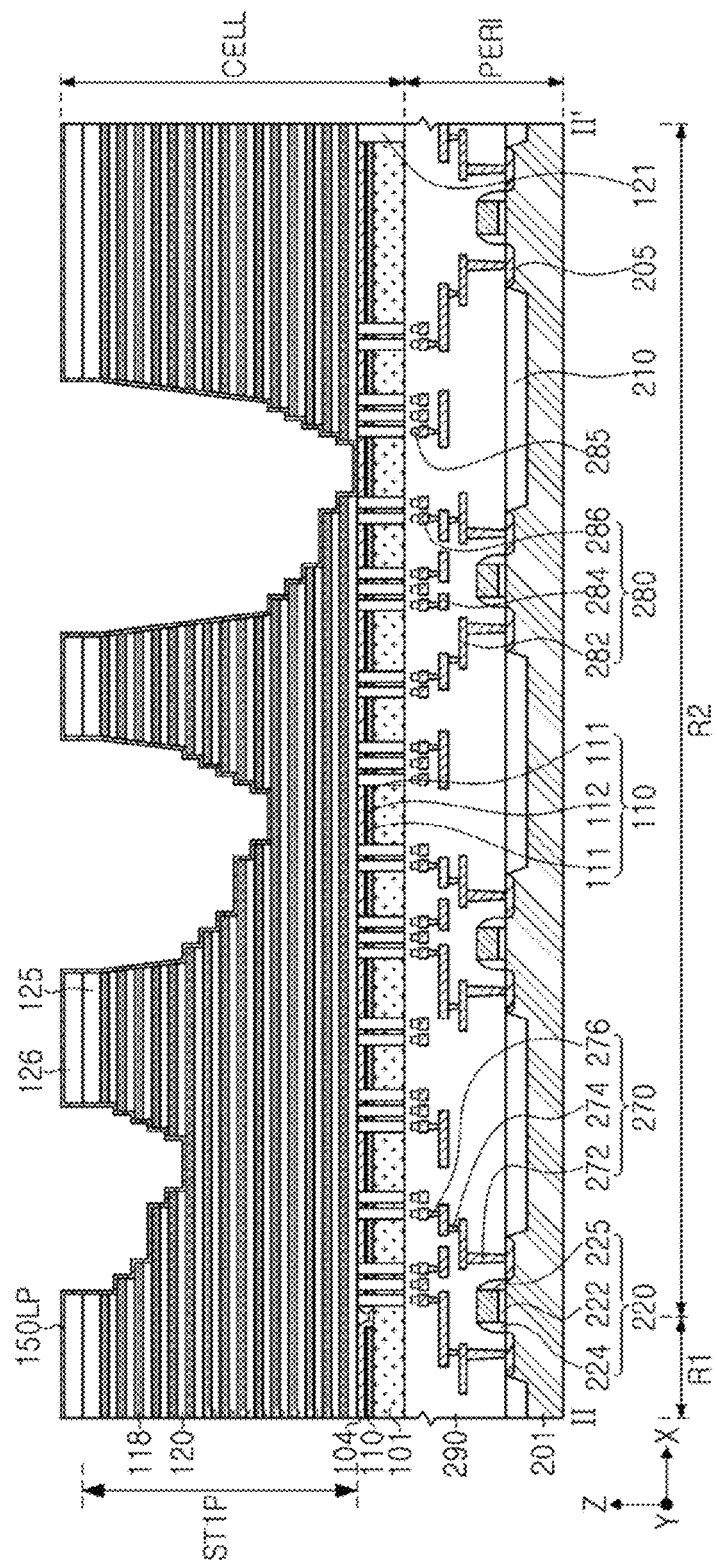

Referring to FIG. 11F, a first preliminary nitride layer 150LP may be formed on the first preliminary stack structure ST1P.

The first preliminary nitride layer 150LP may cover the exposed sacrificial insulating layers 118 and cover sides of the step regions of the first preliminary stack structure ST1P, along the step shape of the first preliminary stack structure ST1P. The thickness of the first preliminary nitride layer 150LP may be in the range of about 50% to about 110% of the thickness of the sacrificial insulating layers 118, but is not limited thereto.

Figure 11G:
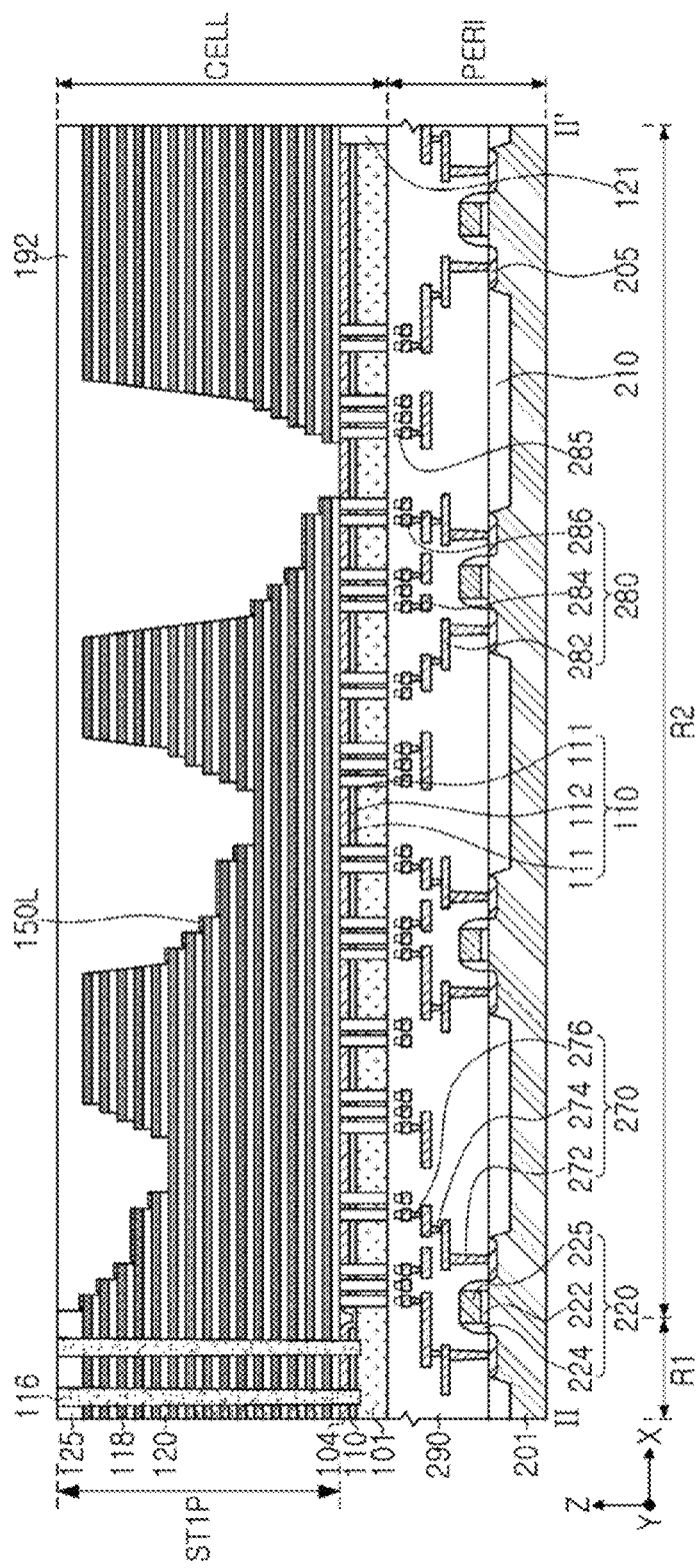

Referring to FIG. 11G, after forming the first nitride layer 150L by partially removing the first preliminary nitride layer 150LP so as to remain on only the upper surfaces of the exposed sacrificial insulating layers 118, a first cell region insulating layer 192 and channel sacrificial layers 116 may be formed.

First, the first preliminary nitride layer 150LP may be partially removed from a partial region by forming a mask layer using a photolithography process. For example, the first preliminary nitride layer 150LP may be removed from regions corresponding to the first dummy areas DMY1a, DMY1b and DMY1c, the second dummy areas DMY2a, DMY2b and DMY2c, and the second flat regions PR2 (refer to FIG. 3A) of the first pad areas PAD1a, PAD1b and PAD1c and the second pad areas PAD2a, PAD2b and PAD2c, illustrated in FIG. 2A. Accordingly, contact insulating layers 160 may be formed in the first dummy areas DMY1a, DMY1b, and DMY1c and the second dummy areas DMY2a, DMY2b, and DMY2c through a subsequent process. In some example embodiments, the first preliminary nitride layer 150LP may be removed only from regions corresponding to the first dummy areas DMY1a, DMY1b, and DMY1c and the second dummy areas DMY2a, DMY2b, and DMY2c.

However, in some example embodiments, this process may be omitted. In this case, during the removal process of the etch stop layer 126 below, the first preliminary nitride layer 150LP may be removed together with the etch stop layer 126 from regions corresponding to the protruding regions HR (refer to FIG. 3A) of the first dummy areas DMY1a, DMY1b, and DMY1c and the second dummy areas DMY2a, DMY2b, and DMY2c. In this case, as in some example embodiments, including the example embodiments of FIGS. 4B and 4C, in the semiconductor device, the first and second sub-pad areas SP1 and SP2 of the first and second stack structures ST1 and ST2 (see FIG. 3A) may be disposed to overlap only protruding regions HR of the second and first stack structures ST2 and ST1, respectively. Also, in this case, the first preliminary nitride layer 150LP may remain outside a lowermost sacrificial insulating layer 118.

Next, the first preliminary nitride layer 150LP may be selectively removed from side surfaces of the steps of the first preliminary stack structure ST1P. The removal process may be performed after changing the physical properties of horizontally deposited regions of the first preliminary nitride layer 150LP using plasma, for example. Accordingly, the first preliminary nitride layer 150LP may remain on the exposed upper surfaces of the sacrificial insulating layers 118 to form a first nitride layer 150L.

Next, a first cell region insulating layer 192 covering the first preliminary stack structure ST1P may be formed, and the etch stop layer 126 may be removed by a planarization process.

Next, the channel sacrificial layers 116 may be formed in a region corresponding to the first channel structures CH1 (see FIG. 2B) in the first region R1. The channel sacrificial layers 116 may be formed by forming lower channel holes to penetrate through the first preliminary stack structure ST1P and then depositing a material constituting the channel sacrificial layers 116 in the lower channel holes. The channel sacrificial layers 116 may include, for example, polycrystalline silicon.

Figure 11H:
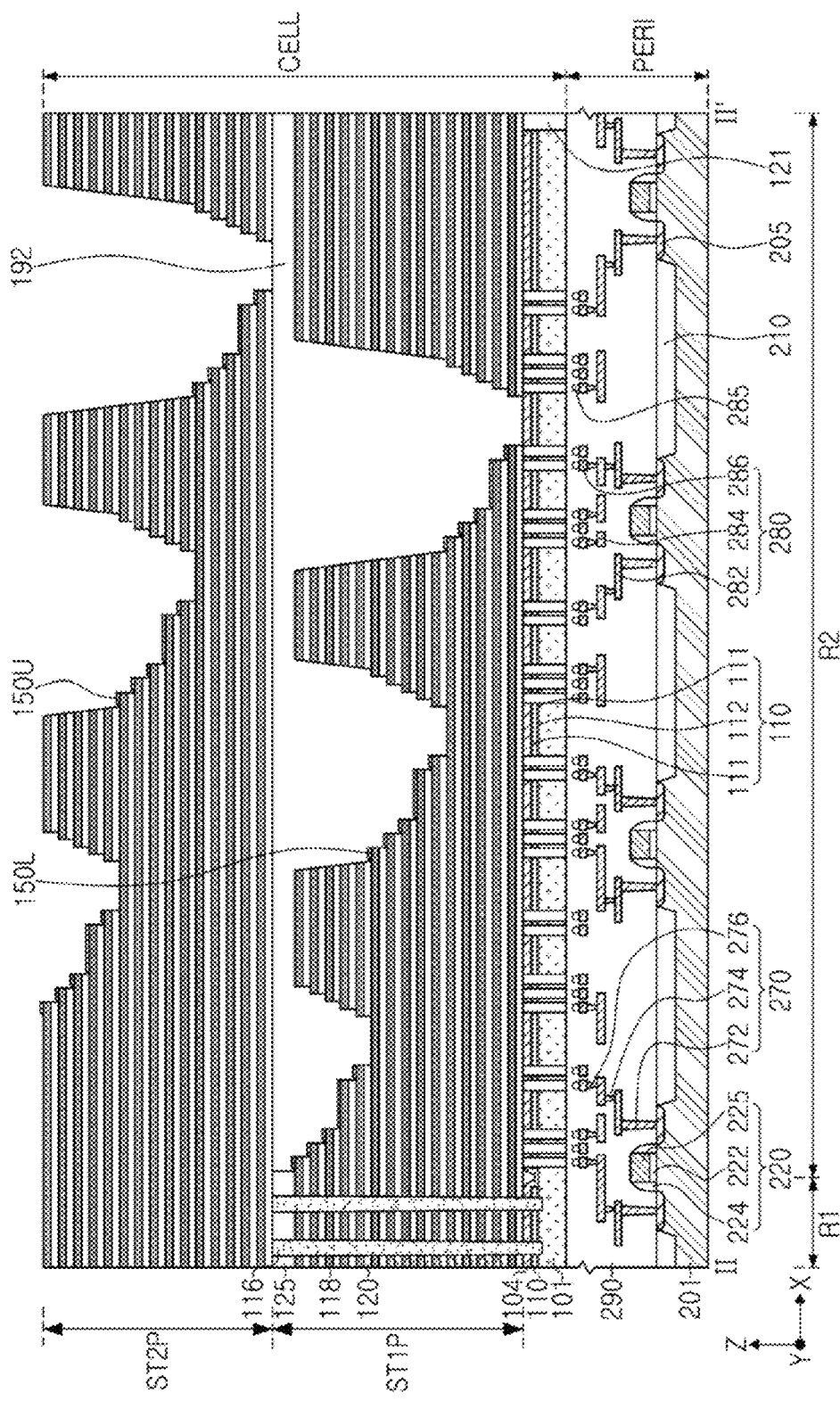

Referring to FIG. 11H, a second preliminary stack structure ST2P may be formed by alternately stacking the sacrificial insulating layers 118 and the interlayer insulating layers 120 on the first preliminary stack structure ST1P, and a step structure may be formed. Then, a second nitride layer 150U may be formed.

In this operation, in the region corresponding to the second stack structure ST2, the process for the first preliminary stack structure ST1P described above with reference to FIGS. 11B to 11G may be performed in the same manner. Accordingly, the second nitride layer 150U may be formed on a portion of the upper surfaces of the sacrificial insulating layers 118 exposed upwardly.

Accordingly, in an area corresponding to at least a portion of the first pad areas PAD1a, PAD1b, and PAD1c and the second pad areas PAD2a, PAD2b, and PAD2c of FIG. 2A, the first and second nitride layers 150L and 150U may remain on the upper surfaces of the sacrificial insulating layers 118 exposed upwardly. The regions in which the first and second nitride layers 150L and 150U remain may be variously changed according to some example embodiments, within regions corresponding to the first pad areas PAD1a, PAD1b, and PAD1c and the second pad areas PAD2a, PAD2b, and PAD2c. However, the first and second nitride layers 150L and 150U may remain in at least regions corresponding to the first and second sub-pad areas SP1 and SP2 (refer to FIG. 3A). In addition, in the first dummy areas DMY1a, DMY1b and DMY1c and the second dummy areas DMY2a, DMY2b and DMY2c, in an at least region through which the first and second contact plugs 170 and 175 (refer to FIG. 2B) penetrate, the first and second nitride layers 150L and 150U may be removed from the upper surfaces of the sacrificial insulating layers 118 exposed upwardly.

Figure 11I:
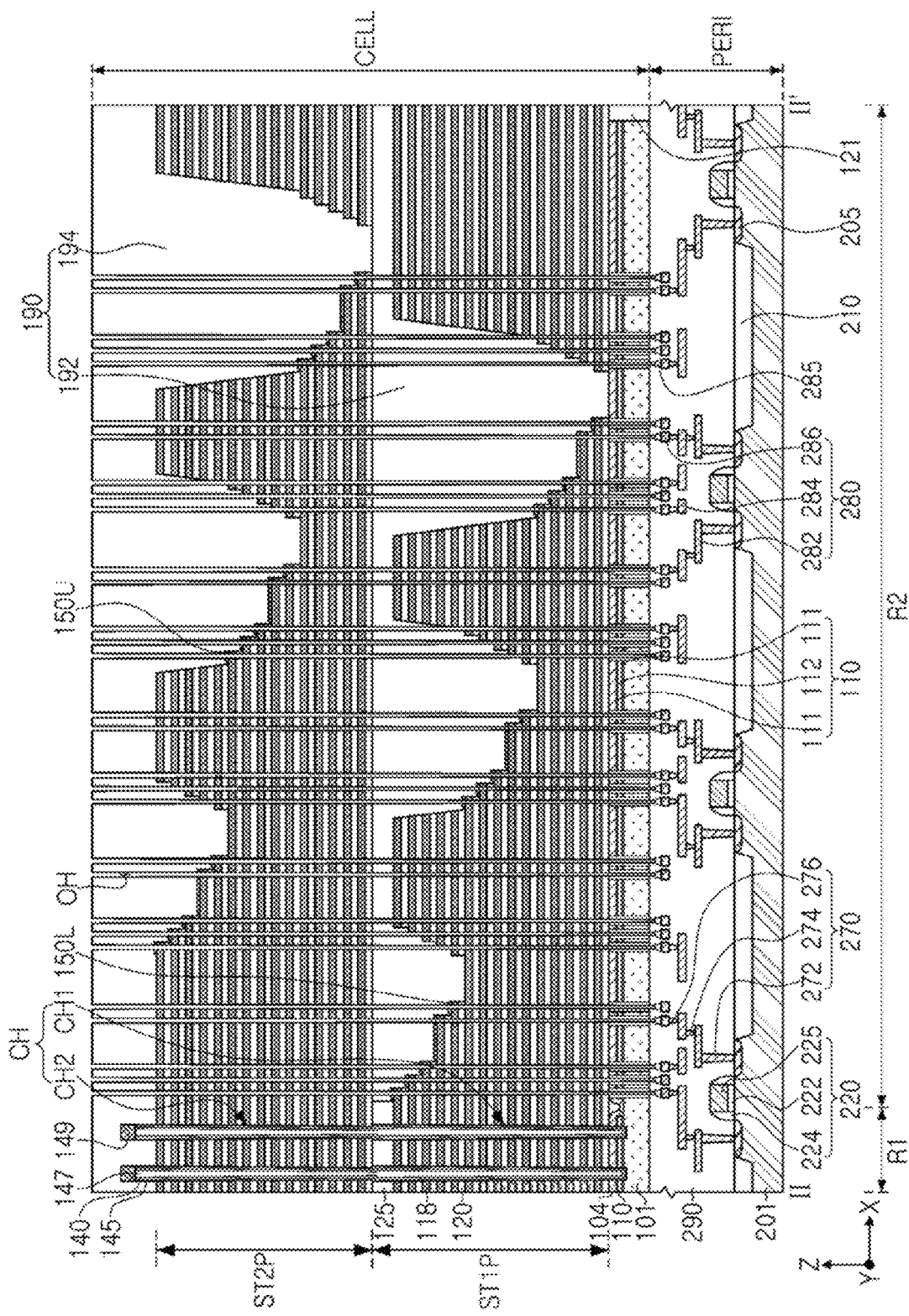

Referring to FIG. 11I, after forming channel structures CH, openings OH may be formed.

First, in the second preliminary stack structure ST2P, portions of the sacrificial insulating layers 118 and the interlayer insulating layers 120 may be removed to form the upper separation region SS (refer to FIG. 2C). To form the upper separation region SS, a separate mask layer may be used to expose a region in which the upper separation region SS is to be formed, and a predetermined number of sacrificial insulating layers 118 and interlayer insulating layers 120 may be removed from an uppermost portion, and then, the upper isolation insulating layer 103 (refer to FIG. 2C) may be formed by depositing an insulating material. Next, a portion of a second cell region insulating layer 194 covering the second preliminary stack structure ST2P may be formed.

The channel structures CH may be formed by forming upper channel holes to penetrate through the second preliminary stack structure ST2P and then removing the channel sacrificial layers 116 to form all channel holes, and then, by filling the entire channel holes. In detail, the channel structures CH may be formed by sequentially forming a gate dielectric layer 145, a channel layer 140, a channel-filling insulating layer 147, and a channel pad 149 in all the channel holes. In this operation, at least a portion of the gate dielectric layer 145 may be formed to extend vertically along the channel layer 140. The channel layer 140 may be formed on the gate dielectric layer 145 in the channel structures CH. The channel-filling insulating layer 147 is formed to fill the channel structures CH, and may be an insulating material. The channel pad 149 may be formed of a conductive material, for example, polycrystalline silicon.

The openings OH may be formed in regions in which the first and second contact plugs 170 and 175 of FIG. 2B are to be formed. Before forming the openings OH, a portion of a second cell region insulating layer 194 covering the channel structures CH may be further formed. The openings OH may have a cylindrical hole shape, penetrate through the first and second preliminary stack structures ST1P and ST2P and the substrate insulating layer 121, and extend to the peripheral circuit region PERI. The openings OH may be formed to expose the pad layers 285 on the lower interconnection lines 280.

Figure 11J:
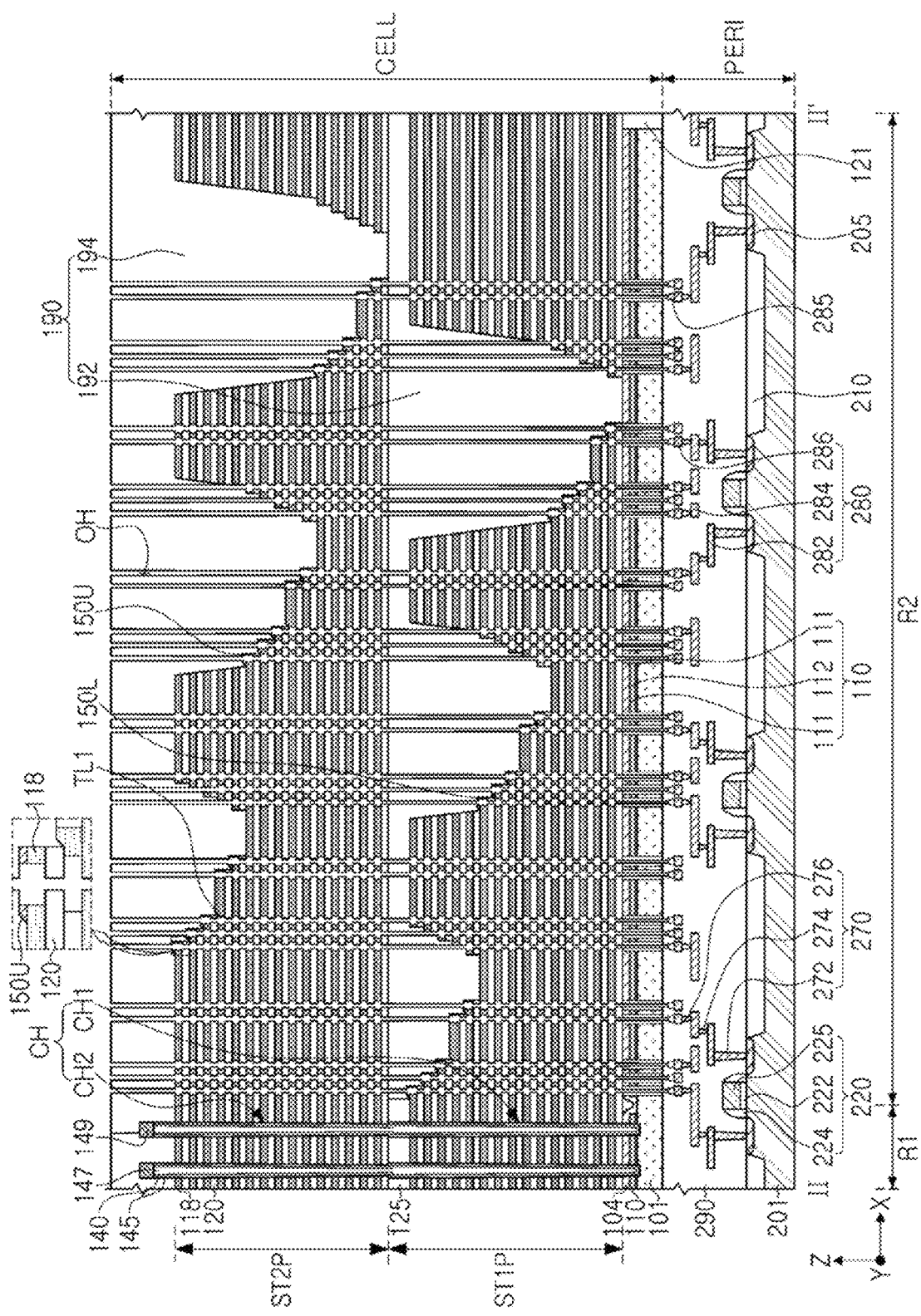

Referring to FIG. 11J, the sacrificial insulating layers 118 and the first and second nitride layers 150L and 150U exposed through the openings OH may be partially removed.

An etchant is introduced through the openings OH to remove the sacrificial insulating layers 118 and the first and second nitride layers 150L and 150U to a predetermined length from the circumference of the openings OH to form first tunnel portions TL1. The first tunnel portions TL1 may be formed to have a relatively short length in uppermost sacrificial insulating layers 118, and may be formed to have a relatively long length in sacrificial insulating layers 118 therebelow.

To this end, initially, the first tunnel portions TL1 may be formed to be relatively long in the uppermost sacrificial insulating layers 118. This may be due to the fact that the etching rate of the first and second nitride layers 150L and 150U is relatively faster than that of the sacrificial insulating layers 118. Next, a separate sacrificial layer may be formed in the openings OH and the first tunnel portions TL1 to fill the first tunnel portions TL1. The sacrificial layer may be formed of a material having an etching rate slower than that of the first and second nitride layers 150L and 150U and the sacrificial insulating layers 118. Next, portions of the sacrificial layer and the sacrificial insulating layers 118 may be removed. In this case, the sacrificial layer remains in uppermost first tunnel portions TL1, and in other first tunnel portions TL1, the sacrificial insulating layers 118 may further be partially removed after the sacrificial layer is removed. Accordingly, the first tunnel portions TL1 may be formed to have a relatively short length in the uppermost sacrificial insulating layers 118.

Figure 11K:
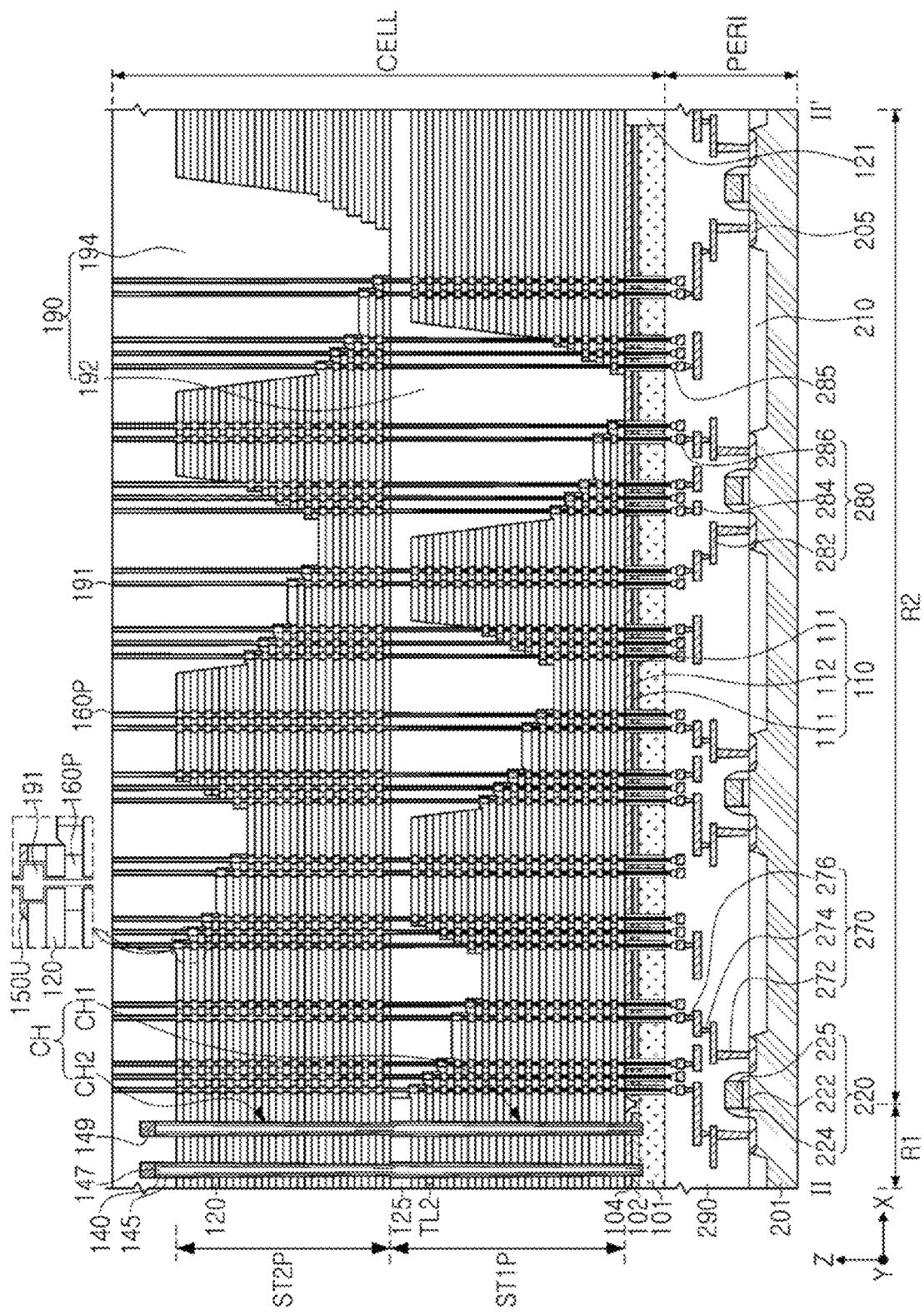

Referring to FIG. 11K, the first tunnel portions TL1 and the openings OH may be filled with preliminary contact insulating layers 160P and vertical sacrificial layers 191, and the sacrificial insulating layers 118 and the first and second nitride layers 150L and 150U may be removed through separate openings, thereby forming second tunnel portions TL2.

First, the preliminary contact insulating layers 160P may be layers that remain thereafter and form the contact insulating layers 160. The preliminary contact insulating layers 160P may be deposited by, for example, an ALD process. The preliminary contact insulating layers 160P may be formed so as not to completely fill the first tunnel portions TL1 in the uppermost first tunnel portions TL1 which are regions having a relatively great height or thickness and formed to completely fill the first tunnel portions TL1 therebelow. This may be due to a relative height difference between the uppermost first tunnel portions TL1 and the first tunnel portions TL1 therebelow.

The vertical sacrificial layers 191 may be formed to fill the remaining space in the openings OH. The vertical sacrificial layers 191 may include a material different from that of the preliminary contact insulating layers 160P, for example, include polycrystalline silicon.

Next, separate openings extending to the second substrate 101 through the sacrificial insulating layers 118 and the interlayer insulating layers 120 may be formed in positions of the separation regions MS (see FIG. 1).

First, by performing an etch-back process while forming separate sacrificial spacer layers in the openings, the horizontal insulating layer 110 is selectively removed in the first region R1, and a portion of the exposed gate dielectric layer 145 may also be removed together. After the first horizontal conductive layer 102 is formed by depositing a conductive material in the region in which the horizontal insulating layer 110 has been removed, the sacrificial spacer layers may be removed in the openings. Through this process, the first horizontal conductive layer 102 may be formed in the first region R1.

Next, the sacrificial insulating layers 118 may be selectively removed with respect to the interlayer insulating layers 120, the second horizontal conductive layer 104, and the substrate insulating layer 121 using, for example, wet etching, and may be completely eliminated. Accordingly, the second tunnel portions TL2 may be formed between the interlayer insulating layers 120.

Figure 11L:
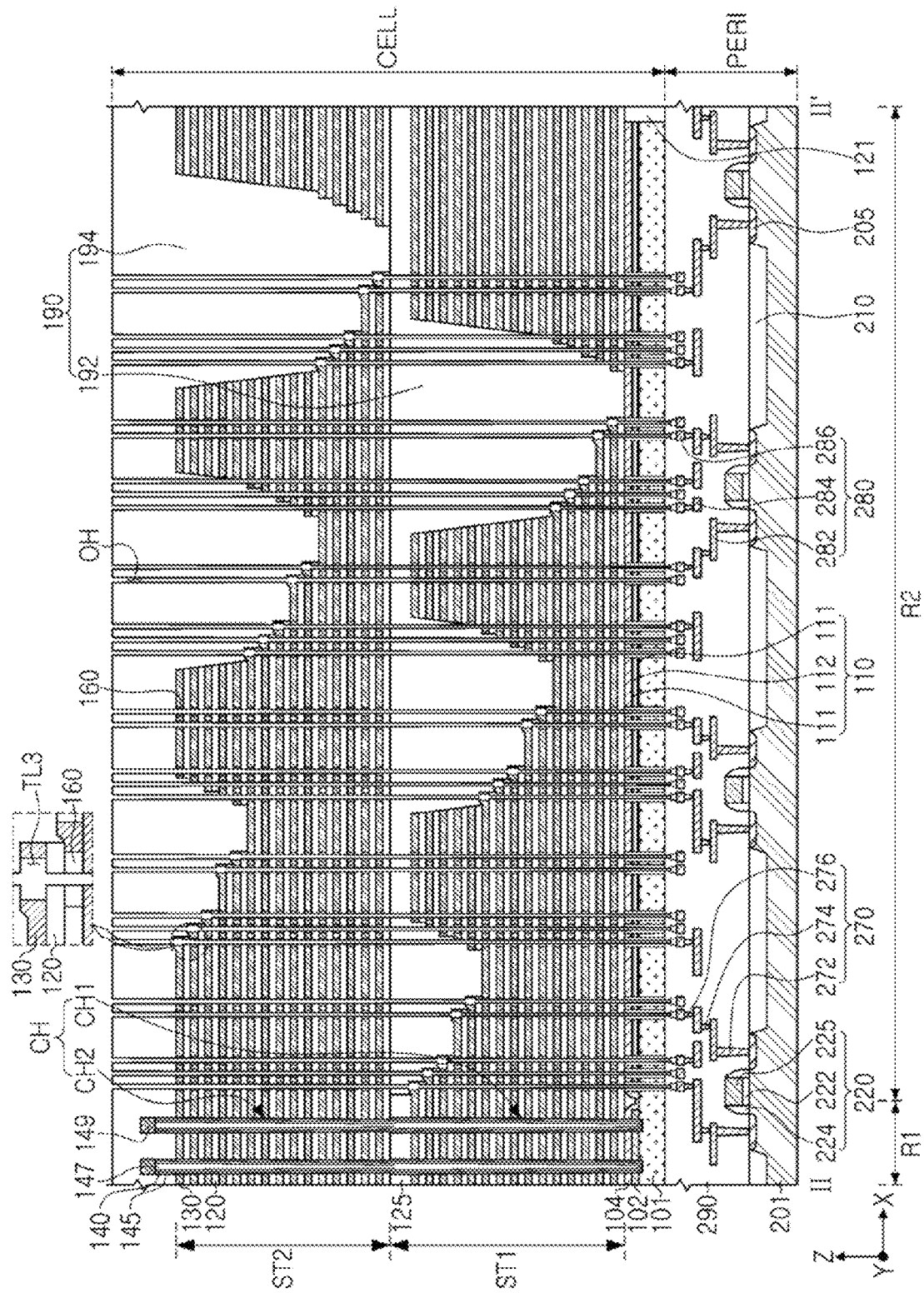

Referring to FIG. 11L, the gate electrodes 130 are formed by filling the second tunnel portions TL2 with a conductive material, and the contact insulating layers 160 may be formed by removing the vertical sacrificial layers 191 and then removing a portion of the preliminary contact insulating layers 160P.

First, before the formation of the gate electrodes 130, a portion of the gate dielectric layer 145 extending vertically along the gate electrode 130 may be formed, and the gate electrodes 130 may be formed. Accordingly, the first and second stack structures ST1 and ST2 may be formed. The conductive material forming the gate electrodes 130 may fill the second tunnel portions TL2. The conductive material may include a metal, polycrystalline silicon, or a metal silicide material. After the gate electrodes 130 are formed, the isolation insulating layers 106 (refer to FIG. 2C) may be formed in the openings formed in regions corresponding to the separation regions MS (refer to FIG. 1).

Next, the vertical sacrificial layers 191 may be selectively removed in the openings OH. A portion of the preliminary contact insulating layers 160P exposed after the vertical sacrificial layers 191 may be removed. In this case, in uppermost second tunnels TL2, all preliminary contact insulating layers 160P are removed to form third tunnel portions TL3, and therebelow, the preliminary contact insulating layers 160P remain to form the contact insulating layers 160. In the third tunnel portions TL3, a portion of the gate dielectric layer 145 exposed after the preliminary contact insulating layers 160P is removed may also be removed to expose side surfaces of the gate electrodes 130.

Figure 11M:
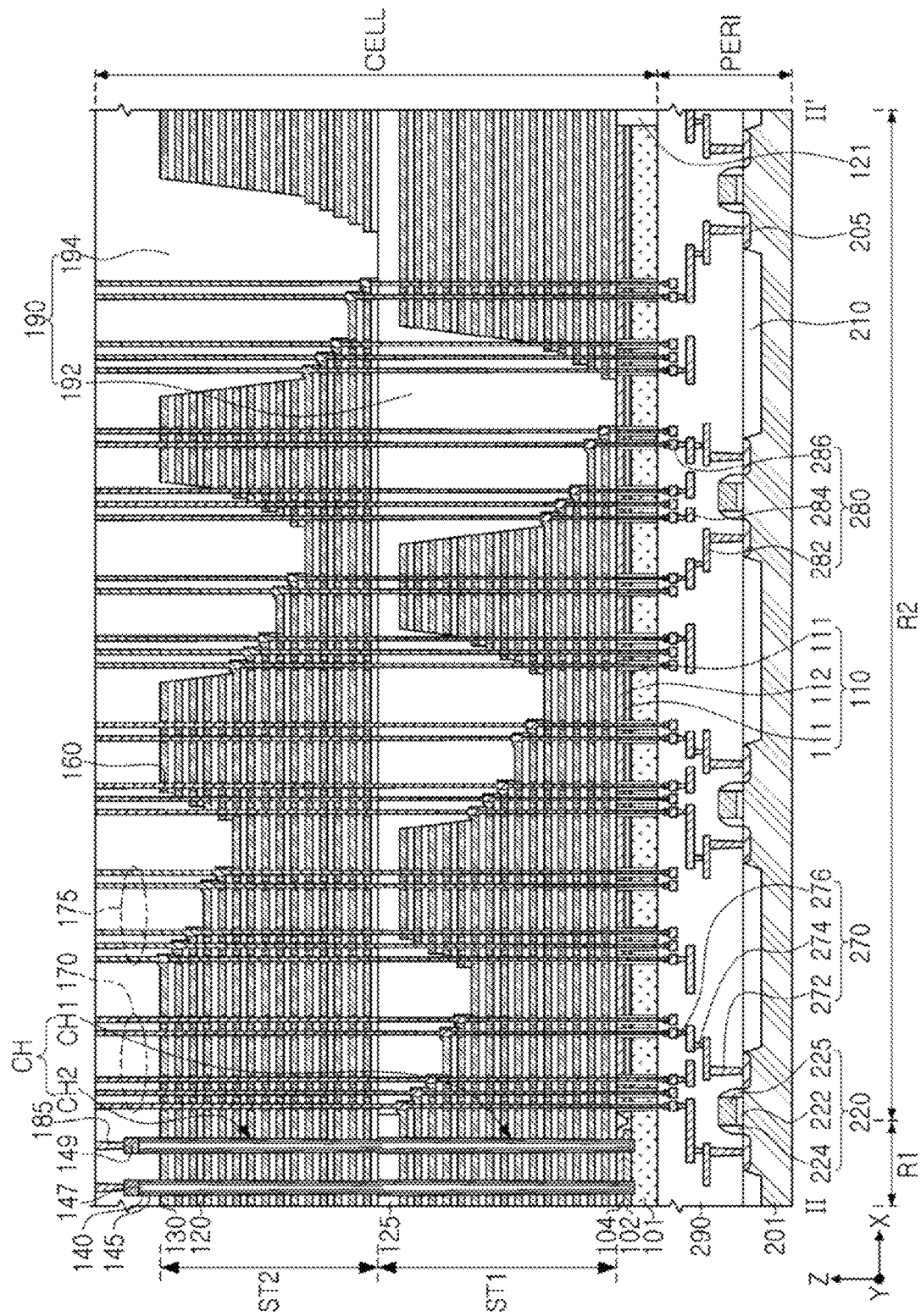

Referring to FIG. 11M, the first and second contact plugs 170 and 175 may be formed by depositing a conductive material in the openings OH.

First, after partially removing the pad layers 285 from the lower ends of the openings OH to expose the third lower interconnection lines 286, the conductive material may be deposited. The first and second contact plugs 170 and 175 are formed together in the same process operation, and thus, may have the same structure. Each of the first contact plugs 170 may be formed to have a horizontal extension portion 170H (refer to FIG. 3B) connected to one gate electrode 130 of the first stack structure ST1, and each of the second contact plugs 175 may be formed to have a horizontal extension portion connected to one gate electrode 130 of the second stack structure ST2.

Next, referring to FIG. 2B together, the semiconductor device 100 may be manufactured by forming the first and second contact plugs 170 and 175 and upper contacts 185 connected to upper ends of the channel structures CH.

Figure 12:
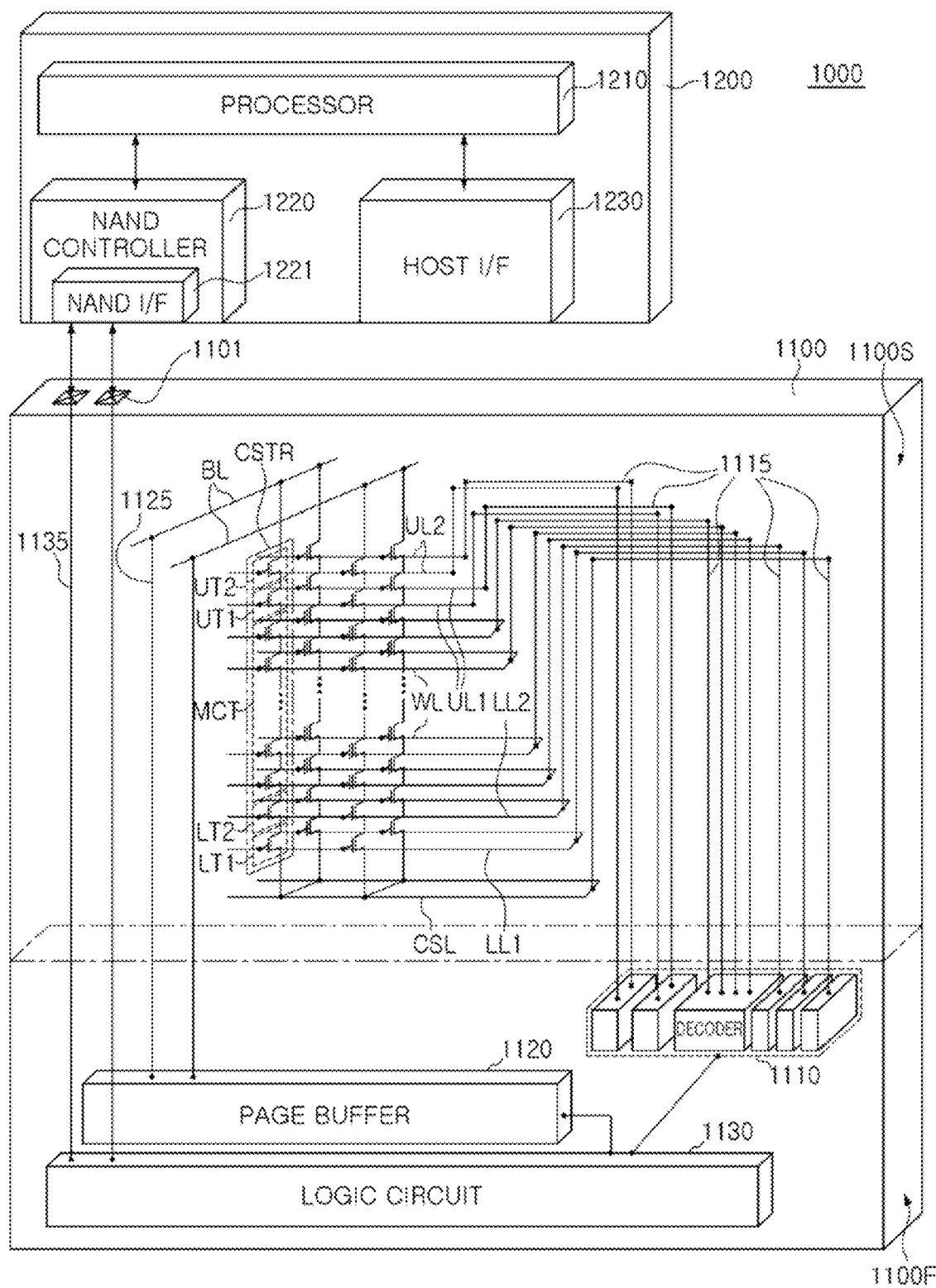
FIG. 12 is a diagram schematically illustrating a data storage system including a semiconductor device according to some example embodiments.

FIG. 12 is a diagram schematically illustrating a data storage system including a semiconductor device according to some example embodiments.

Referring to FIG. 12, a data storage system 1000 may include a semiconductor device 1100 and a controller 1200 electrically connected to the semiconductor device 1100. The data storage system 1000 may be a storage device including one or a plurality of semiconductor devices 1100, or an electronic device including a storage device. For example, the data storage system 1000 may be a solid state drive device (SSD), a universal serial bus (USB), a computing system, a medical device or a communication device, including one or a plurality of semiconductor devices 1100.

The semiconductor device 1100, also referred to herein as a semiconductor storage device, may include any of the semiconductor devices according to any of the example embodiments. The semiconductor device 1100 may be a nonvolatile memory device, for example, the NAND flash memory device described above with reference to FIGS. 1 to 10. The semiconductor device 1100 may include a first semiconductor structure 1100F and a second semiconductor structure 1100S on the first semiconductor structure 1100F. In some example embodiments, the first semiconductor structure 1100F may also be disposed next to the second semiconductor structure 1100S. The first semiconductor structure 1100F may be a peripheral circuit structure including a decoder circuit 1110, a page buffer 1120, and a logic circuit 1130. The second semiconductor structure 1100S may be a memory cell structure including a bit line BL, a common source line CSL, word lines WL, first and second upper gate lines UL1 and UL2, first and second lower gate lines LL1 and LL2, and memory cell strings CSTR between the bit line BL and the common source line CSL.

In the second semiconductor structure 1100S, each of the memory cell strings CSTR may include lower transistors LT1 and LT2 adjacent to the common source line CSL, upper transistors UT1 and UT2 adjacent to the bit line BL, and a plurality of memory cell transistors MCT disposed between the lower transistors LT1 and LT2 and the upper transistors UT1 and UT2. The number of the lower transistors LT1 and LT2 and the number of the upper transistors UT1 and UT2 may be variously modified according to some example embodiments.

In some example embodiments, the upper transistors UT1 and UT2 may include a string select transistor, and the lower transistors LT1 and LT2 may include a ground select transistor. The lower gate lines LL1 and LL2 may be gate electrodes of the lower transistors LT1 and LT2, respectively. The word lines WL may be gate electrodes of the memory cell transistors MCT, and the upper gate lines UL1 and UL2 may be gate electrodes of the upper transistors UT1 and UT2, respectively.

In some example embodiments, the lower transistors LT1 and LT2 may include a lower erase control transistor LT1 and a ground select transistor LT2 connected in series. The upper transistors UT1 and UT2 may include a string select transistor UT1 and an upper erase control transistor UT2 connected in series. At least one of the lower erase control transistor LT1 and the upper erase control transistor UT1 may be used for an erase operation of erasing data stored in the memory cell transistors MCT using a GIDL phenomenon.

The common source line CSL, the first and second lower gate lines LL1 and LL2, the word lines WL, and the first and second upper gate lines UL1 and UL2 may be electrically connected to the decoder circuit 1110 through first connecting interconnections 1115 extending from the inside of the first semiconductor structure 1100F to the second semiconductor structure 1100S. The bit lines BL may be electrically connected to the page buffer 1120 through second connecting interconnections 1125 extending from the inside of the first semiconductor structure 1100F to the second semiconductor structure 1100S.

In the first semiconductor structure 1100F, the decoder circuit 1110 and the page buffer 1120 may perform a control operation on at least one selected memory cell transistor among the plurality of memory cell transistors MCT. The decoder circuit 1110 and the page buffer 1120 may be controlled by the logic circuit 1130. The semiconductor devices 1100 may each communicate with the controller 1200 through an input/output pad 1101 electrically connected to the logic circuit 1130. The input/output pad 1101 may be electrically connected to the logic circuit 1130 through an input/output connecting interconnection 1135 extending from the inside of the first semiconductor structure 1100F to the second semiconductor structure 1100S. The input/output pad 1101 may be electrically connected to circuit elements 220 of a semiconductor device according to any of the example embodiments that may be included any of the semiconductor devices 1100.

The controller 1200 may include a processor 1210, a NAND controller 1220, and a host interface 1230. In some example embodiments, the data storage system 1000 may include a plurality of semiconductor devices 1100, and in this case, the controller 1200 may control the plurality of semiconductor devices 1100. The controller 1200 may be electrically connected to the semiconductor devices 1100 through the input/output pad 1101. Thus, the controller 1200 may be electrically connected to a semiconductor device, semiconductor storage device, or the like that may be included in and/or at least partially comprise the semiconductor device 1100, through the input/output pad 1101. The controller 1200 may be configured to control the semiconductor device 1100 (e.g., via communication with the semiconductor device 1100 through the input/output pad 1101).

The processor 1210 may control the overall operation of the data storage system 1000 including the controller 1200.

The processor 1210 may operate according to a predetermined firmware, and may access the semiconductor device 1100 by controlling the NAND controller 1220. The NAND controller 1220 may include a NAND interface 1221 that handles communication with the semiconductor device 1100. Through the NAND interface 1221, a control command for controlling the semiconductor device 1100, data to be written to the memory cell transistors MCT of the semiconductor device 1100, data to be read from the memory cell transistors MCT of the semiconductor device 1100, and the like may be transmitted. The host interface 1230 may provide a communication function between the data storage system 1000 and an external host. When receiving a control command from an external host through the host interface 1230, the processor 1210 may control the semiconductor device 1100 in response to the control command.

Figure 13:
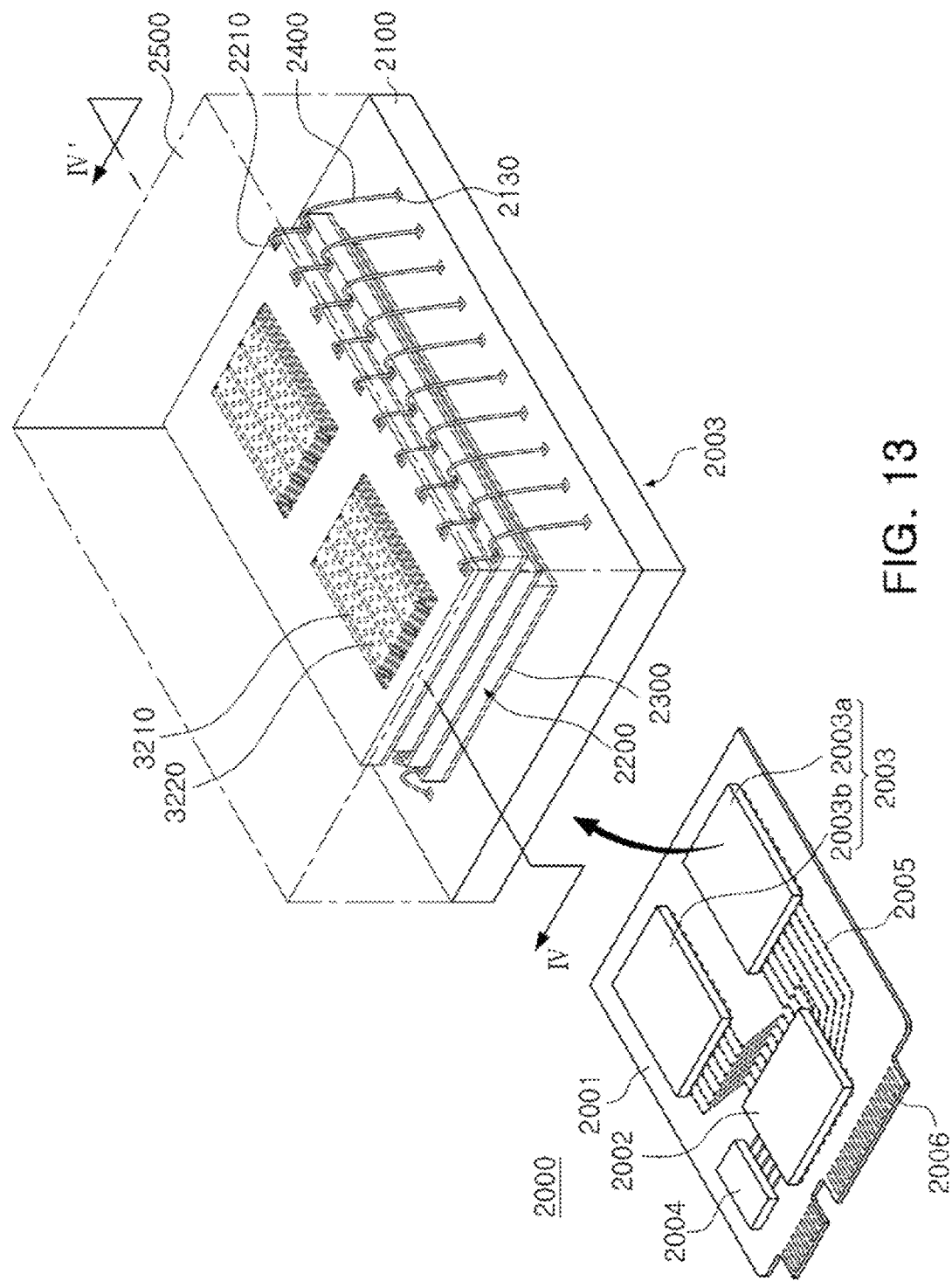
FIG. 13 is a schematic perspective view of a data storage system including a semiconductor device according to some example embodiments.

FIG. 13 is a schematic perspective view of a data storage system including a semiconductor device according to some example embodiments.

Referring to FIG. 13, a data storage system 2000 according to some example embodiments may include a main board 2001, a controller 2002 mounted on the main board 2001, one or more semiconductor packages 2003, and a DRAM 2004. The semiconductor package 2003 and the DRAM 2004 may be connected to the controller 2002 by interconnection patterns 2005 formed on the main board 2001.

The main board 2001 may include a connector 2006 including a plurality of pins coupled to the external host. The number and arrangement of the plurality of pins in the connector 2006 may vary according to a communication interface between the data storage system 2000 and the external host. In some example embodiments, the data storage system 2000 may communicate with an external host according to any one of interfaces, such as an M-Phy for Universal Flash Storage (UFS), Universal Serial Bus (USB), Peripheral Component Interconnect Express (PCI-Express), Serial Advanced Technology Attachment (SATA), or the like. In some example embodiments, the data storage system 2000 may be operated by power supplied from an external host through the connector 2006. The data storage system 2000 may further include a power management integrated circuit (PMIC) for distributing power supplied from the external host to the controller 2002 and the semiconductor package 2003.

The controller 2002 may write data to or read data from the semiconductor package 2003, and may improve the operating speed of the data storage system 2000.

The DRAM 2004 may be a buffer memory for mitigating a speed difference between the semiconductor package 2003 as a data storage space and an external host. The DRAM 2004 included in the data storage system 2000 may also operate as a kind of cache memory, and may provide a space for temporarily storing data in a control operation for the semiconductor package 2003. For example, when the data storage system 2000 includes the DRAM 2004, the controller 2002 may further include a DRAM controller for controlling the DRAM 2004 in addition to the NAND controller for controlling the semiconductor package 2003.

The semiconductor package 2003 may include first and second semiconductor packages 2003*a* and 2003*b* spaced apart from each other. Each of the first and second semiconductor packages 2003*a* and 2003*b* may be a semiconductor package including a plurality of semiconductor chips 2200. Each of the first and second semiconductor packages 2003*a* and 2003*b* may include a package substrate 2100, semiconductor chips 2200 on the package substrate 2100, adhesive layers 2300 disposed on lower surfaces of the semiconductor chips 2200, respectively, a connection structure 2400 electrically connecting the semiconductor chips 2200 and the package substrate 2100, and a molding layer 2500 covering the semiconductor chips 2200 and the connection structure 2400, on the package substrate 2100.

The package substrate 2100 may be a printed circuit board including package upper pads 2130. Each semiconductor chip 2200 may include an input/output pad 2210. The input/output pad 2210 may correspond to the input/output pad 1101 of FIG. 12. Each of the semiconductor chips 2200 may include gate stack structures 3210 and channel structures 3220. Each of the semiconductor chips 2200 may include the semiconductor device described above with reference to FIGS. 1 to 10.

In some example embodiments, the connection structure 2400 may be a bonding wire electrically connecting the input/output pad 2210 and the package upper pads 2130. Accordingly, in each of the first and second semiconductor packages 2003*a* and 2003*b*, the semiconductor chips 2200 may be electrically connected to each other by a wire bonding method, and may be electrically connected to the package upper pads 2130 of the package substrate 2100. According to some example embodiments, in each of the first and second semiconductor packages 2003*a* and 2003*b*, the semiconductor chips 2200 may also be electrically connected to each other by a connection structure including a through-silicon via (TSV), instead of the connection structure 2400 of the wire bonding-type.

In some example embodiments, the controller 2002 and the semiconductor chips 2200 may also be included in one package. In some example embodiments, the controller 2002 and the semiconductor chips 2200 may be mounted on a separate interposer substrate different from the main board 2001, and the controller 2002 and the semiconductor chips may also be connected to each other by an interconnection formed on the interposer substrate.

Figure 14:
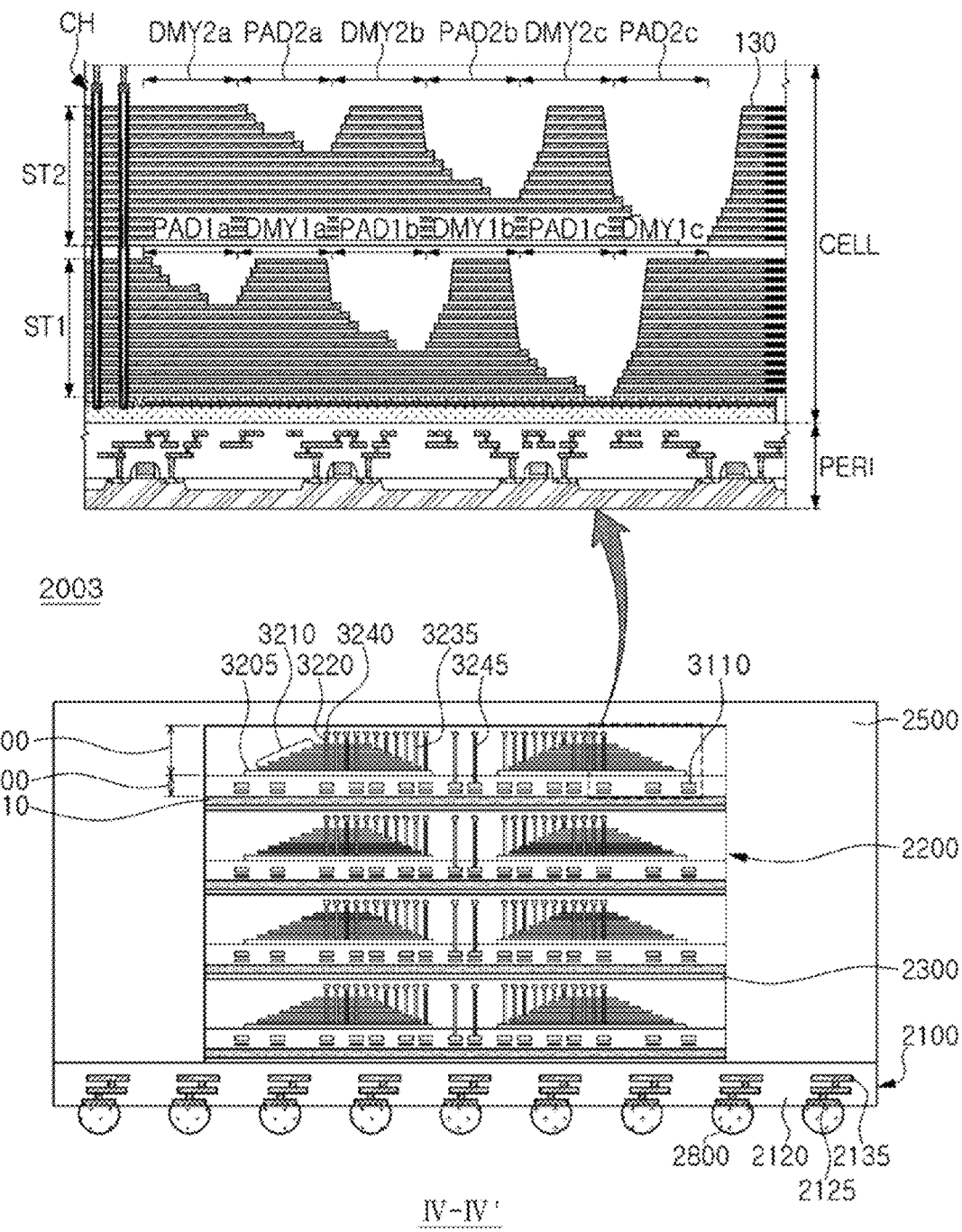
FIG. 14 is a cross-sectional view schematically illustrating a semiconductor package according to some example embodiments.

FIG. 14 is a cross-sectional view schematically illustrating a semiconductor package according to some example embodiments. FIG. 14 illustrates some example embodiments of the semiconductor package 2003 of FIG. 13, and conceptually illustrates a region cut along the cutting line IV-IV' of the semiconductor package 2003 of FIG. 13.

Referring to FIG. 14, in the semiconductor package 2003, the package substrate 2100 may be a printed circuit board. The package substrate 2100 may include a package substrate body 2120, package upper pads 2130 (see FIG. 13) disposed on an upper surface of the package substrate body 2120, lower pads 2125 disposed on or exposed through a lower surface of the package substrate body 2120, and internal interconnections 2135 electrically connecting the package upper pads 2130 and the lower pads 2125 in the package substrate body 2120. The package upper pads 2130 may be electrically connected to the connection structures 2400. The lower pads 2125 may be connected to the interconnection patterns 2005 of the main board 2001 of the data storage system 2000 through conductive connectors 2800 as illustrated in FIG. 13.

Each of the semiconductor chips 2200 may include a semiconductor substrate 3010, and a first semiconductor structure 3100 and a second semiconductor structure 3200 that are sequentially stacked on the semiconductor substrate 3010. The first semiconductor structure 3100 may include a peripheral circuit region including peripheral interconnections 3110. The second semiconductor structure 3200 may include a common source line 3205, a gate stack structure 3210 on the common source line 3205, channel structures 3220 penetrating through the gate stack structure 3210, bit lines 3240 electrically connected to the channel structures 3220, and contact plugs 3235 electrically connected to the word lines WL (refer to FIG. 12) of the gate stack structure 3210. As described above with reference to FIGS. 1 to 10, in each of the semiconductor chips 2200, the first pad areas PAD1a, PAD1b, and PAD1c and the second pad areas PAD2a, PAD2b, and PAD2c may be shifted and disposed so as not to overlap each other in the Z direction.

Each of the semiconductor chips 2200 may include a through-interconnection 3245 electrically connected to the peripheral interconnections 3110 of the first semiconductor structure 3100 and extending into the second semiconductor structure 3200. The through-interconnection 3245 may be disposed outside the gate stack structure 3210, and may be further disposed to penetrate through the gate stack structure 3210. Each of the semiconductor chips 2200 may further include an input/output pad 2210 (refer to FIG. 13) electrically connected to the peripheral interconnection 3110 of the first semiconductor structure 3100.

As described herein, any devices, systems, modules, units, controllers, circuits, and/or portions thereof according to any of the example embodiments (including, without limitation, the data storage system 1000, semiconductor device 1100, controller 1200, decoder circuit 1110, page buffer 1120, logic circuit 1130, processor 1210, NAND controller 1220, data storage system 2000, controller 2002, semiconductor packages 2003, DRAM 2004, or the like) may include, may be included in, and/or may be implemented by one or more instances of processing circuitry such as hardware including logic circuits; a hardware/software combination such as a processor executing software; or a combination thereof. For example, the processing circuitry more specifically may include, but is not limited to, a central processing unit (CPU), an arithmetic logic unit (ALU), a graphics processing unit (GPU), an application processor (AP), a digital signal processor (DSP), a microcomputer, a field programmable gate array (FPGA), and programmable logic unit, a microprocessor, application-specific integrated circuit (ASIC), a neural network processing unit (NPU), an Electronic Control Unit (ECU), an Image Signal Processor (ISP), and the like. In some example embodiments, the processing circuitry may include a non-transitory computer readable storage device (e.g., a memory), for example a solid state drive (SSD), storing a program of instructions, and a processor (e.g., CPU) configured to execute the program of instructions to implement the functionality and/or methods performed by some or all of any devices, systems, modules, units, controllers, circuits, and/or portions thereof according to any of the example embodiments, and/or any portions thereof.

As set forth above, according to some example embodiments, by shifting and disposing second pad areas of a second stack structure on first pad areas of a first stack structure, a semiconductor device having improved integration and a data storage system including the same may be provided.

While some example embodiments have been illustrated and described above, it will be apparent to those skilled in the art that modifications and variations could be made without departing from the scope of the present inventive concepts as defined by the appended claims.

What is claimed is:
1. A semiconductor device, comprising:
a first semiconductor structure including a first substrate, circuit elements on the first substrate, and lower interconnection lines; and
a second semiconductor structure on the first semiconductor structure,
wherein the second semiconductor structure includes
a second substrate having a first region and a second region,
gate electrodes stacked on the second substrate to be spaced apart from each other in a first direction, the gate electrodes at least partially defining first and second stack structures,
interlayer insulating layers alternately stacked with the gate electrodes,
channel structures penetrating through the first and second stack structures, the channel structures extending in the first direction, the channel structures respectively including a channel layer, the channel structures being in the first region,
separation regions penetrating through the first and second stack structures and extending in a second direction,
first and second contact plugs each penetrating through the first and second stack structures and extending into the first semiconductor structure in the first direction, the first and second contact plugs being in the second region, and
contact insulating layers in contact with portions of the gate electrodes and surrounding each of the first and second contact plugs, the contact insulating layers being in the second region,
wherein the first stack structure has, in the second region,
first pad areas in which the gate electrodes extend further than upper gate electrodes, respectively, in the second direction to be connected to the first contact plugs, respectively, and
first dummy areas located on at least one side of each of the first pad areas and spaced apart from the first contact plugs,
wherein the second stack structure has, in the second region,
second pad areas in which the gate electrodes extend further than upper gate electrodes, respectively, in the second direction and connected to the second contact plugs, respectively, and
second dummy areas located on at least one side of each of the second pad areas and spaced apart from the second contact plugs, and
wherein the first pad areas overlap the second dummy areas in the first direction, and the second pad areas overlap the first dummy areas in the first direction.
2. The semiconductor device of claim 1, wherein the first and second pad areas are alternately disposed in the second direction.
3. The semiconductor device of claim 1, wherein
each of the first and second pad areas has a step shape at least partially defined by the gate electrodes, and
the first and second dummy areas each have a protruding region in which the gate electrodes are stacked in a same quantity as or a greater quantity than a quantity of stacked gate electrodes in the first and second pad areas.
4. The semiconductor device of claim 3, wherein maximum heights of protruding regions in the first dummy areas are a same maximum height, and
maximum heights of respective protruding regions in the second dummy areas are a same maximum height.

5. The semiconductor device of claim 3, wherein maximum heights of respective protruding regions in the second dummy areas sequentially decrease in the second direction.

6. The semiconductor device of claim 1, wherein each of the first pad areas includes,
- first and second sub-pad areas; and
- at least one flat region on at least one side of the first and second sub-pad areas.

7. The semiconductor device of claim 6, wherein at least a portion of the lower interconnection lines connected to the first contact plugs penetrating through the first and second sub-pad areas extends below the at least one flat region.

8. The semiconductor device of claim 1, wherein
- the first and second pad areas and the first and second dummy areas each have a region in which the gate electrodes at least partially define a step shape, and
- in the first and second pad areas, the region has a first slope, and in the first and second dummy areas, the region has a second slope greater than the first slope.

9. The semiconductor device of claim 1, wherein the first and second pad areas have a height decreasing as a distance from the first region increases.

10. The semiconductor device of claim 1, wherein
- in the first region, the gate electrodes have a first thickness, and
- in the first and second pad areas, uppermost gate electrodes of the gate electrodes have a second thickness greater than the first thickness.

11. The semiconductor device of claim 10, wherein
- each of the first and second dummy areas has a protruding region in which the gate electrodes are stacked in a greater quantity than a quantity of stacked gate electrodes in the first and second pad areas, and
- in respective protruding regions of the first and second dummy areas, an uppermost gate electrode of the gate electrodes has the first thickness.

12. The semiconductor device of claim 10, wherein the contact insulating layers are below the uppermost gate electrodes in the first and second pad areas.

13. The semiconductor device of claim 1, wherein each of the first and second pad areas has a length of about 30 μm to about 70 μm in the second direction.

14. A semiconductor device, comprising:
- a first substrate;
- circuit elements on the first substrate;
- lower interconnection lines electrically connected to the circuit elements;
- a second substrate on the lower interconnection lines;
- gate electrodes stacked on the second substrate to be spaced apart from each other in a first direction, the gate electrodes at least partially defining first and second stack structures;
- channel structures penetrating through the gate electrodes, the channel structures extending in the first direction, the channel structures respectively including a channel layer; and
- first and second contact plugs each penetrating through the first and second stack structures, the first and second contact plugs being connected to the gate electrodes, respectively, the first and second contact plugs extending in the first direction,
- wherein the first stack structure has first pad areas in which the gate electrodes extend further than upper gate electrodes, respectively, in a second direction and are connected to the first contact plugs, respectively,
- wherein the second stack structure has second pad areas in which the gate electrodes extend further than upper gate electrodes, respectively, in the second direction and are connected to the second contact plugs, respectively, and
- wherein the first pad areas and the second pad areas are offset in relation to each other so as not to overlap each other in the first direction.

15. The semiconductor device of claim 14, wherein the first and second pad areas each have a step shape at least partially defined by the gate electrodes.

16. The semiconductor device of claim 15, wherein each of the first and second pad areas has a step region in which a quantity of the gate electrodes stacked decreases in the second direction.

17. The semiconductor device of claim 14, wherein
- the first stack structure further includes first dummy areas, which are positioned on at least one side of the first pad areas, wherein the first contact plugs do not extend through the first dummy areas, and
- the second stack structure further includes second dummy areas, which are positioned on at least one side of the second pad areas, wherein the second contact plugs do not extend through the second dummy areas.

18. The semiconductor device of claim 17, wherein the first pad areas overlap the second dummy areas in the first direction, and the second pad areas overlap the first dummy areas in the first direction.

* * * * *